US008628158B2

(12) United States Patent
Caveney

(10) Patent No.: US 8,628,158 B2
(45) Date of Patent: Jan. 14, 2014

(54) AISLE CONTAINMENT SYSTEM

(75) Inventor: Jack E. Caveney, North Palm Beach, FL (US)

(73) Assignee: Panduit Corp., Tinley Park, IL (US)

(*) Notice: Subject to any disclaimer, the term of this patent is extended or adjusted under 35 U.S.C. 154(b) by 1 day.

(21) Appl. No.: 13/364,479

(22) Filed: Feb. 2, 2012

(65) Prior Publication Data

US 2012/0181906 A1 Jul. 19, 2012

Related U.S. Application Data

(63) Continuation-in-part of application No. 13/105,165, filed on May 11, 2011.

(60) Provisional application No. 61/334,220, filed on May 13, 2010, provisional application No. 61/366,797, filed on Jul. 22, 2010, provisional application No. 61/374,663, filed on Aug. 18, 2010, provisional application No. 61/379,794, filed on Sep. 3, 2010.

(51) Int. Cl.
*A47B 53/00* (2006.01)

(52) U.S. Cl.
USPC ............. 312/265.3; 312/257.1; 312/263; 312/204; 52/29; 52/36.2; 52/64

(58) Field of Classification Search
USPC ........... 52/33, 29, 36.2, 64, 174, 239, 243; 312/257.1, 263, 265.1, 265.2, 265.3, 312/265.4, 204; 361/174, 292
See application file for complete search history.

(56) References Cited

U.S. PATENT DOCUMENTS

| 1,984,028 | A |   | 12/1934 | Macleod |
|---|---|---|---|---|
| 2,066,205 | A |   | 12/1936 | Keating |
| 2,924,856 | A |   | 2/1960 | Price |
| 3,355,206 | A |   | 11/1967 | Valsvik |
| 3,475,869 | A |   | 11/1969 | Jahn |
| 3,602,473 | A |   | 8/1971 | Van Riet et al. |
| 3,889,435 | A |   | 6/1975 | Ollinger |
| 3,986,314 | A |   | 10/1976 | Moeller |
| 3,988,871 | A |   | 11/1976 | Moomey |
| 4,312,396 | A |   | 1/1982 | McKinnon et al. |
| 4,802,321 | A |   | 2/1989 | Menchetti |
| 5,469,681 | A |   | 11/1995 | Wu |
| 6,034,873 | A | * | 3/2000 | Ståhl et al. ............ 361/701 |

(Continued)

FOREIGN PATENT DOCUMENTS

DE    102008024973 B3 *  9/2009
EP         2059105 A1    5/2009

(Continued)

OTHER PUBLICATIONS

Electrorack "Contain-It Aisle Containment System", www.electrorack.com/contain-It, printed Mar. 8, 2010, 5 pages.

(Continued)

*Primary Examiner* — Joshua J Michener
*Assistant Examiner* — Matthew Gitlin
(74) *Attorney, Agent, or Firm* — Christopher S. Clancy; Aimee E. McVady

(57) ABSTRACT

The present invention is directed to an adjustable transparent vertical wall in an aisle containment system. The adjustable transparent vertical wall includes a fixed lower panel and a movable upper panel. The movable upper panel is adjustable to the required ceiling height.

4 Claims, 64 Drawing Sheets

(56) References Cited

U.S. PATENT DOCUMENTS

| | | | |
|---|---|---|---|
| 6,138,416 A | 10/2000 | Platt | |
| 6,205,733 B1 | 3/2001 | LaLonde | |
| 6,672,955 B2 | 1/2004 | Charron | |
| 6,745,536 B2 | 6/2004 | Tallman et al. | |
| 6,851,238 B2 | 2/2005 | Rebman | |
| 6,859,366 B2 | 2/2005 | Fink | |
| 6,867,967 B2 | 3/2005 | Mok | |
| 6,980,433 B2 | 12/2005 | Fink | |
| 7,046,514 B2 | 5/2006 | Fink et al. | |
| 7,085,133 B2 | 8/2006 | Hall | |
| 7,145,772 B2 | 12/2006 | Fink | |
| 7,173,820 B2 | 2/2007 | Fink et al. | |
| 7,259,963 B2 | 8/2007 | Germagian et al. | |
| 7,403,391 B2* | 7/2008 | Germagian et al. | 361/695 |
| 7,430,118 B1 | 9/2008 | Noteboom et al. | |
| 7,500,911 B2 | 3/2009 | Johnson et al. | |
| 7,529,086 B2 | 5/2009 | Fink et al. | |
| 7,534,167 B2 | 5/2009 | Day | |
| 7,551,971 B2 | 6/2009 | Hillis | |
| 7,656,660 B2 | 2/2010 | Hoeft et al. | |
| 7,667,965 B2 | 2/2010 | Nobile | |
| 7,672,128 B2 | 3/2010 | Noteboom et al. | |
| 7,684,193 B2 | 3/2010 | Fink et al. | |
| 7,712,274 B2 | 5/2010 | Wendt et al. | |
| 7,724,513 B2 | 5/2010 | Coglitore et al. | |
| 7,738,251 B2 | 6/2010 | Clidaras et al. | |
| 7,795,532 B2* | 9/2010 | Walker | 174/50 |
| 7,804,685 B2* | 9/2010 | Krietzman | 361/690 |
| 7,841,199 B2 | 11/2010 | VanGlider et al. | |
| 7,878,889 B2 | 2/2011 | Day | |
| 7,881,057 B2 | 2/2011 | Fink et al. | |
| 8,327,598 B2* | 12/2012 | Shew et al. | 52/578 |
| 2003/0164664 A1* | 9/2003 | Allexon et al. | 312/257.1 |
| 2006/0186769 A1* | 8/2006 | Harris | 312/205 |
| 2007/0064389 A1* | 3/2007 | Lewis et al. | 361/690 |
| 2009/0107652 A1 | 4/2009 | VanGilder et al. | |
| 2009/0129000 A1 | 5/2009 | Hoeft et al. | |
| 2009/0138313 A1 | 5/2009 | Morgan et al. | |
| 2009/0151910 A1 | 6/2009 | Kwon et al. | |
| 2009/0168345 A1* | 7/2009 | Martini | 361/691 |
| 2009/0173017 A1 | 7/2009 | Hall | |
| 2009/0210096 A1 | 8/2009 | Stack et al. | |
| 2009/0277605 A1 | 11/2009 | VanGilder et al. | |
| 2009/0319650 A1 | 12/2009 | Collins et al. | |
| 2010/0061057 A1 | 3/2010 | Dersch et al. | |
| 2010/0061059 A1* | 3/2010 | Krietzman et al. | 361/690 |
| 2010/0108272 A1* | 5/2010 | Karidis | 160/238 |
| 2010/0144265 A1 | 6/2010 | Bednarcik et al. | |
| 2010/0188816 A1 | 7/2010 | Bean, Jr. et al. | |
| 2010/0216388 A1 | 8/2010 | Tresh et al. | |
| 2010/0248610 A1 | 9/2010 | Caveney et al. | |
| 2011/0175505 A1 | 7/2011 | Linhares, Jr. et al. | |
| 2012/0281352 A1* | 11/2012 | Namek et al. | 361/679.46 |

FOREIGN PATENT DOCUMENTS

| | | |
|---|---|---|
| JP | 57068100 A2 | 4/1982 |
| JP | 11223358 A | 8/1999 |
| JP | 2002016136 A | 1/2002 |
| JP | 2002156136 A | 5/2002 |
| JP | 2003166729 A | 6/2003 |
| JP | 2004184070 | 2/2004 |
| WO | 2009059649 A1 | 5/2009 |
| WO | 2009059795 A1 | 5/2009 |
| WO | 2009059796 A1 | 5/2009 |
| WO | 2009141029 A1 | 11/2009 |

OTHER PUBLICATIONS

Wright Line "Independent Containment System", undated, 1 page.
Press Release "Wright Line to Feature Independent Containment System at AFCOM Event", www.prweb.com/releases/datacenter/thermalmanagement/rpweb3695044, Mar. 8, 2010, 4 pages.
Wright Line "Aisle Containment Ceiling", 2009, 3 pages.
Minkels "Cold Corridor Solution", undated, 5 pages.
ProSource Technical Services "PolarPlex™ Cold Aisle Containment", undated, 1 page.
Polargy "Hot and Cold Aisle Containment Systems", www.polargy.com/products/polarplex/containment.php, printed Dec. 23, 2009, 6 pages.
APC "Hot Aisle Containment System Retrofittable Ceiling Assembly", Jul. 31, 2008, 1 page.
Rittal "Cold Aisle Containment", www.42u.com/cooling/cold-aisle-containment/rittal-cold-aisle-containment.htm, printed Dec. 17, 2009, 4 pages.
Liebert "Cold Aisle Containment", www.42u.com/cooling/cold-aisle-containment/liebert-cold-aisle-containment.htm, printed .Dec. 17, 2009, 5 pages.
Knürr "Cool Flex-Cold Aisle Containment", www.knurr.com/web/en/products/coolflex/coolflex-cold-aisle-containment.html, printed Mar. 1, 2010, 4 pages.
Emerson Electric Co. "Knürr CoolFlex® Cold Aisle Containment", 2008, 6 pages.
Simplex Isolation Systems "Airblock Curtain Systems", www.brostromsoftware.com/simplex/dcurtains.htm, printed Jul. 16, 2010, 1 page.
Simplex Isolation Systems "Airblock Data Center Systems", www.simplexstripdoors.com/dcurtains.htm, printed Jul. 16, 2010, 2 pages.
Simplex Isolation Systems Airblock Data Center Curtains, undated, 2 pages.
Polargy Hot and Cold Aisle Containment Systems, www.polargy.com/products/polarplex/containment.php, 2009, 3 pages.
Polargy "PolarPlex™ Containment Systems", undated, 4 pages.

* cited by examiner

AISLE CONTAINMENT SYSTEM

CROSS REFERENCE TO RELATED APPLICATIONS

This application is a continuation-in-part of U.S. application Ser. No. 13/105,165, filed May 11, 2011, which claims priority to U.S. Provisional Application No. 61/334,220, filed May 13, 2010; U.S. Provisional Application No. 61/366,797, filed Jul. 22, 2010; U.S. Provisional Application No. 61/374,663, filed Aug. 18, 2010; and U.S. Provisional Application No. 61/379,794, filed Sep. 3, 2010, the subject matter of which is hereby incorporated by reference in its entirety.

BACKGROUND OF THE INVENTION

The present invention relates to an aisle containment system, and more particularly to a transparent adjustable wall mounted to the top of a cabinet in an aisle containment system.

SUMMARY OF THE INVENTION

The present invention is directed to an aisle containment system. The aisle containment system includes a plurality of cabinets, a plurality of vertical panels and a door assembly. The cabinets are arranged in a first row and a second row opposite the first row defining an aisle therebetween. The vertical panels include a fixed lower panel and a telescoping upper panel. The lower panels are secured to the top of the cabinets and the telescoping upper panels extend from the lower panels to the room ceiling. The door assembly is secured to an end of the cabinets and extends across the aisle.

DETAILED DESCRIPTION

Figure 1:
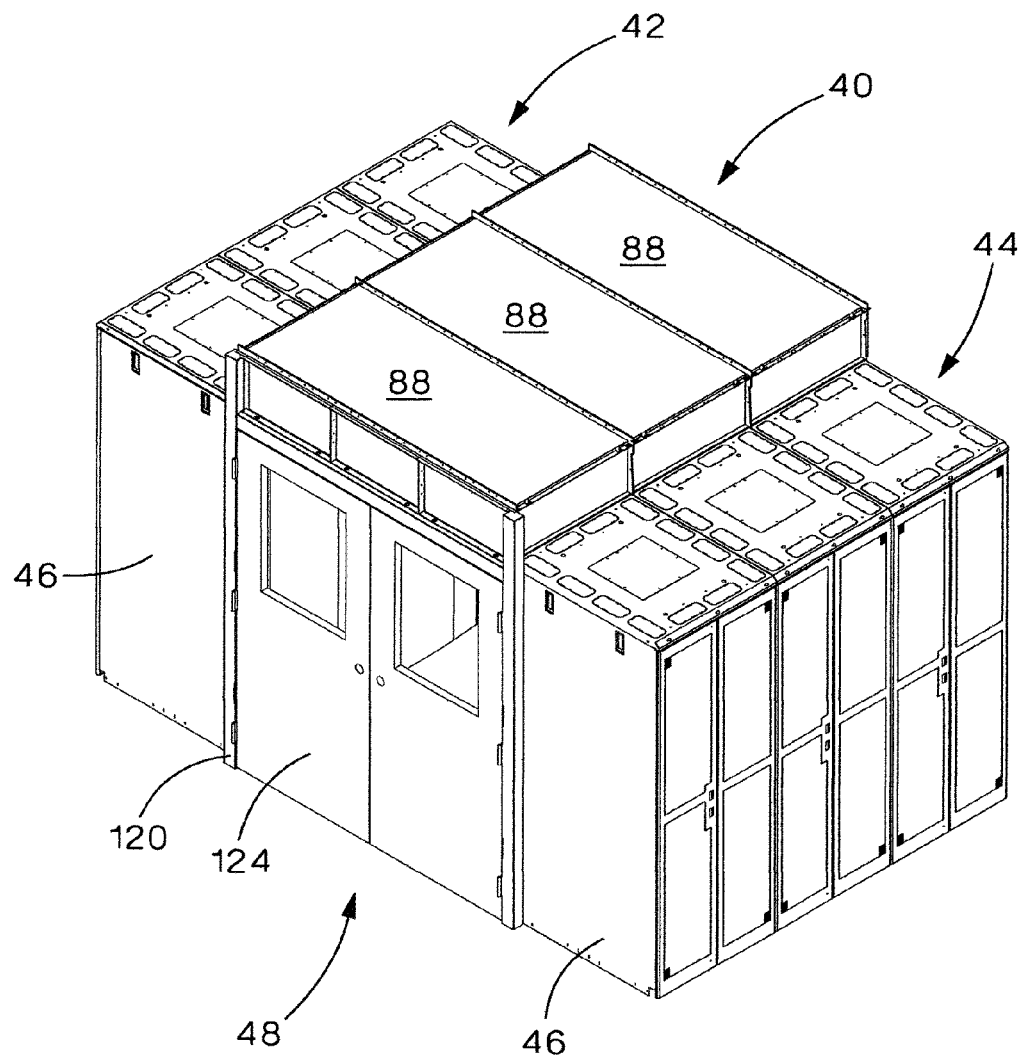
FIG. 1 is a perspective view of an aisle containment system according to an embodiment of the present invention.
Figure 2:
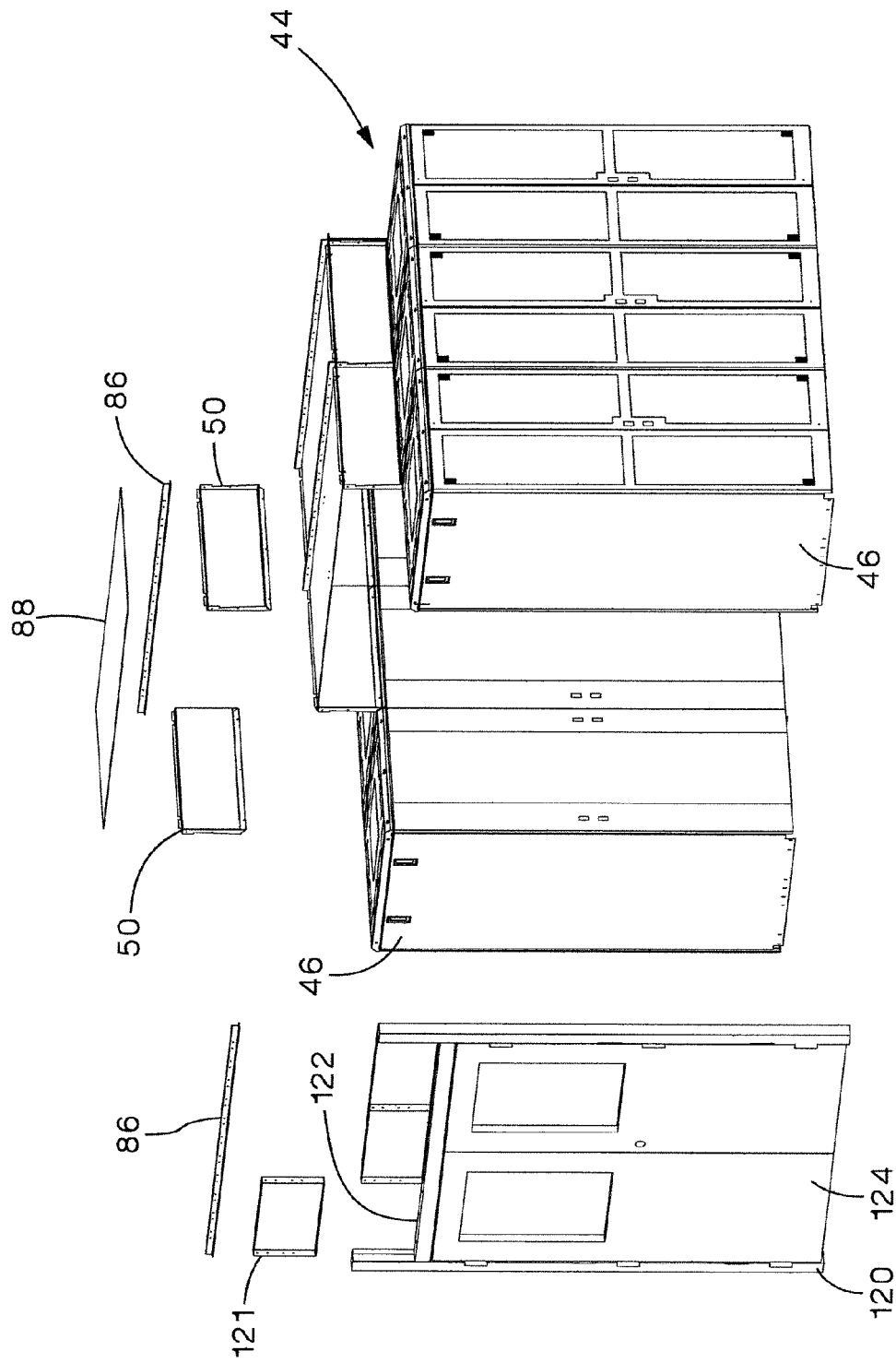
FIG. 2 is a partially exploded perspective view of the aisle containment system of FIG. 1.

FIGS. 1-33 illustrate an aisle containment system 40 according to an embodiment of the present invention. As shown in FIG. 1, aisle containment system 40 is mounted to two rows 42, 44 of three equal width cabinets 46 (800 mm shown). However, the cabinet widths may be any combination of 600 mm, 700 mm and 800 mm. Preferably, the aisle width is 6 feet. Aisle containment system 40 includes a door assembly 48 on each end of each row 42, 44, cabinet vertical panels, door frame vertical panels, cross tees and ceiling panels.

Figure 3:
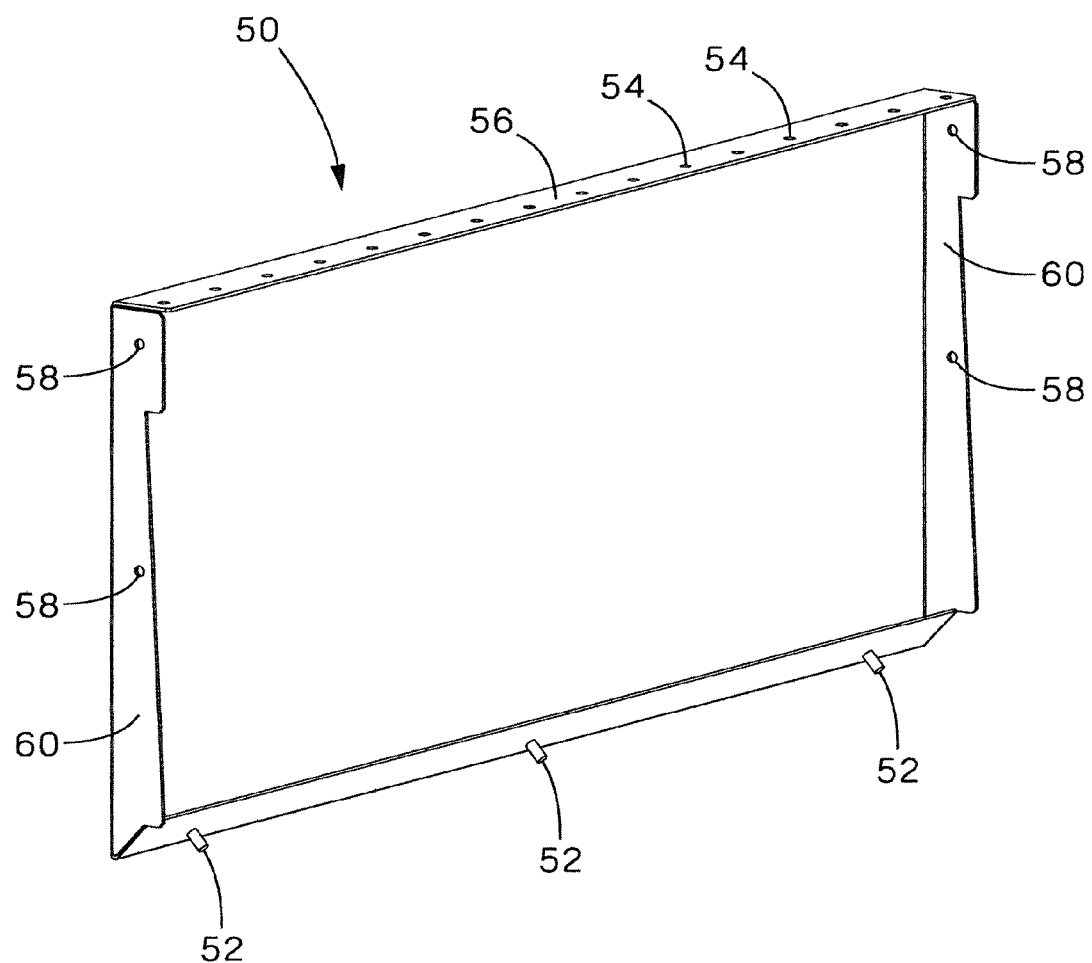
FIG. 3 is a perspective view of a cabinet vertical panel for the aisle containment system of FIG. 1.

FIG. 3 shows vertical panel 50 that attaches to the top of a cabinet, such as Panduit Corp.'s Net-Access™ cabinet. Vertical panel 50 includes three mounting studs 52 on the bottom surface that match the standard mounting holes on top of the cabinet. Pairs of extruded tapped holes 54 are spaced at 100 mm increments on top flange 56 of vertical panel 50 for securing cross tees to top flange 56, because 100 mm is the largest common multiple of the cabinet widths of 600 mm, 700 mm and 800 mm. In one configuration, the spacing between each tapped hole 54 is 50 mm. Vertical panel 50 may also include extruded tapped holes 58 on its side flanges 60 for securing adjacent vertical panels 50.

Figure 4:
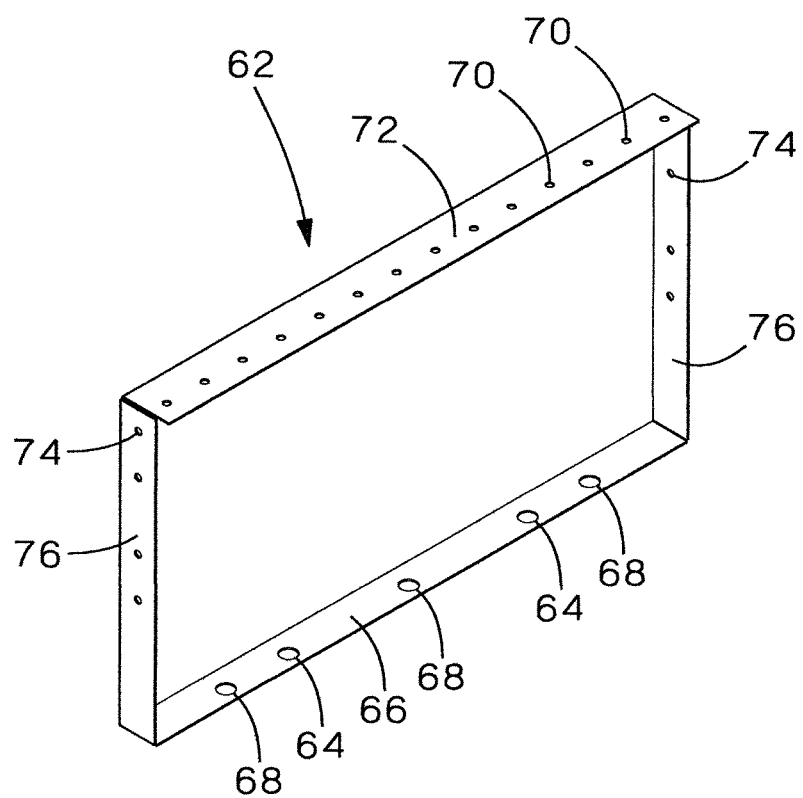
FIG. 4 is a perspective view of an alternate cabinet vertical panel for the aisle containment system of FIG. 1.

FIG. 4 shows vertical panel 62 that attaches to the top of a cabinet, such as Panduit Corp.'s Net-Serv™ cabinet. Vertical panel 62 includes two mounting holes 64 on bottom flange 66 that are used to bolt vertical panel 62 to the top of the cabinet of corresponding width. Bottom flange 66 also includes three clearance holes 68 that allow for clearance around the head of fasteners that attach the top of the cabinet to the frame. Specifically, Panduit Corp.'s Net-Serv™ cabinet has bolts with washers that stand about $3/16$ inches above the top of the cabinet. Pairs of extruded tapped holes 70 are spaced at 100 mm increments on top flange 72 of vertical panel 62 for securing cross tees to top flange 72, because 100 mm is the largest common multiple of the cabinet widths of 600 mm, 700 mm and 800 mm. In one configuration, the spacing between each tapped hole 70 is 50 mm. Vertical panel 62 may also include extruded tapped holes 74 on its side flanges 76 for securing adjacent vertical panels 62.

Figure 5:
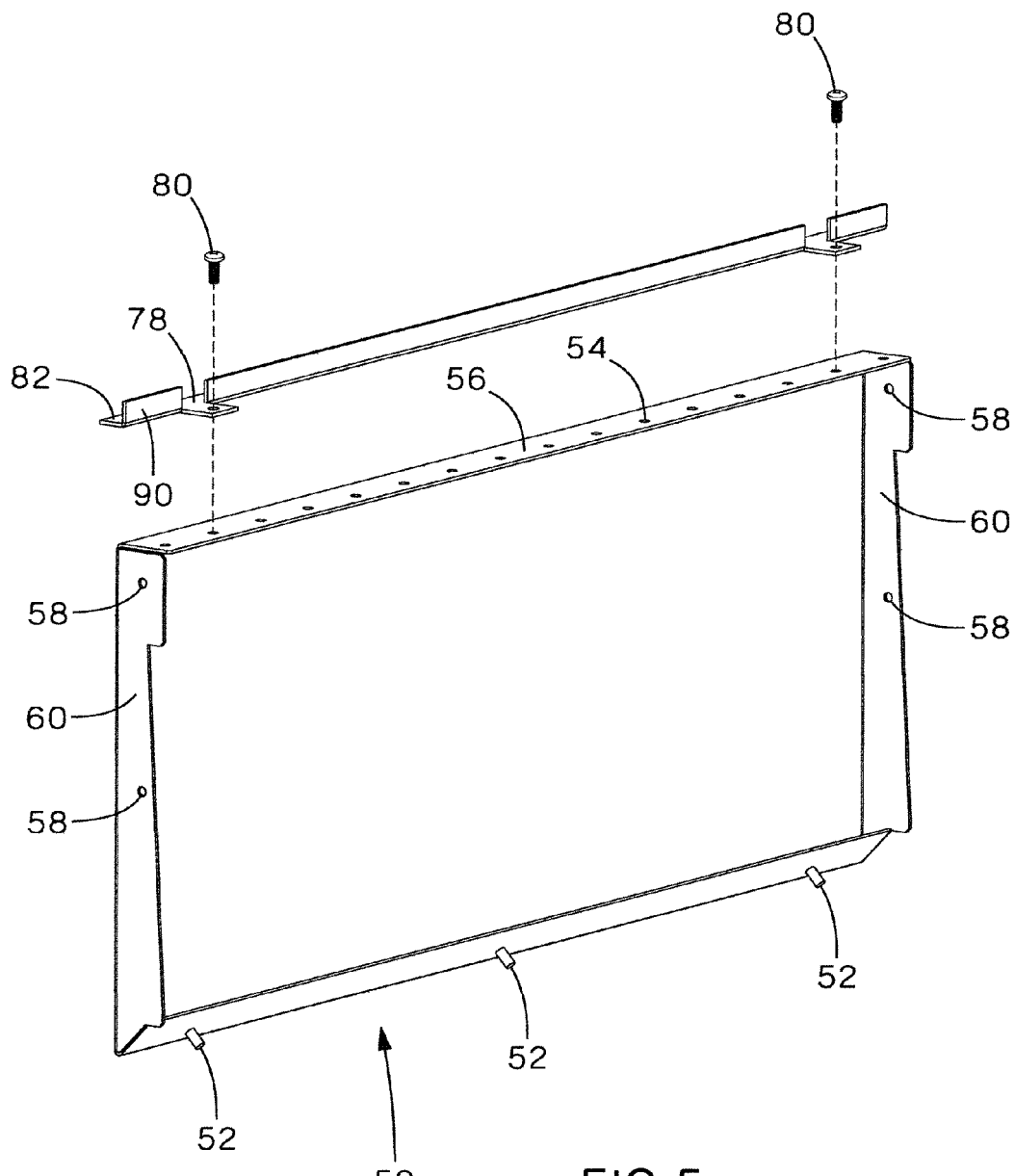
FIG. 5 is a perspective view of the cabinet vertical panel of FIG. 3, before a right angle spacer bar is mounted to the cabinet vertical panel.
Figure 6:
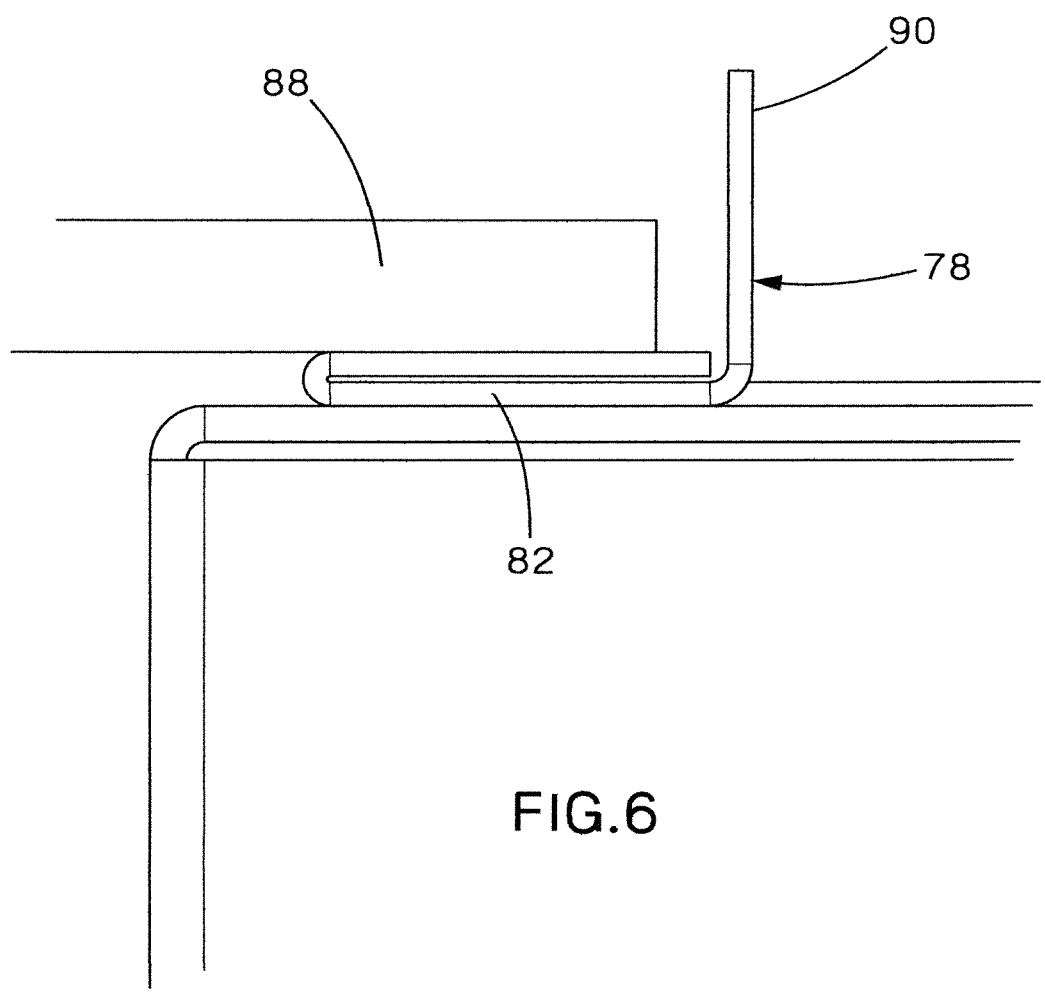
FIG. 6 is a cross-sectional view of the cabinet vertical panel of FIG. 3, after the right angle spacer bar is mounted to the cabinet vertical panel.

As shown in FIGS. 5 and 6, vertical panels 50 have a right angle spacer bar 78 mounted to top flange 56 with screws 80. Right angle spacer bar 78 may vary in size to accommodate 600 mm, 700 mm and 800 mm vertical panels. The thickness of flange 82 is the same thickness as flange 84 of cross tee 86, which creates a flat plane for sealing the perimeter of ceiling panel 88. Right angle spacer bar 78 also provides stop 90 that contains ceiling panel 88 in the proper position.

Figure 9:
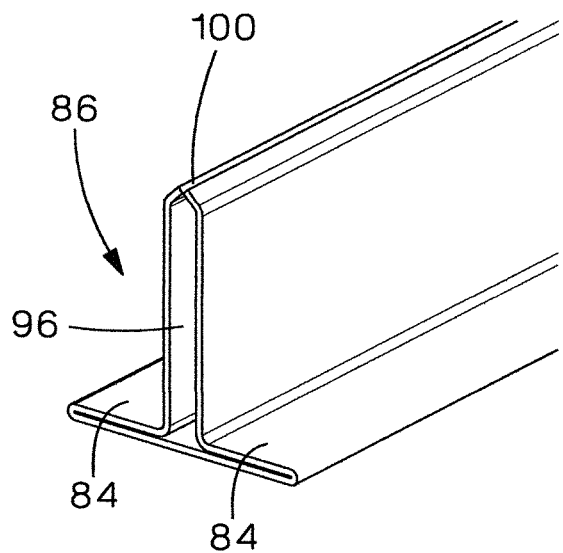
FIG. 9 is an enlarged perspective view of an end portion of the cross tee of FIG. 7.
Figure 10:
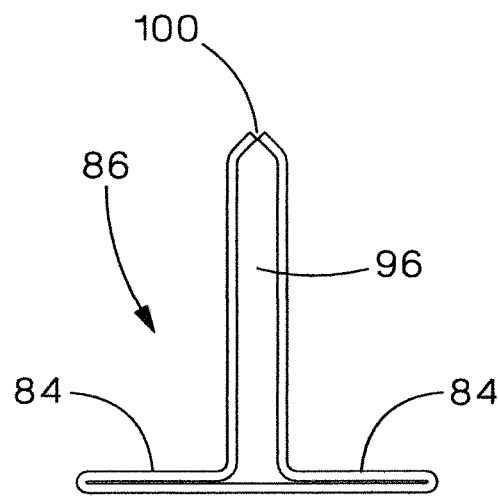
FIG. 10 is an end view of the cross tee of FIG. 9.
Figure 11:
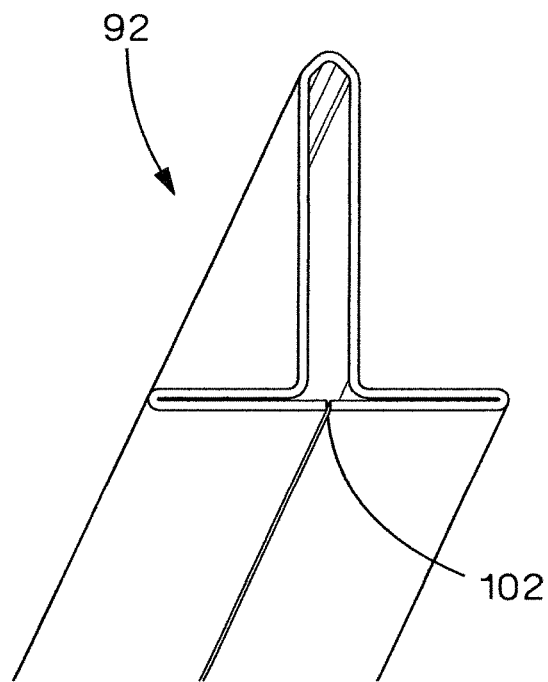
FIG. 11 is a perspective view of an end portion of an alternate cross tee for the aisle containment system of FIG. 1.
Figure 12:
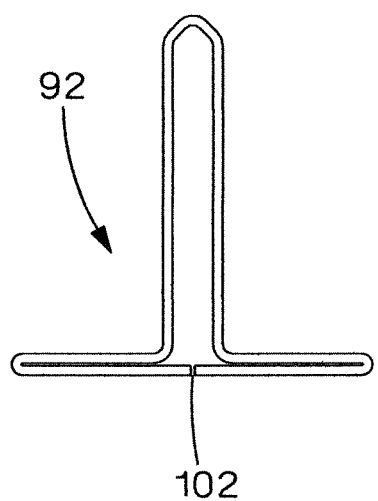
FIG. 12 is an end view of the cross tee of FIG. 11.
Figure 13:
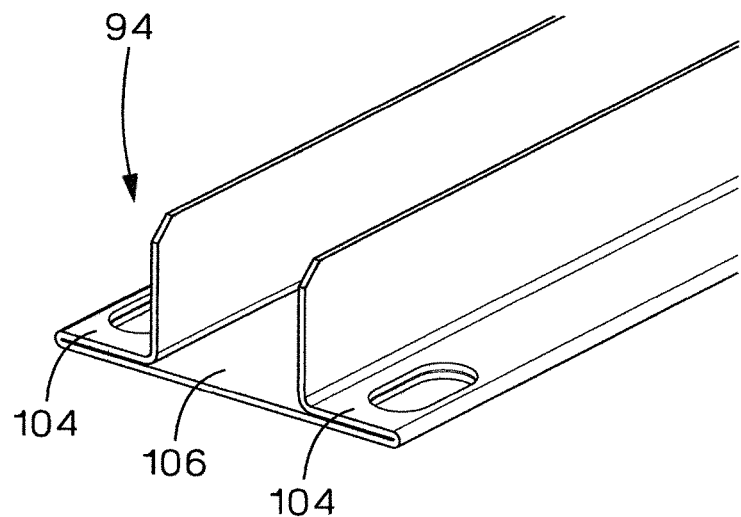
FIG. 13 is a perspective view of an end portion of an alternate cross beam for the aisle containment system of FIG. 1.
Figure 14:
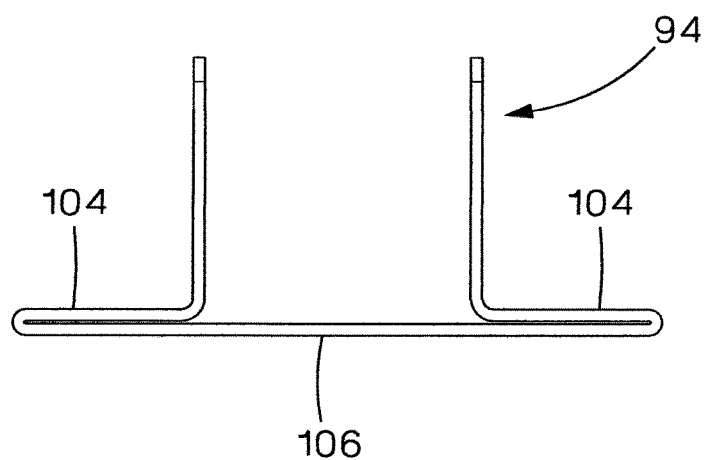
FIG. 14 is an end view of the cross beam of FIG. 13

FIGS. 7-14 show two cross tees and a cross beam. FIGS. 7-10 show cross tee 86; FIGS. 11 and 12 show cross tee 92; and FIGS. 13 and 14 show cross beam 94.

Figure 7:
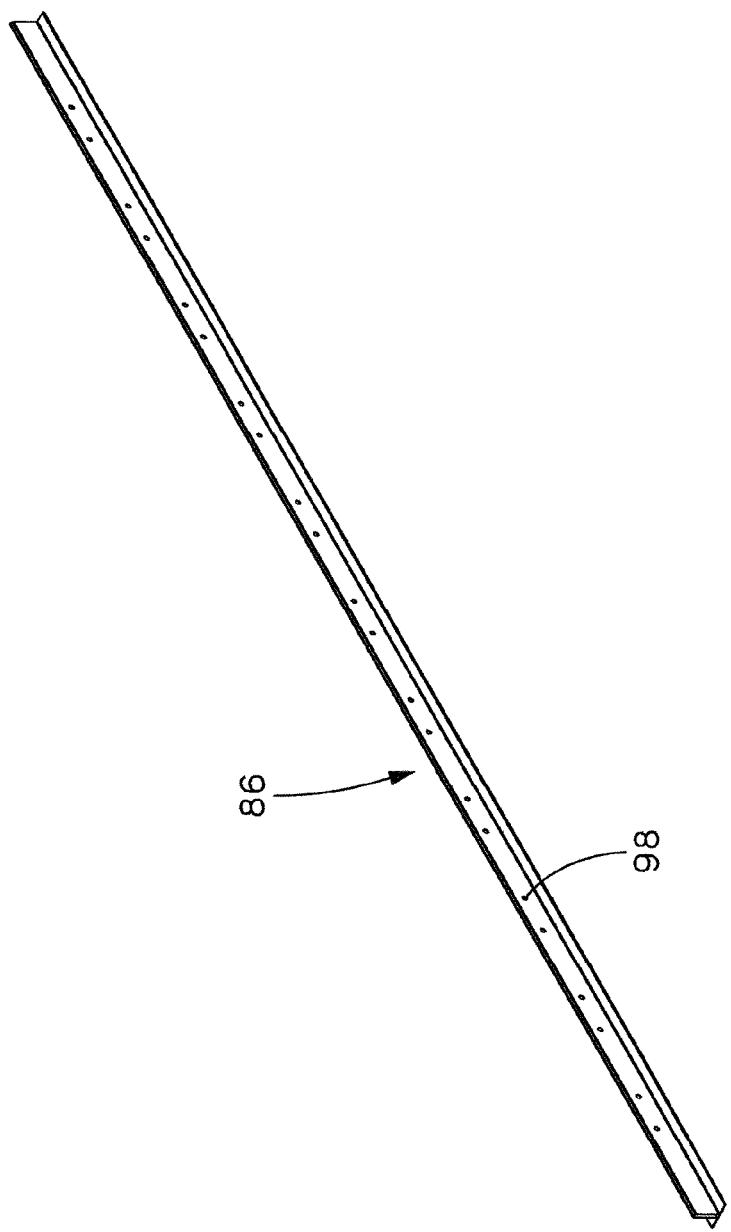
FIG. 7 is a perspective view of a cross tee for the aisle containment system of FIG. 1.
Figure 8:
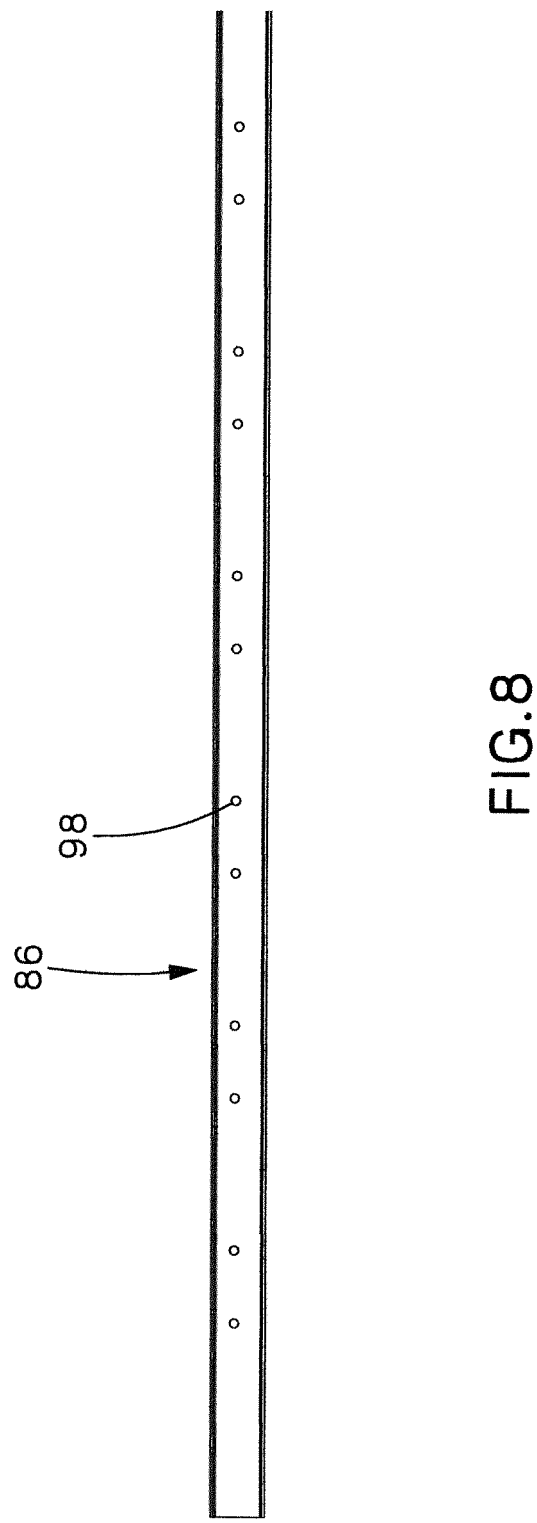
FIG. 8 is a side view of a portion of the cross tee of FIG. 7.

FIGS. 9 and 10 show cross tee 86 having a flange 84 on each side of center vertical web 96. Center vertical web 96 provides strength and stiffness to minimize deflection of cross tee 86 under load, and flanges 84 support ceiling panels 88. As shown in FIGS. 7 and 8, center vertical web 96 may include mounting holes 98 for securing secondary cross tees to cross tee 86. Preferably, cross tee 86 is 1.5 inches wide, with each flange 84 being 0.625 inches wide and center vertical web 96 being 0.25 inches wide. Also, cross tee 86 is preferably 1.55 inches in height. As best seen in FIG. 10, seam 100 is located at the apex of center vertical web 96.

FIGS. 11 and 12 show cross tee 92. Cross tee 92 is identical to cross tee 86, except seam 102 is located on the flange side of cross tee 92.

FIGS. 13 and 14 show cross beam 94. Cross beam 94 is wider than cross tees 86 and 92. Preferably, cross beam 94 is 2.39 inches wide, with each flange 104 being 0.625 inches wide and center vertical web 106 being 1.14 inches wide.

Figure 15:
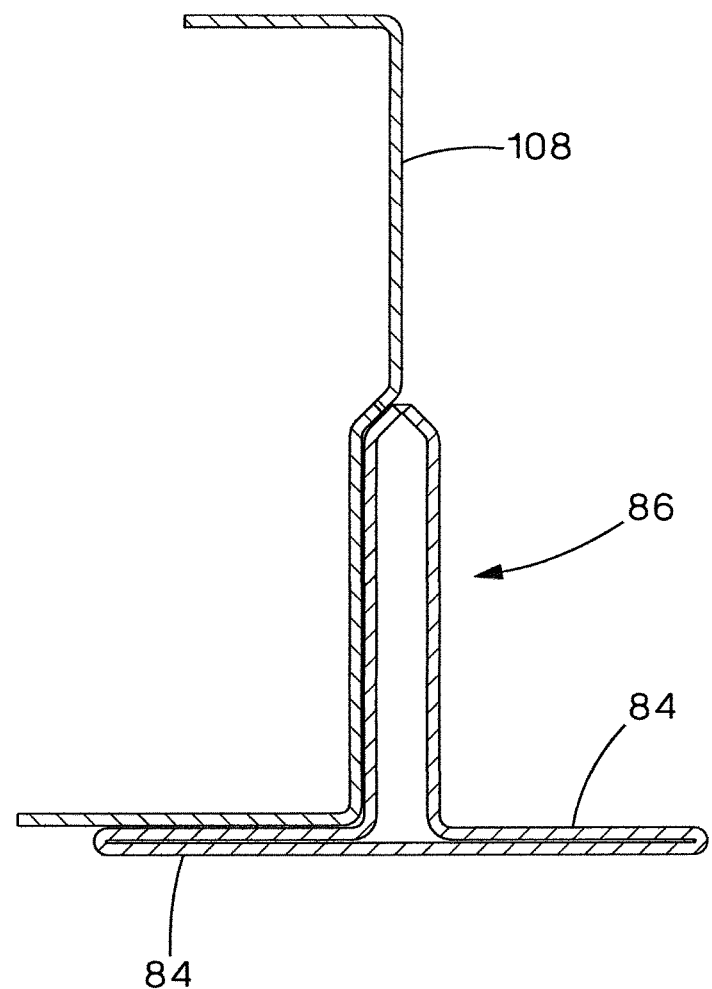
FIG. 15 is an end view of the cross tee of FIG. 10 supporting a ceiling light fixture box frame.

In a raised floor environment, no ceiling ducts or grates are required for an aisle containment installation. However, in a slab floor environment, ducts are required and light fixtures in the ceiling may be required. FIG. 15 shows that the profile of cross tee 86 is compatible with a standard suspended ceiling light fixture frame 108, which accommodates standard fluorescent fixtures.

Figure 16:
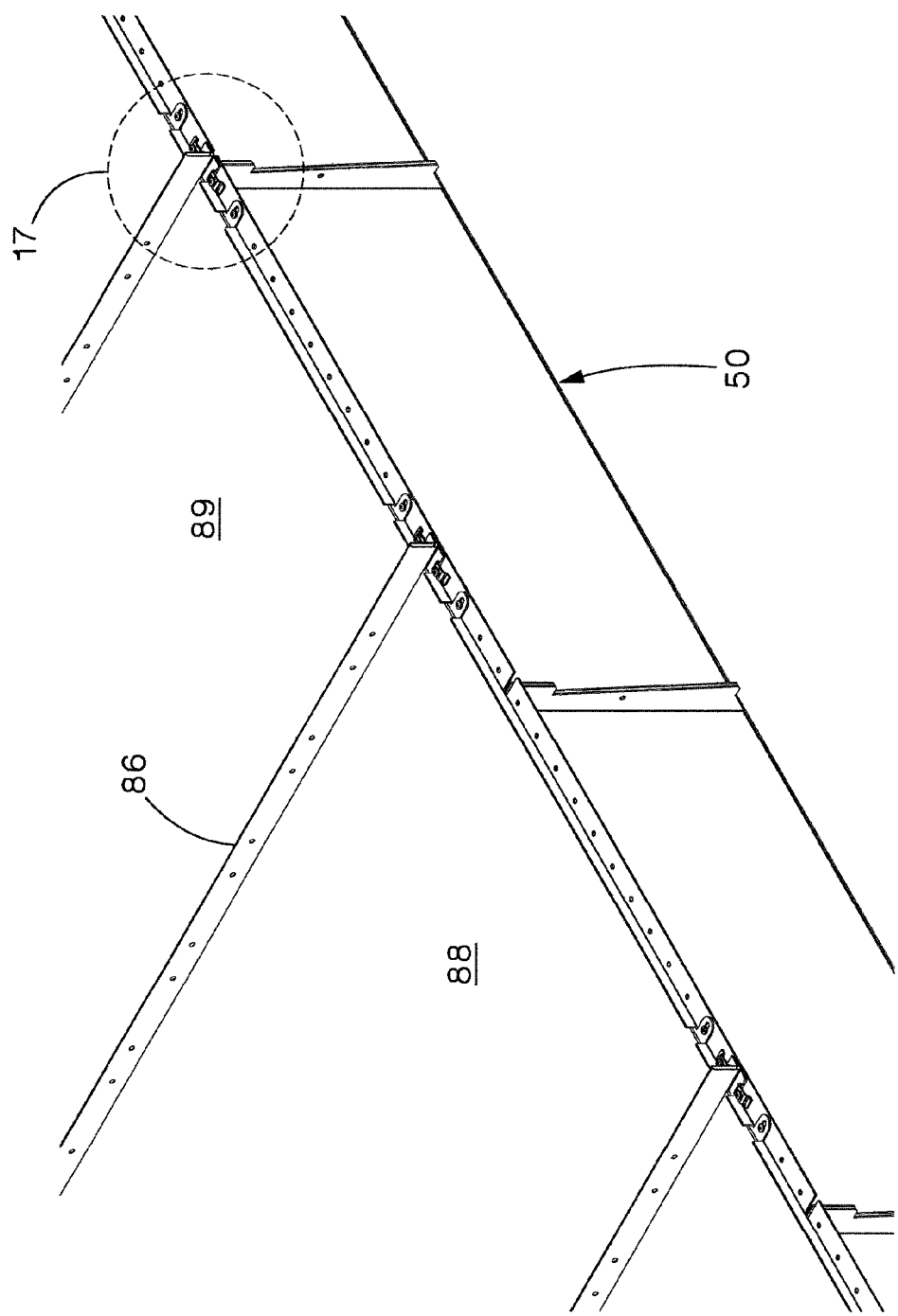
FIG. 16 is a perspective view of portions of the cross tees of FIG. 7 positioned on the cabinet vertical panels of FIG. 3.

Aisle containment system 40 shown in FIG. 1 includes two rows 42 and 44 of three equal width cabinets 46 (800 mm). Vertical panels 50 or 62 allow the use of any cabinet width which is a multiple of 100 mm in combination with any ceiling tile width which is a multiple of 100 mm. As best seen in FIG. 16, an 800 mm right angle spacer bar is utilized with an 800 mm ceiling panel 88, and a 600 mm right angle spacer bar is utilized with a 600 mm ceiling panel 89.

Figure 17:
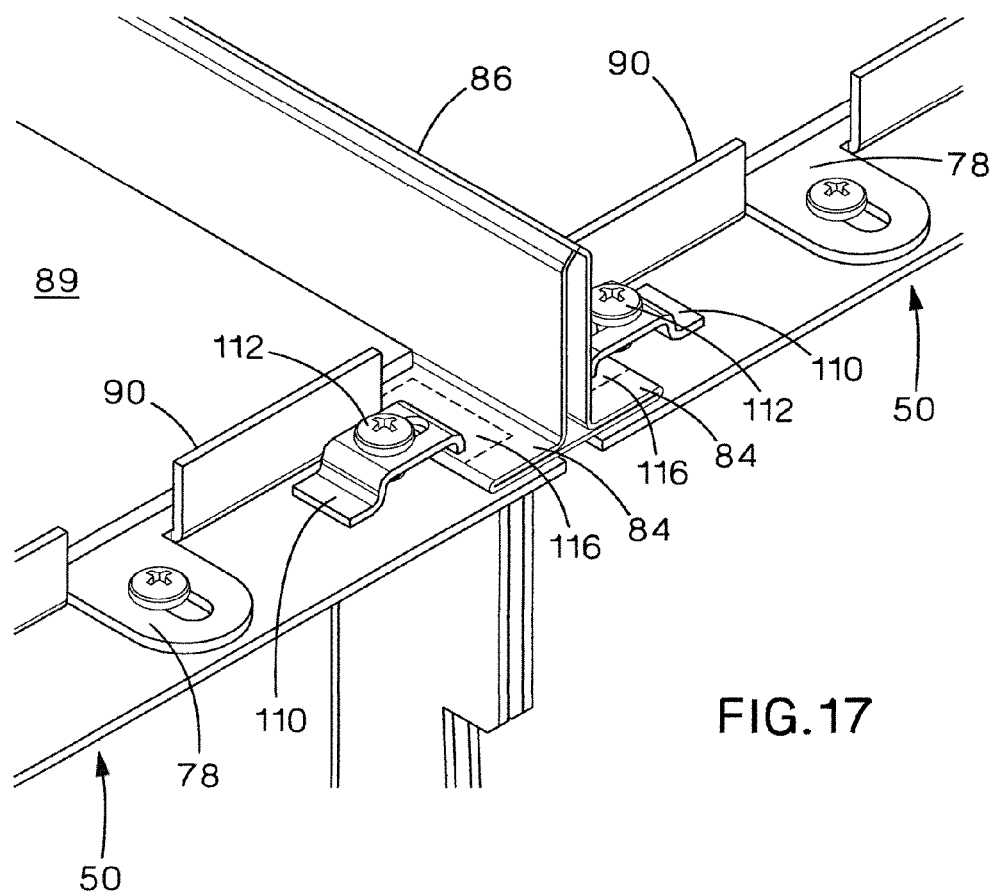
FIG. 17 is an enlarged perspective view of detail 17 in FIG. 16.
Figure 18:
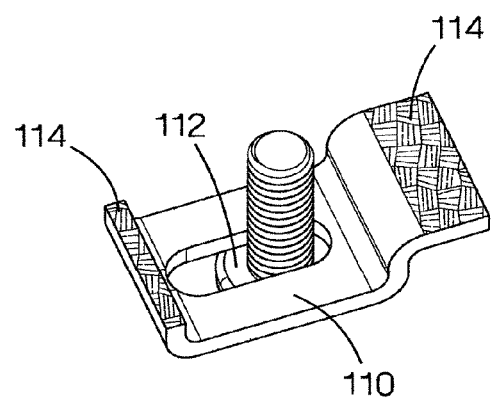
FIG. 18 is a bottom perspective view of the clamp and screw of FIG. 17.

There are some large tolerances involved when installing cabinets in an aisle containment system. Examples include levelness of floor, perpendicularity of cabinet to floor, allowable manufacturing tolerances, and material variances. In order to account for these tolerances, clamp 110 and screw 112 may be used to secure cross tee 86 to vertical panels 50 as shown in FIG. 17. When clamps 110 are loose, cross tee 86 may be properly positioned relative to other cross tees. When cross tee 86 is positioned properly, screws 112 may be tightened to secure cross tee 86 to vertical panels 50. As best seen in FIG. 18, contact surface 114 may be grooved or textured to provide additional clamping strength and ground connection. Also, flange 84 may include uncoated areas 116 to improve grounding between clamp 110 and cross tee 86.

Figure 20:
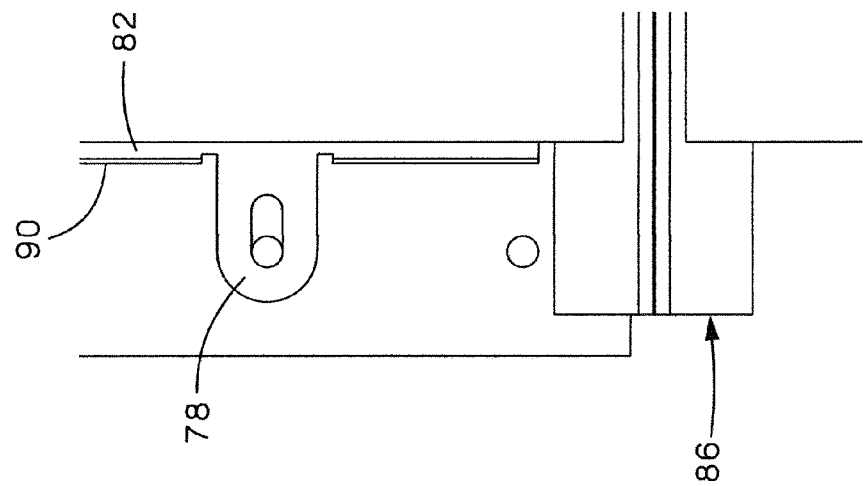
FIG. 20 is a top view of a portion of the right angle spacer bar of FIG. 6, showing a mounting hole location for a maximum aisle width.
Figure 19:
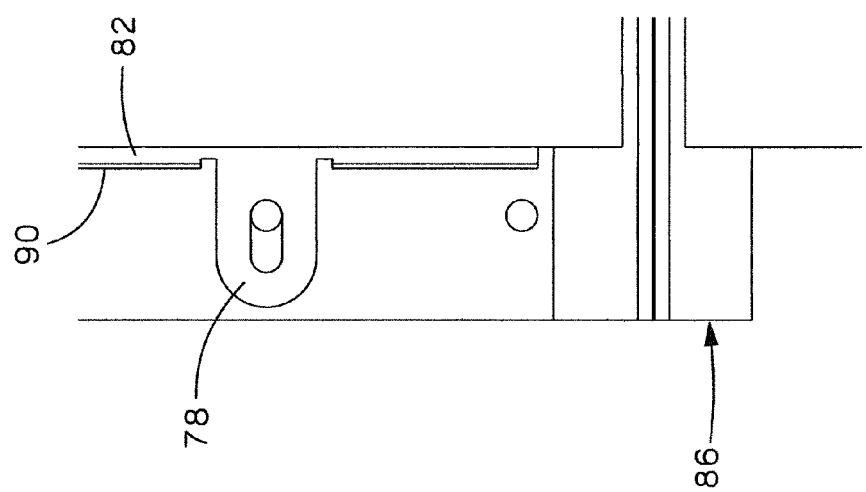
FIG. 19 is a top view of a portion of the right angle spacer bar of FIG. 6, showing a mounting hole location for a minimum aisle width.

FIGS. 19 and 20 show the minimum and maximum positions of aisle width, respectively. The tolerance of the aisle width is 0.625 inches, approximately 0.313 inches on each side. Thus, in the minimum position, the aisle width is approximately 71.687 inches. In the maximum position, the aisle width is approximately 72.313 inches.

Figure 21:
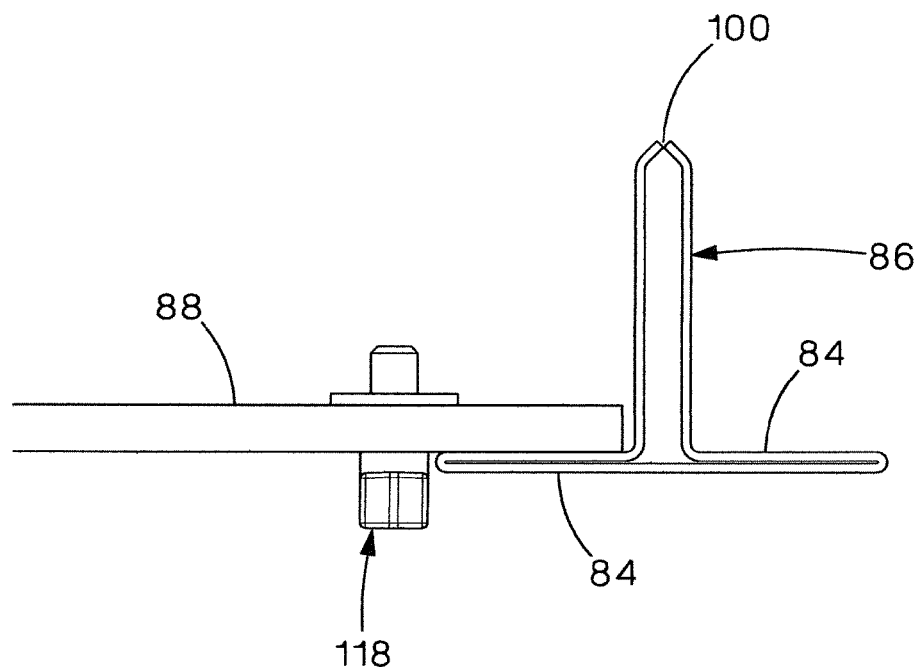
FIG. 21 is an end view of the cross tee of FIG. 10 supporting a ceiling panel with a clamp in the unlocked position.
Figure 22:
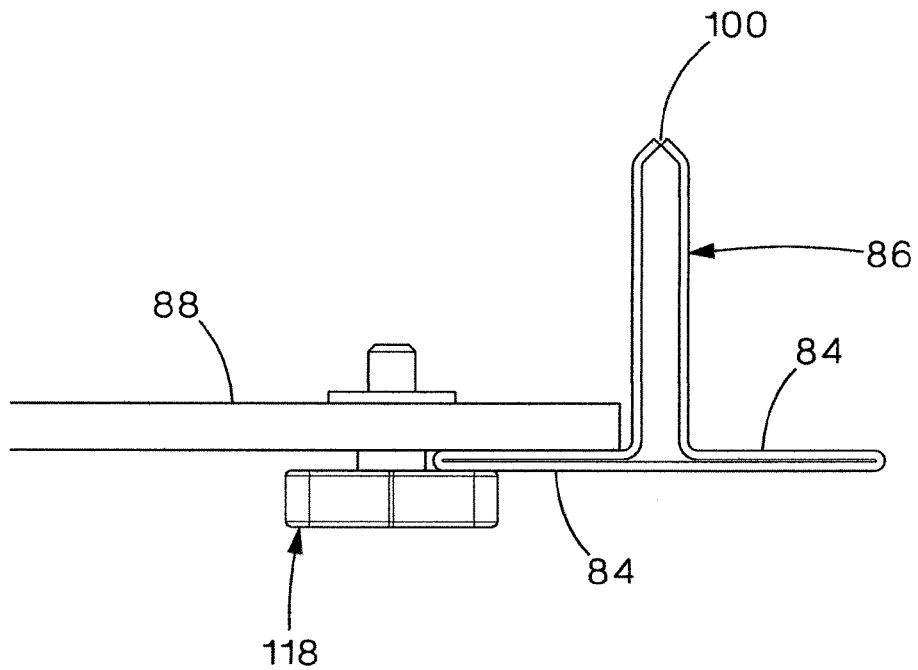
FIG. 22 is an end view of the cross tee of FIG. 10 supporting a ceiling panel with a clamp in the locked position.

FIGS. 21 and 22 show ceiling panels 88 being secured to cross tee 86. Ceiling panel 88 has holes at each corner, and ceiling panel 88 is positioned on either flange 84 of cross tee 86. A quarter turn hold-down clamp 118 is mounted in the corners of ceiling panel 88, and clamp 118 is rotated 90 degrees from the unlocked to the locked position.

Figure 23:
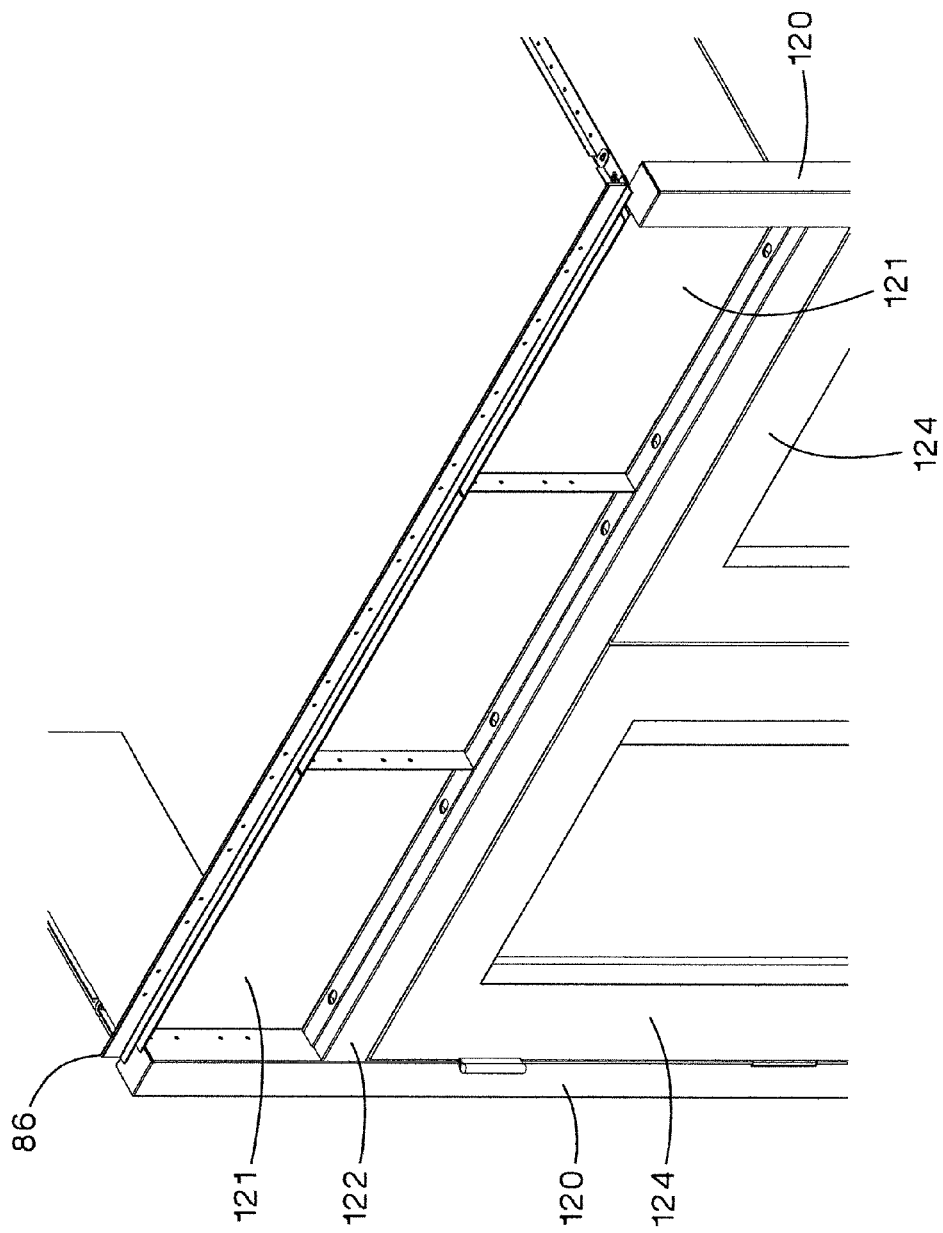
FIG. 23 is an enlarged perspective view of a portion of the door assembly of FIG. 1.

FIG. 23 shows door assembly 48. Two support posts 120 extend from the floor to the top of vertical panels 121. Beam 122 is positioned on top of doors 124 and between support posts 120. Vertical panels 121 are bolted to the top of beam 122, and vertical panels 121 are bolted to support posts 120. Cross tee 86 is clamped to the top of vertical panels 121.

Figure 24:
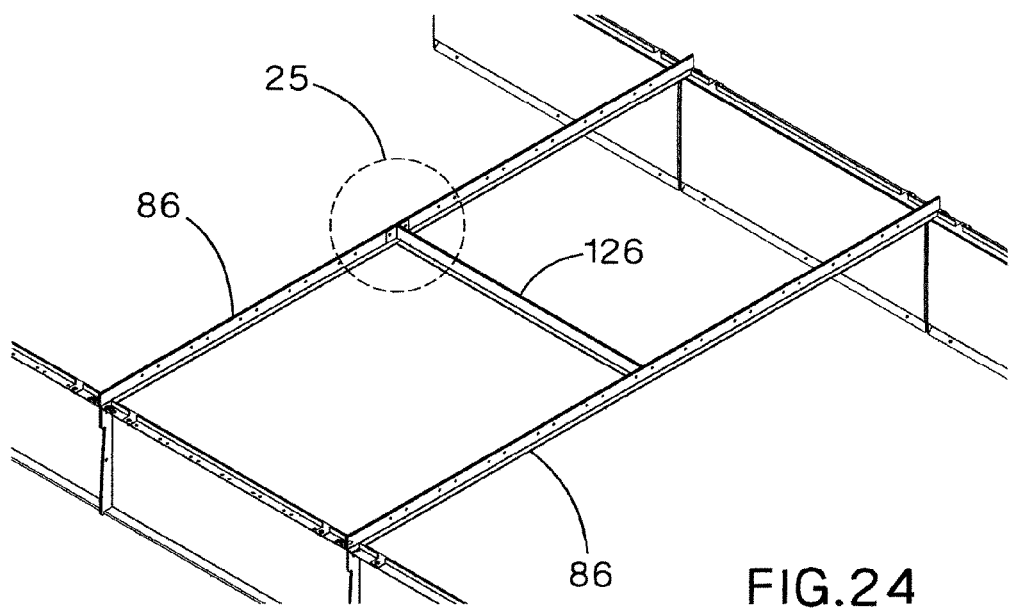
FIG. 24 is an enlarged perspective view of a portion of the aisle containment system of FIG. 1, showing a secondary cross tee mounted between two cross tees of FIG. 7.
Figure 25:
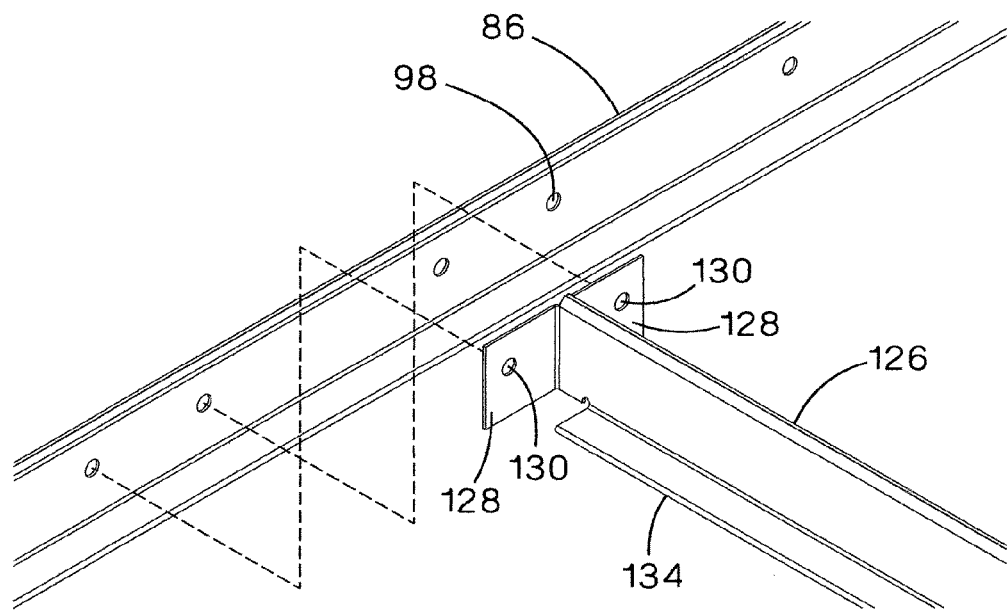
FIG. 25 is an exploded perspective view of detail 25 in FIG. 24, showing the secondary cross tee before mounting between two cross tees of FIG. 7.

FIGS. 24 and 25 show secondary cross tee 126 mounted between two cross tees 86 to divide ceiling panel 88 into two smaller panels for easier handling. Cross tee 126 has end flanges 128 including holes 130 to secure cross tee 86. Cross tee 86 has a plurality of holes 98 for mounting cross tee 126 in multiple locations, and cross tee 126 has a lower flange 134 cut back to drop down between two cross tees 86 so that all the flanges are in the same plane. Ceiling panels 88 can be cut to various sizes depending on the location of cross tee 126.

Figure 26:
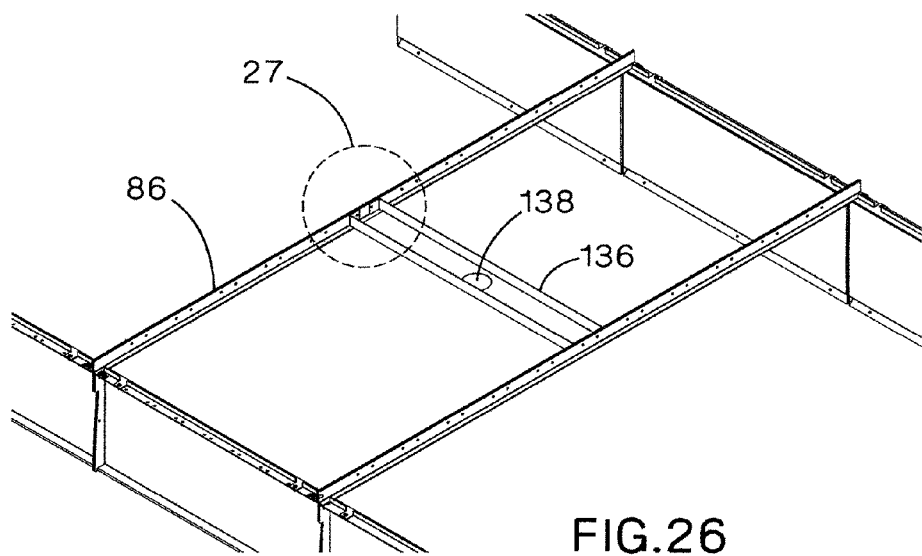
FIG. 26 is an enlarged perspective view of a portion of the aisle containment system of FIG. 1, showing a fire suppression cross tee mounted between two cross tees of FIG. 7.
Figure 27:
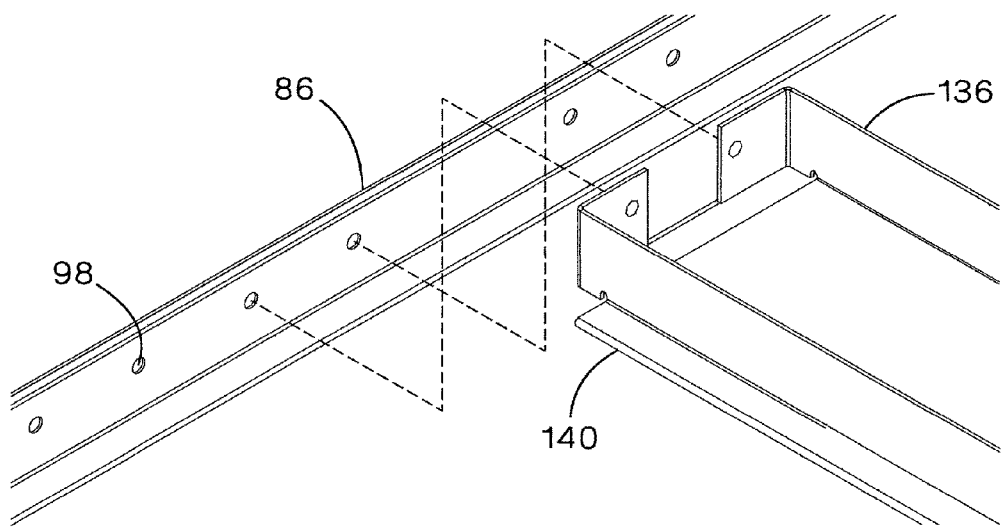
FIG. 27 is an exploded perspective view of detail 27 in FIG. 26, showing the fire suppression cross tee before mounting between two cross tees of FIG. 7.

FIGS. 26 and 27 show fire suppression cross tee 136 mounted between two cross tees 86. Cross tee 136 has an access hole 138 that allows fire suppression components to penetrate from overhead into the aisle containment area. Preferably, access hole 138 has a three inch diameter. Cross tee 136 can be bolted into cross tees 86 in the same holes 98 as secondary cross tee 126 described in FIGS. 24 and 25. Cross tee 136 has a lower flange 140 cut back to drop down between two cross tees 86 so that all the flanges are in the same plane. Ceiling panels 88 can be cut to various sizes depending on the location of cross tee 136.

Figure 28:
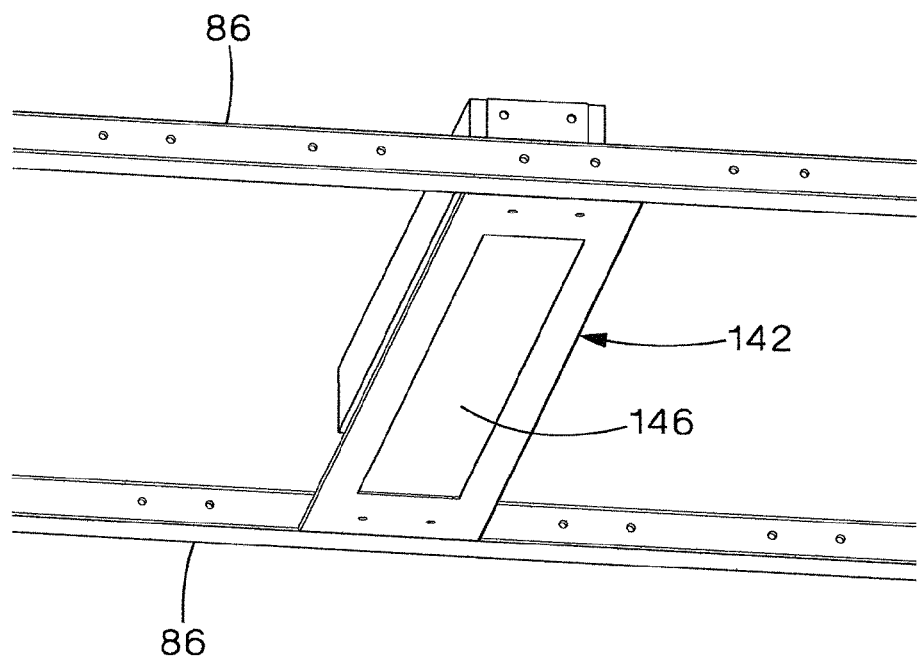
FIG. 28 is an enlarged bottom perspective view of a portion of the aisle containment system of FIG. 1, showing a light fixture cross tee mounted between two cross tees of FIG. 7.
Figure 29:
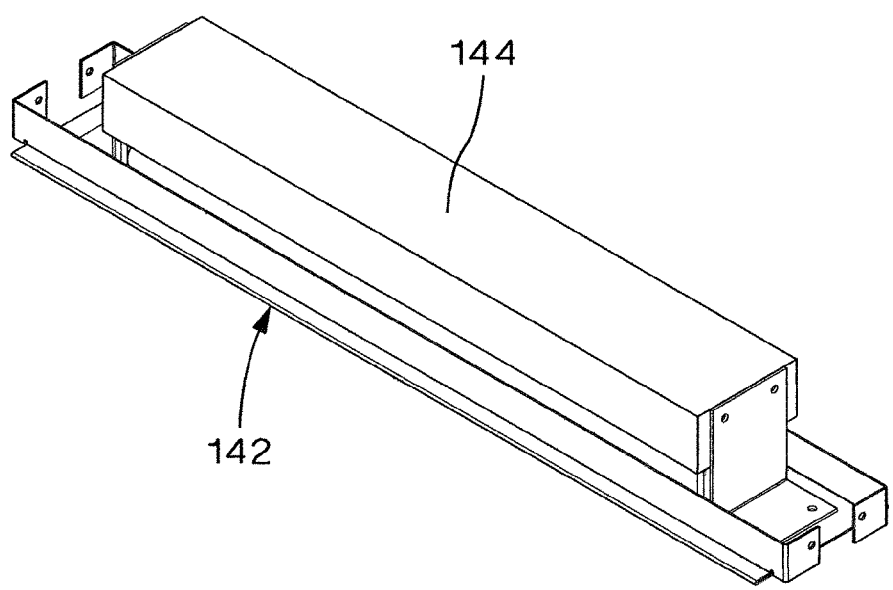
FIG. 29 is a top perspective view of the light fixture cross tee of FIG. 28.

FIGS. 28 and 29 show light fixture cross tee 142 mounted between two cross tees 86. Cross tee 142 has an integral light fixture 144 that spans the entire distance between cross tees 86 to maximize the light in the aisle. Lens 146 is flush with the aisle containment ceiling, as shown in FIG. 28.

Figure 30:
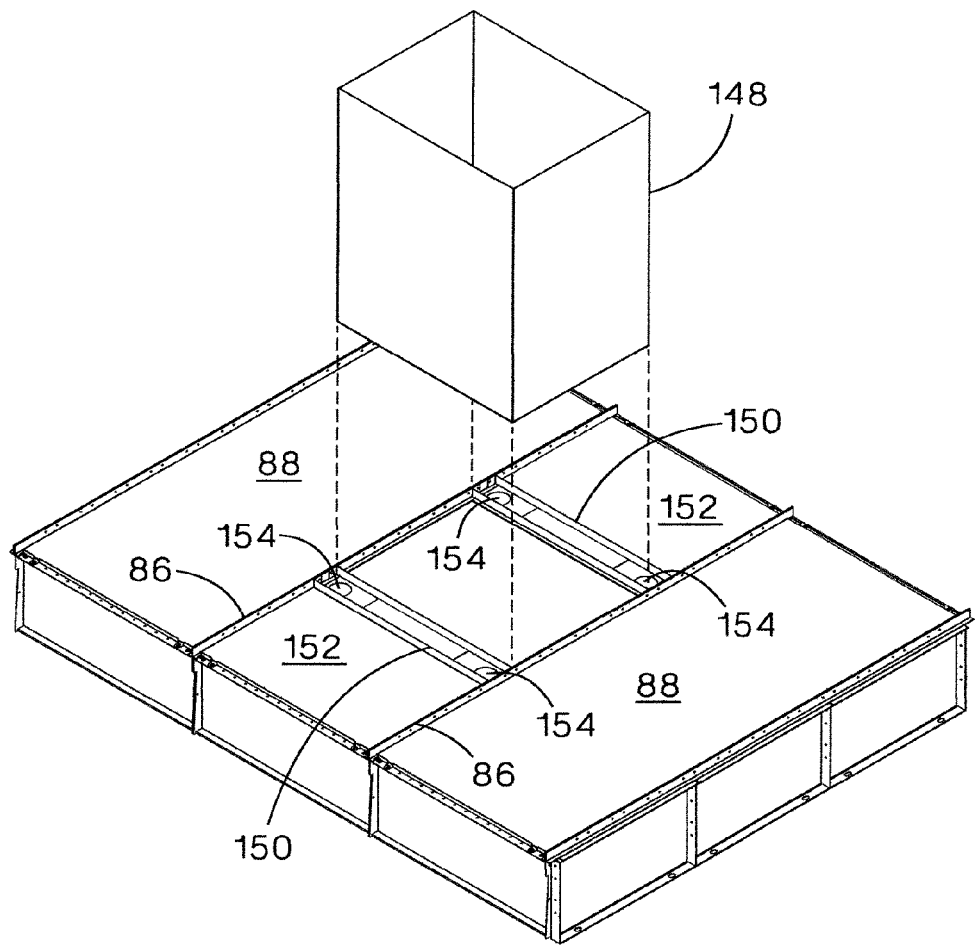
FIG. 30 is a perspective view of a portion of the aisle containment system of FIG. 1, showing two fire suppression cross tees with integral light fixtures mounted between two cross tees of FIG. 7 and before an air duct is installed between the secondary cross tees.

FIG. 30 shows air duct 148 mounted between cross tees 86. Two fire suppression cross tees 150 with integral light fixtures are bolted to cross tees 86 on the sides of air duct 148 for sealing and additional support. Ceiling panels 152 can be installed to seal the remainder of the section and provide access above the ceiling area. Cross tee 150 is a combination of cross tee 136 and cross tee 142, except cross tee 150 has two access holes 154 that allow fire suppression components to penetrate from overhead into the aisle containment area. Light fixtures are positioned between the fire suppression components to illuminate the aisle.

Figure 31:
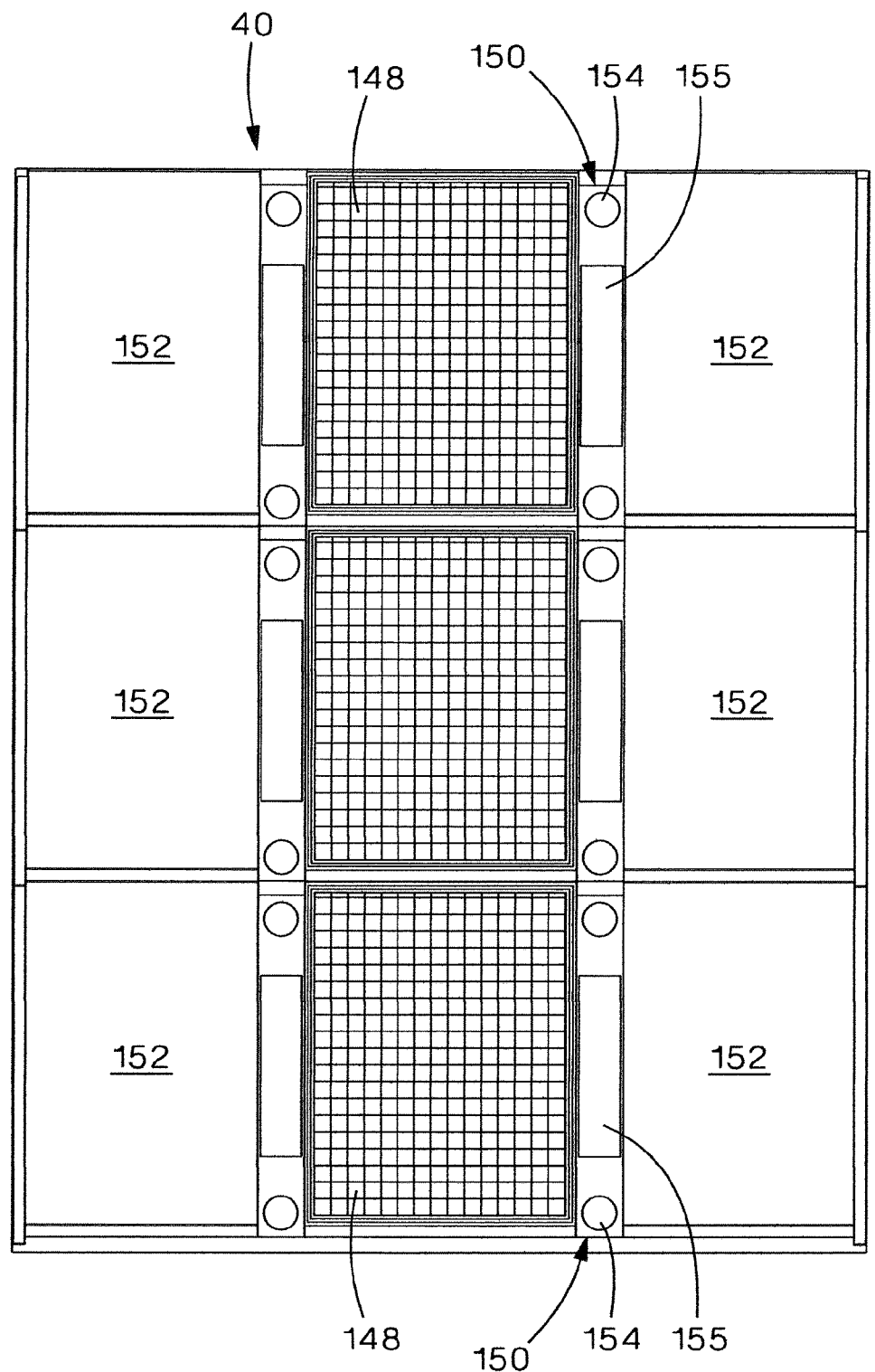
FIG. 31 is a top view of the aisle containment system of FIG. 30, showing three air ducts installed between secondary cross tees.
Figure 32:
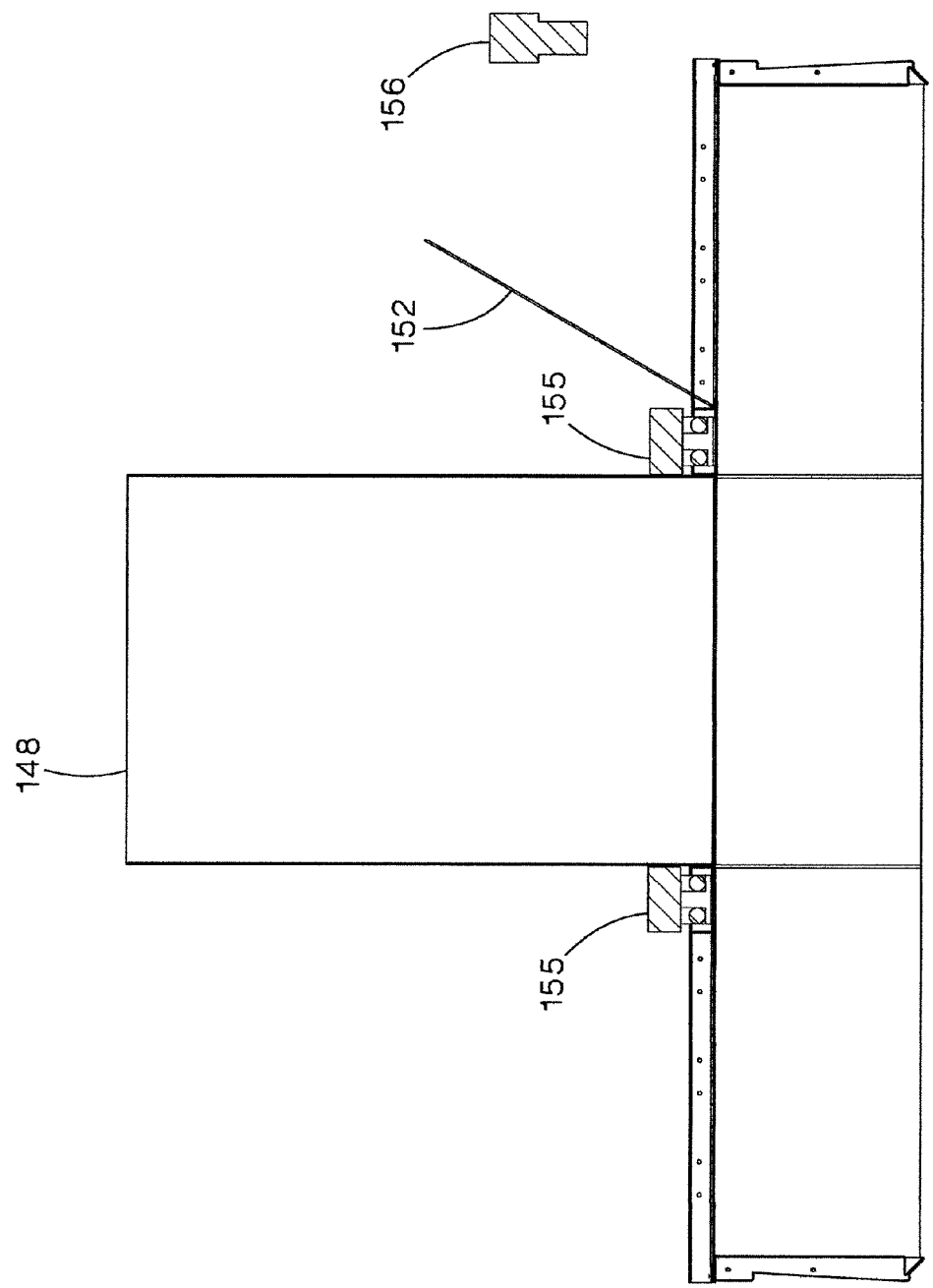
FIG. 32 is an end view of the aisle containment system of FIG. 31, showing one ceiling panel in the open position.

FIG. 31 shows multiple air ducts 148 installed in aisle containment system 40. Air ducts 148 can be various dimensions depending on the air handling requirements. Unused access holes 154 will be sealed, and light fixtures 155 provide additional lighting within the aisle. As best seen in FIG. 32, ceiling panels 152 can be lifted to provide access to the area above the aisle containment, which may include power bus 156.

Figure 33:
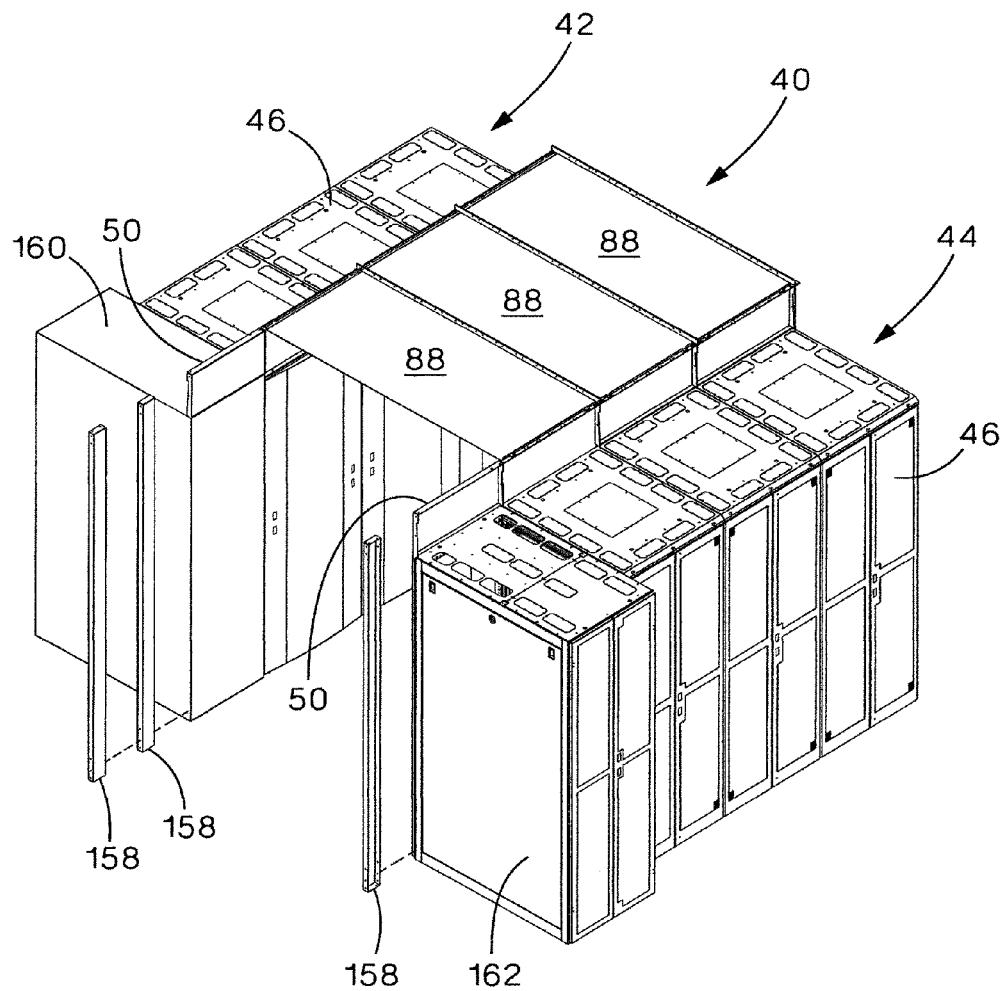
FIG. 33 is a perspective view of the aisle containment system of FIG. 1, after the cabinet vertical panels have been secured to the additional cabinets and prior to vertical blank panels being secured to the cabinet vertical panels and cabinets.

If multiple width cabinets exist in the aisle containment system, there may be a need for vertical blank panels 158. Preferably, vertical blank panel 158 is 100 mm wide. FIG. 33 shows a 600 mm wide cabinet 160 being added to row 42, and a 700 mm wide cabinet 162 being added to row 44. Thus, vertical blank panel 158 is secured to cabinet 160 to equalize the lengths of the two rows at 700 mm. However, each row 42, 44 consists of three 800 mm wide cabinets 46. In order to maintain the same ceiling panel width (800 mm) throughout the aisle containment system, one vertical blank panel 158 is secured to cabinet 162, and one vertical blank panel 158 is secured to vertical blank panel 158.

Figure 34:
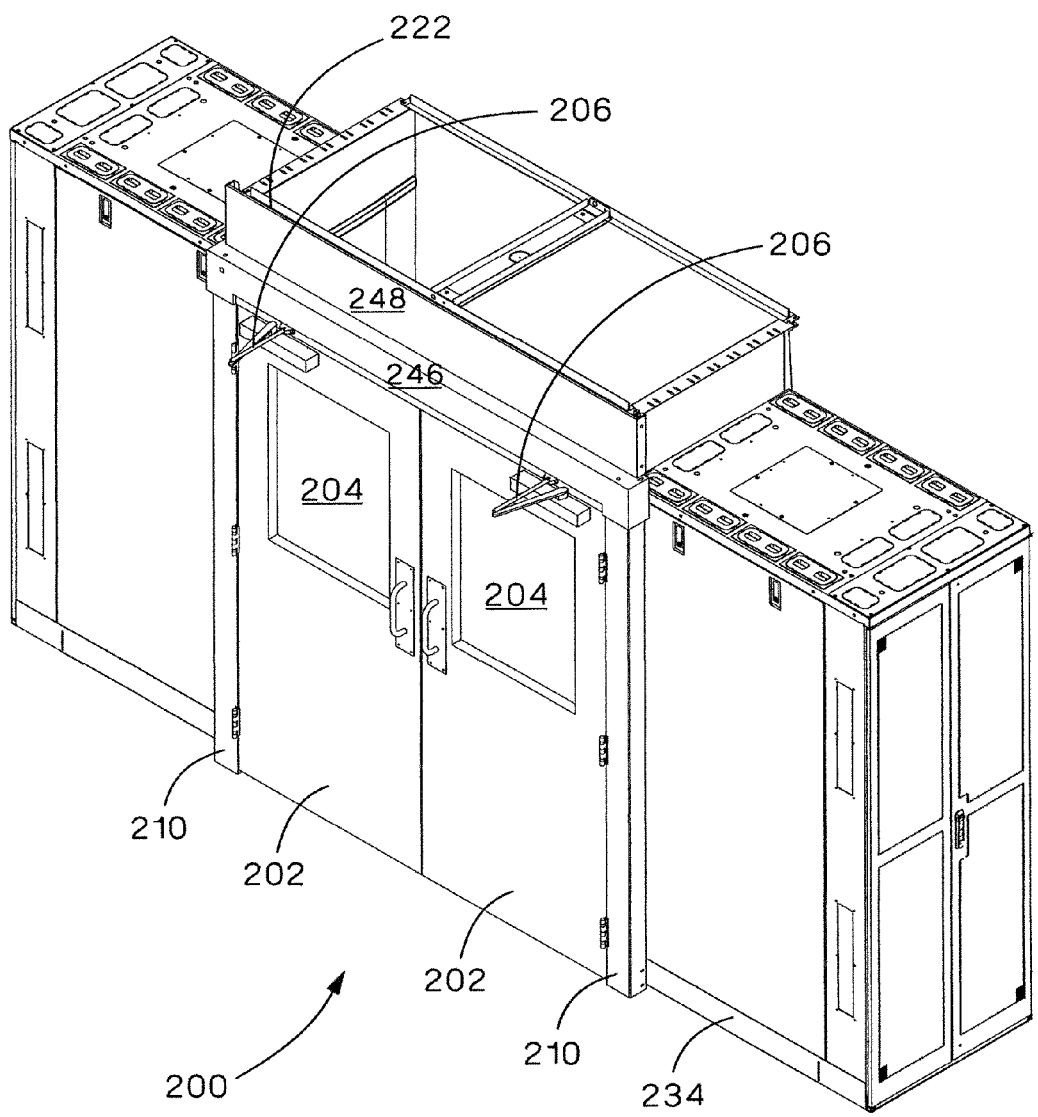
FIG. 34 is a perspective view of an alternate door assembly for the aisle containment system of FIG. 1.

FIGS. 34-46 show door assembly 200. Preferably, each door 202 is a standard 36" steel door with half windows 204. Doors 202 have closers 206 with hold-open features and do not latch or lock. However, latching and locking features can be added to doors 202. Although only one pair of network cabinets is shown in FIG. 34, more cabinets are typically used and another door assembly 200 is positioned at the other end of the containment aisle. Door assembly 200 is mounted to two rows of cabinets spaced 6 feet apart. However, the two rows of cabinets may be spaced only 4 feet apart, using the same door posts, but shorter header, transom and covers along with narrower doors.

Figure 35:
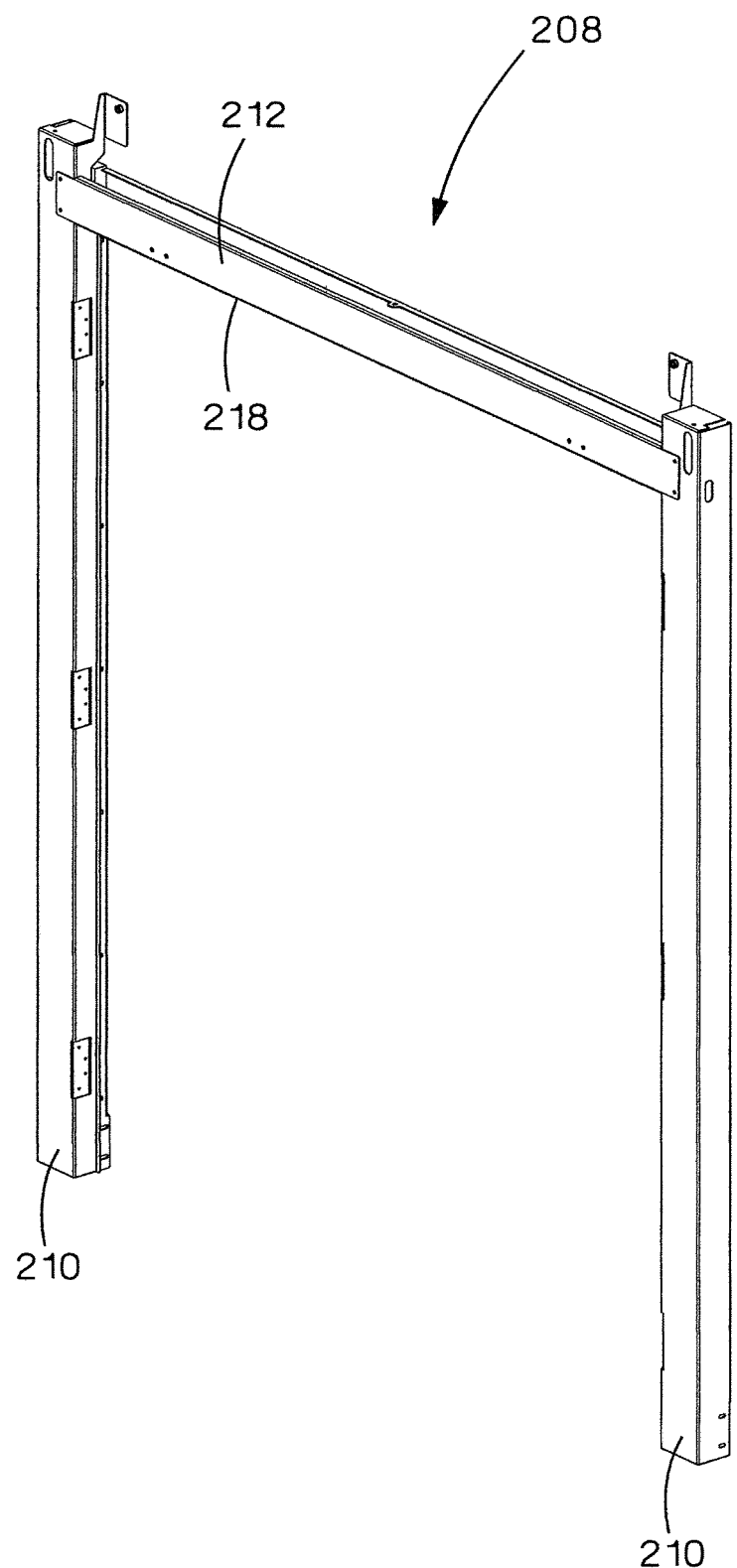
FIG. 35 is a perspective view of a door frame for the door assembly of FIG. 34.
Figure 36:
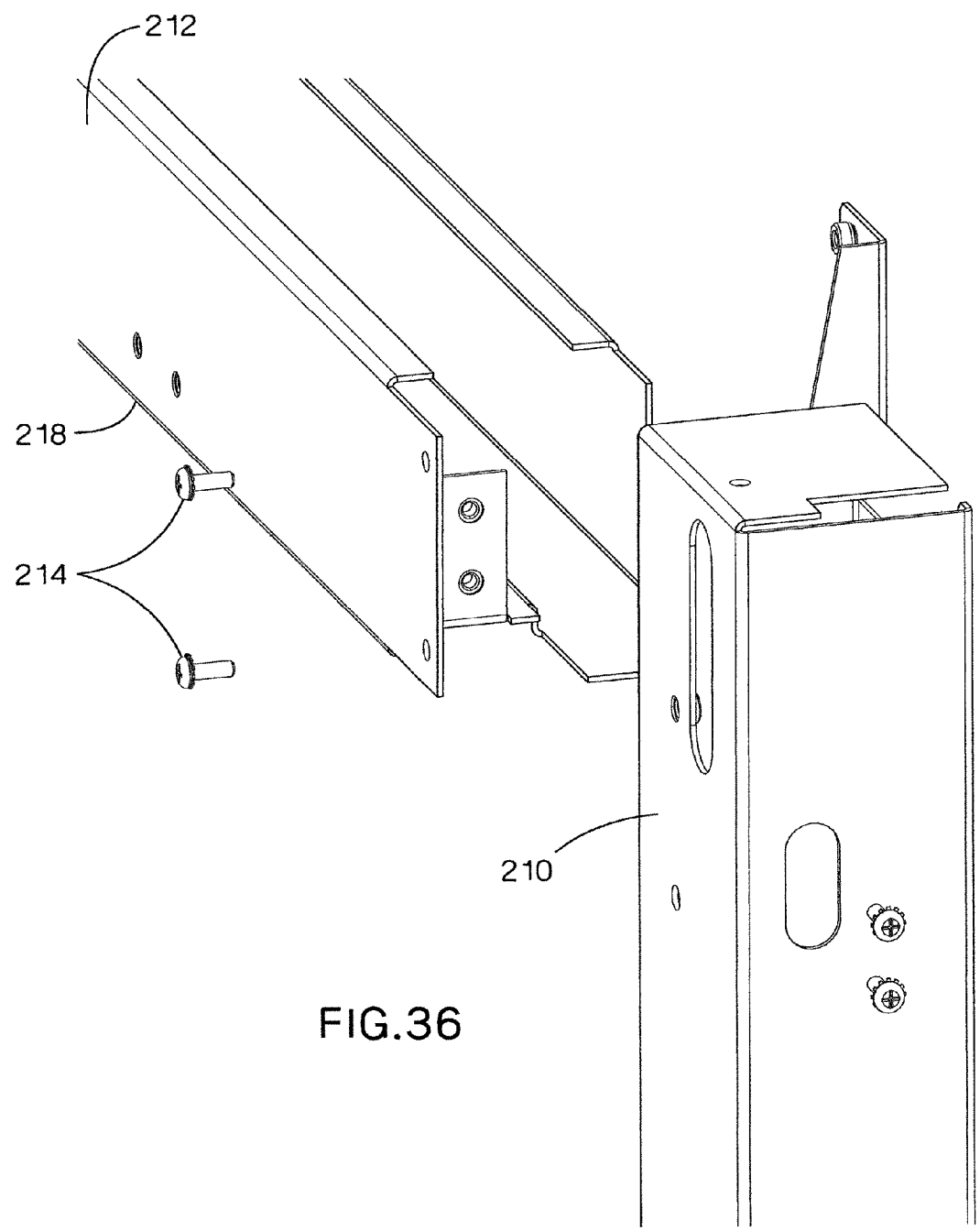
FIG. 36 is an exploded front perspective view of a portion of the door frame of FIG. 35.
Figure 37:
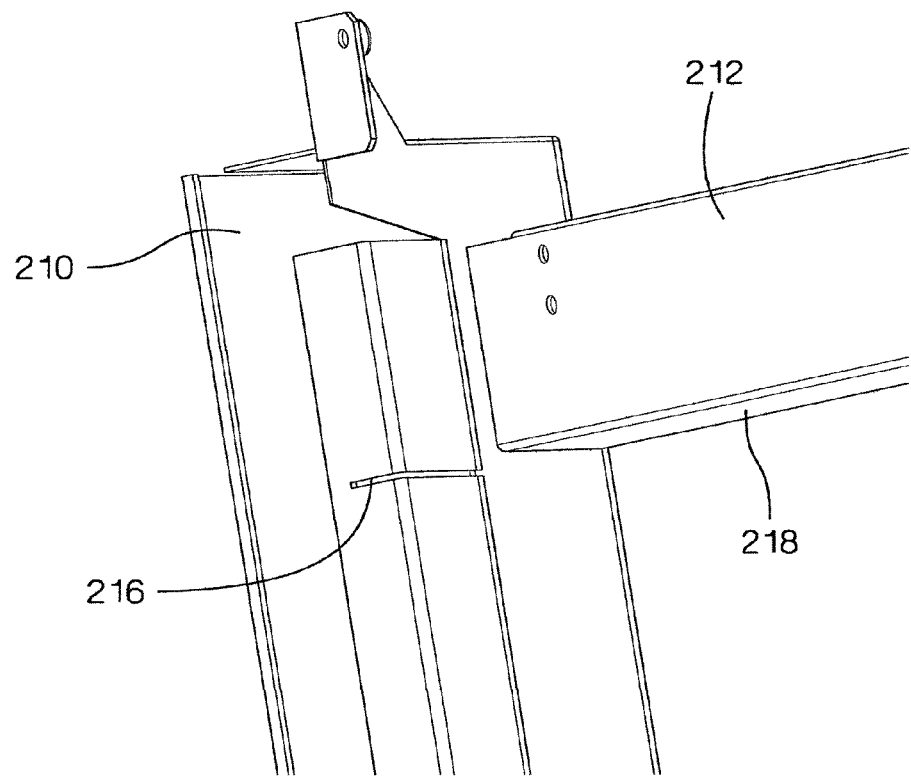
FIG. 37 is an exploded rear perspective view of a portion of the door frame of FIG. 35.

FIG. 35-37 shows door frame 208. Door frame 208 includes two door posts 210 and header 212. Each post 210 is attached to header 212 using screws 214, as shown in FIG. 36. Post 210 has horizontal slot 216 to provide a location for header 212. As shown in FIG. 37, bottom 218 of header 212 slides into slot 216 to ensure that header 212 is at the correct height. Foam seals may be attached to flanges on the back side of door posts 210, and the foam seals would press against the cabinet side panels.

Figure 38:
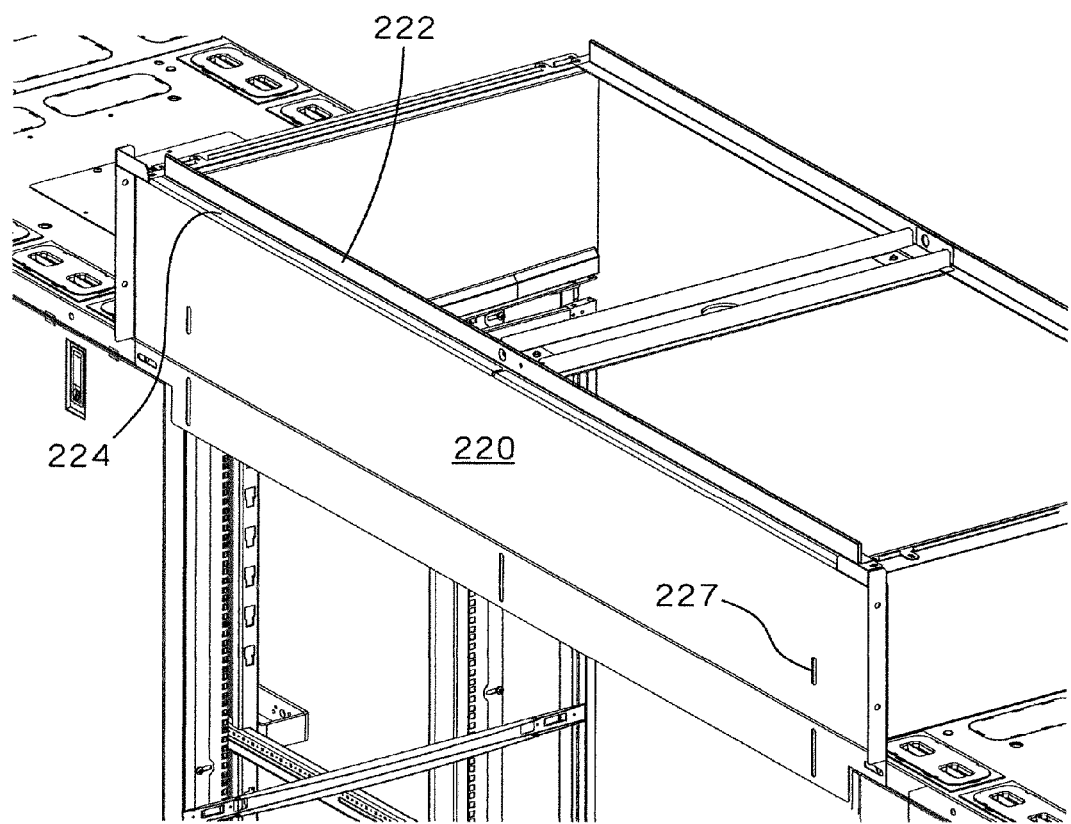
FIG. 38 is an enlarged perspective view of a transom for the door assembly of FIG. 34.
Figure 39:
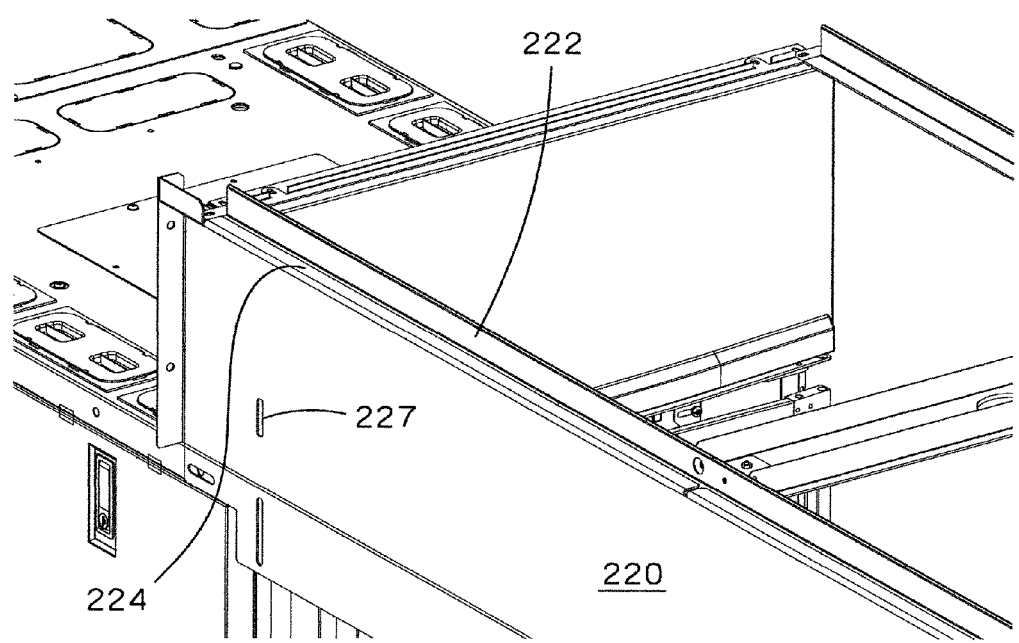
FIG. 39 is a perspective view of a portion of the transom of FIG. 38.
Figure 40:
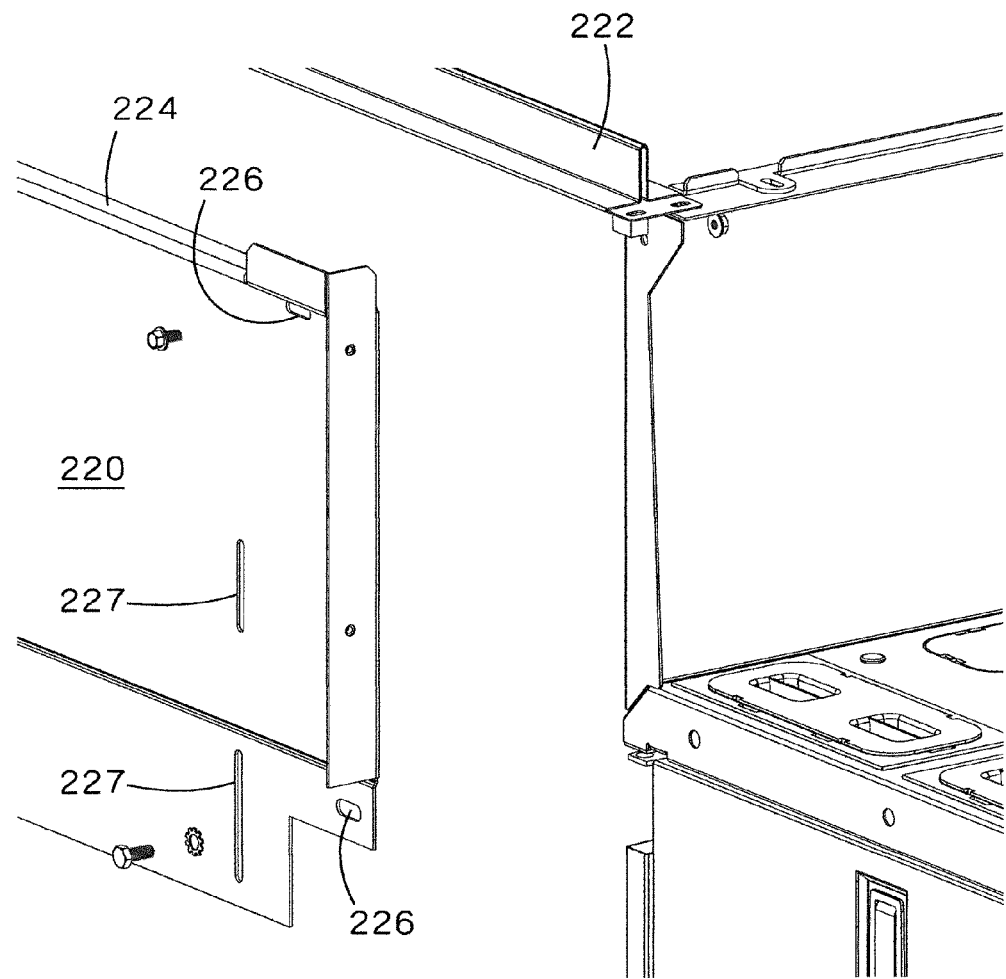
FIG. 40 is an exploded perspective view of a portion of the transom of FIG. 38, before the transom is attached to the top cap of the network cabinet.
Figure 41:
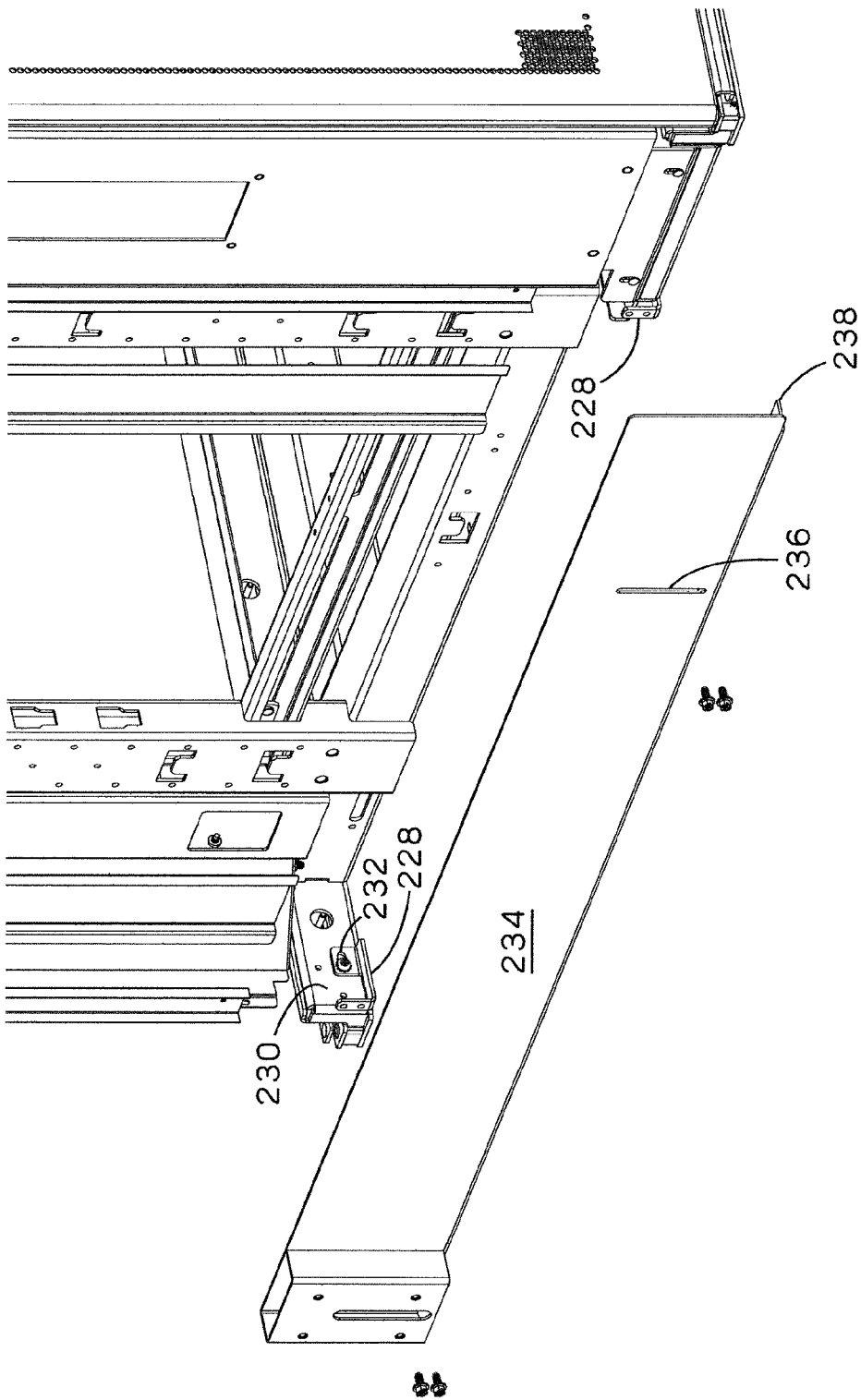
FIG. 41 is an exploded perspective view of a side skirt for the door assembly of FIG. 34, before the side skirt is attached to the bottom of the network cabinet.

FIGS. 38-40 show transom 220. Transom 220 is a panel that fills the area above door frame 208 up to the containment ceiling. Transom 220 attaches to the vertical containment walls and the cabinet top cap. Because transom 220 is attached to the cabinet and walls, it moves up and down with the cabinet as the leveling legs are adjusted. As shown in FIG. 39, cross-aisle tee beam 222 attaches to the top of transom 220 and an open hem 224 across the top of transom 220 hooks over one leg of tee beam 222. Open hem 224 provides an assembly aid when attaching transom 220 to holes in the cabinet top cap (see FIG. 40). Horizontal slots 226 in transom 220 provide adjustability, so that transom 220 can be adjusted left or right to ensure that door posts 210 are vertical.

Figure 42:
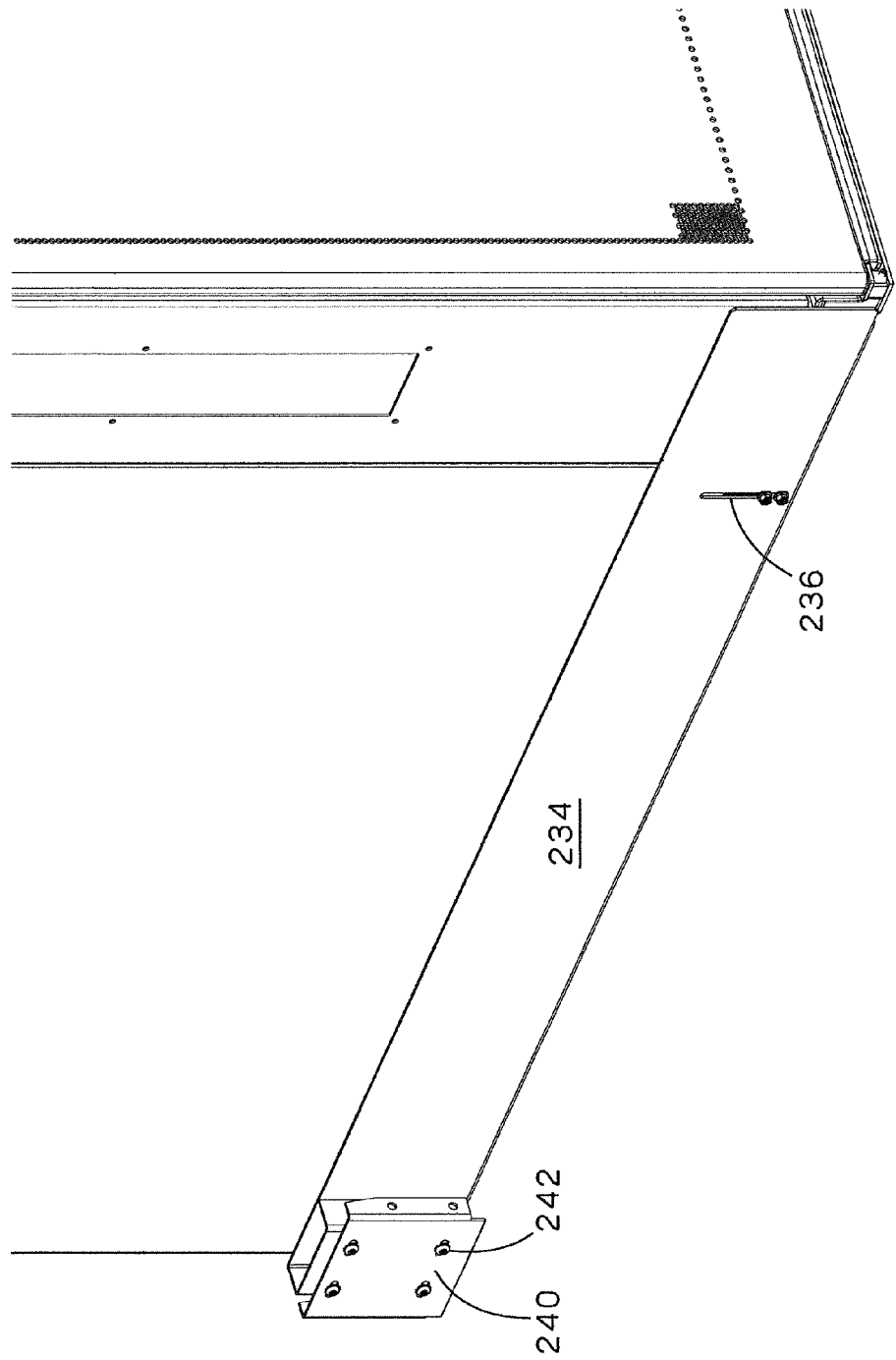
FIG. 42 is a perspective view of the side skirt of FIG. 41, after the side skirt is attached to the bottom of the network cabinet.
Figure 43:
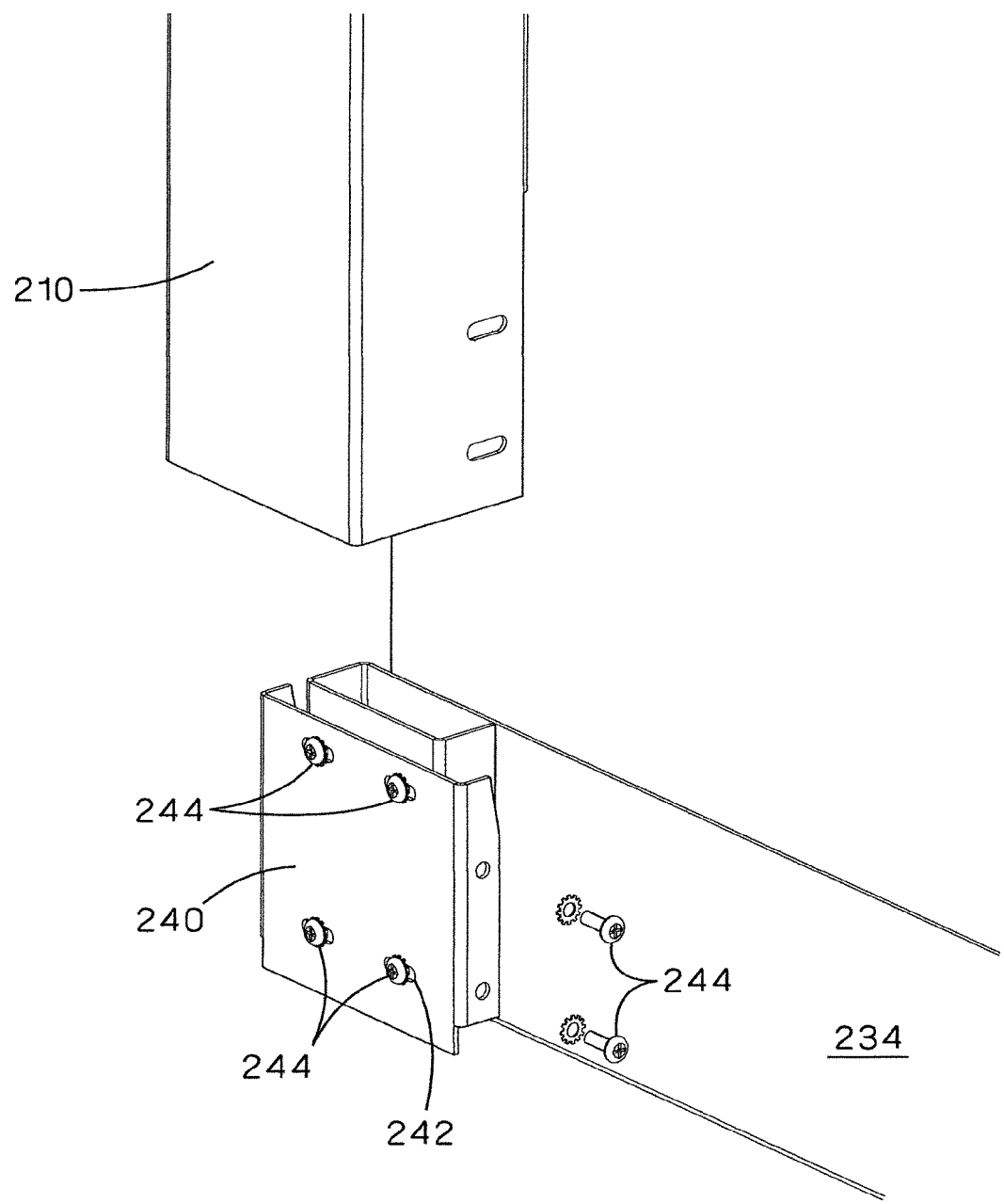
FIG. 43 is an exploded perspective view of a portion of the door assembly of FIG. 34, before the door frame is attached to the lower post support and the side skirt.
Figure 44:
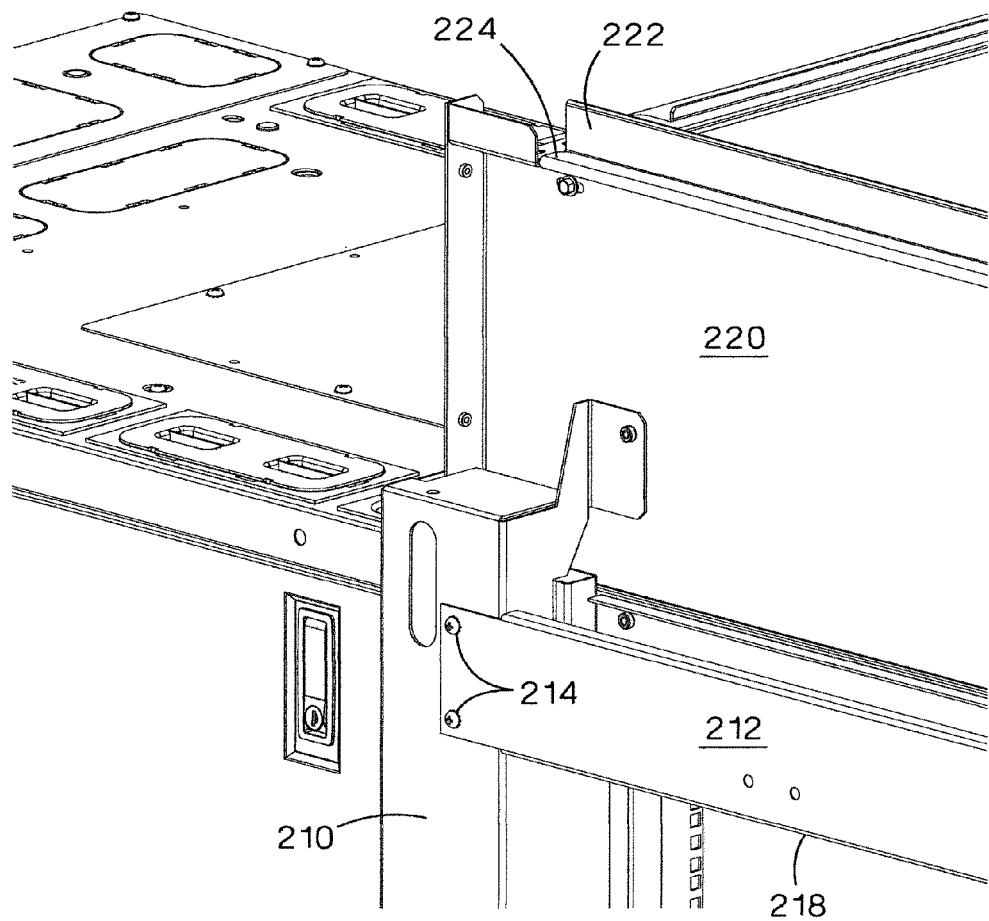
FIG. 44 is a front perspective view of a portion of the door assembly of FIG. 34, after the door frame is attached to the transom.

FIGS. 41-46 show the steps for attaching door assembly 200 to one end of two rows of network cabinets. First, brackets 228 attach to door shoe 230, and slots 232 in brackets 228 allow for in and out adjustment of door posts 210 to ensure that they are vertical. The cabinet side panel may be removed to ease installation of brackets 228, but the side panel must be installed before attaching side skirt 234. Next, side skirt 234 attaches to brackets 228. Side skirt 234 rests on the floor and is held against the cabinet side panel to prevent air leakage, as shown in FIG. 42. Vertical slots 236 in side skirt 234 allow for the cabinet to be raised off the floor by casters or leveling legs, while side skirt 234 remains in contact with the floor. Flange 238 on the bottom of side skirt 234 tucks under the cabinet.

Figure 45:
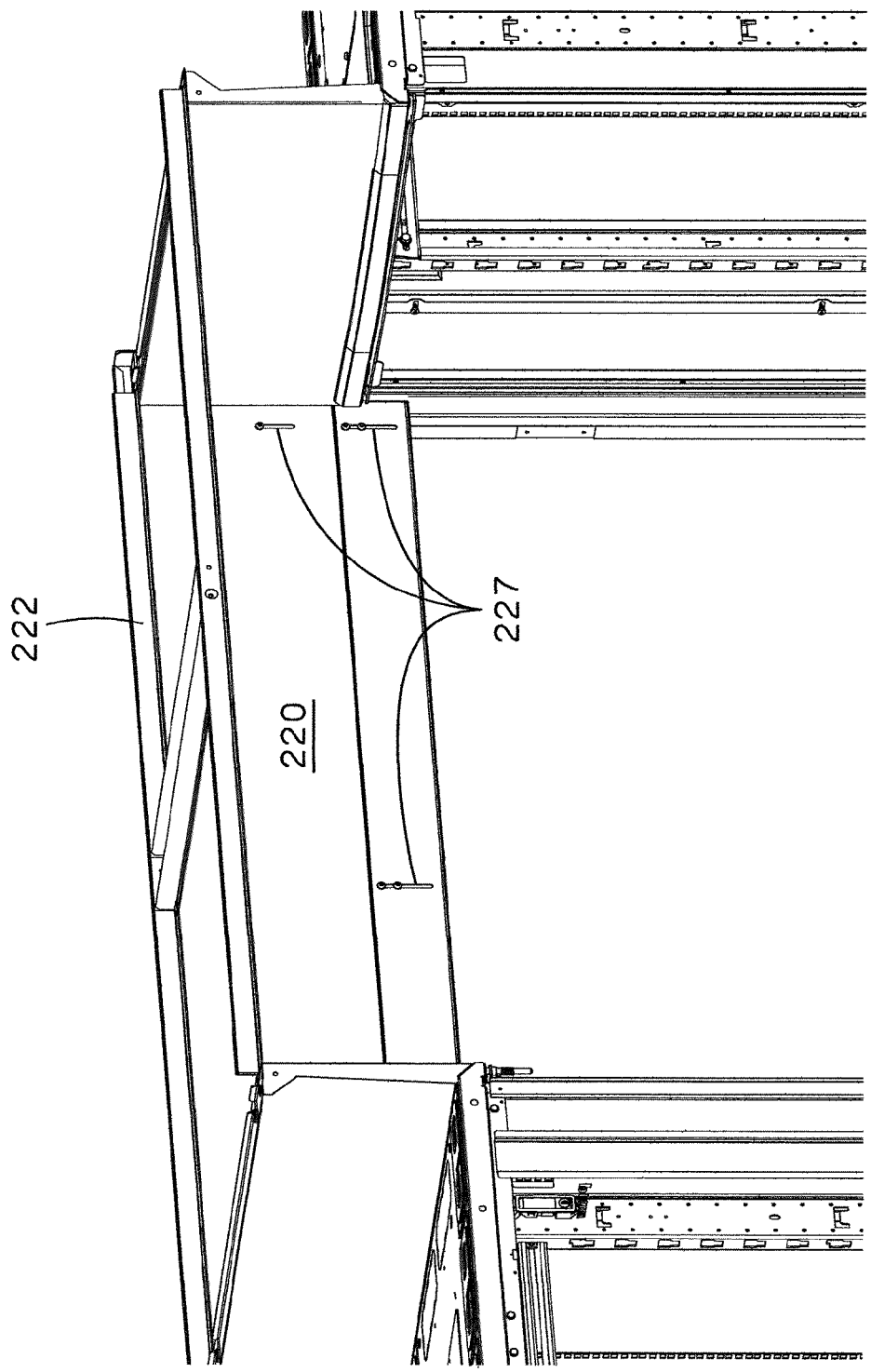
FIG. 45 is a rear perspective view of the transom of FIG. 44, after the door frame is attached to the transom.

As shown in FIG. 42, lower post support 240 attaches to side skirt 234. Support 240 has slots 242 which allows it to adjust horizontally. This adjustment allows door posts 210 to be mounted 6 feet apart, even if the cabinets are spaced slightly more or less than 6 feet apart. Next, door post 210 is placed over lower post support 240 and attached with screws 244 as shown in FIG. 14. Then, door frame 208 is aligned with transom 220 and attached to transom 220 from inside the containment aisle as shown in FIG. 45. Because transom 220 has vertical adjustment slots 227, the height of transom 220 is adjustable as the leveling legs are adjusted on the cabinets. However, door frame 208 remains on the floor.

Figure 46:
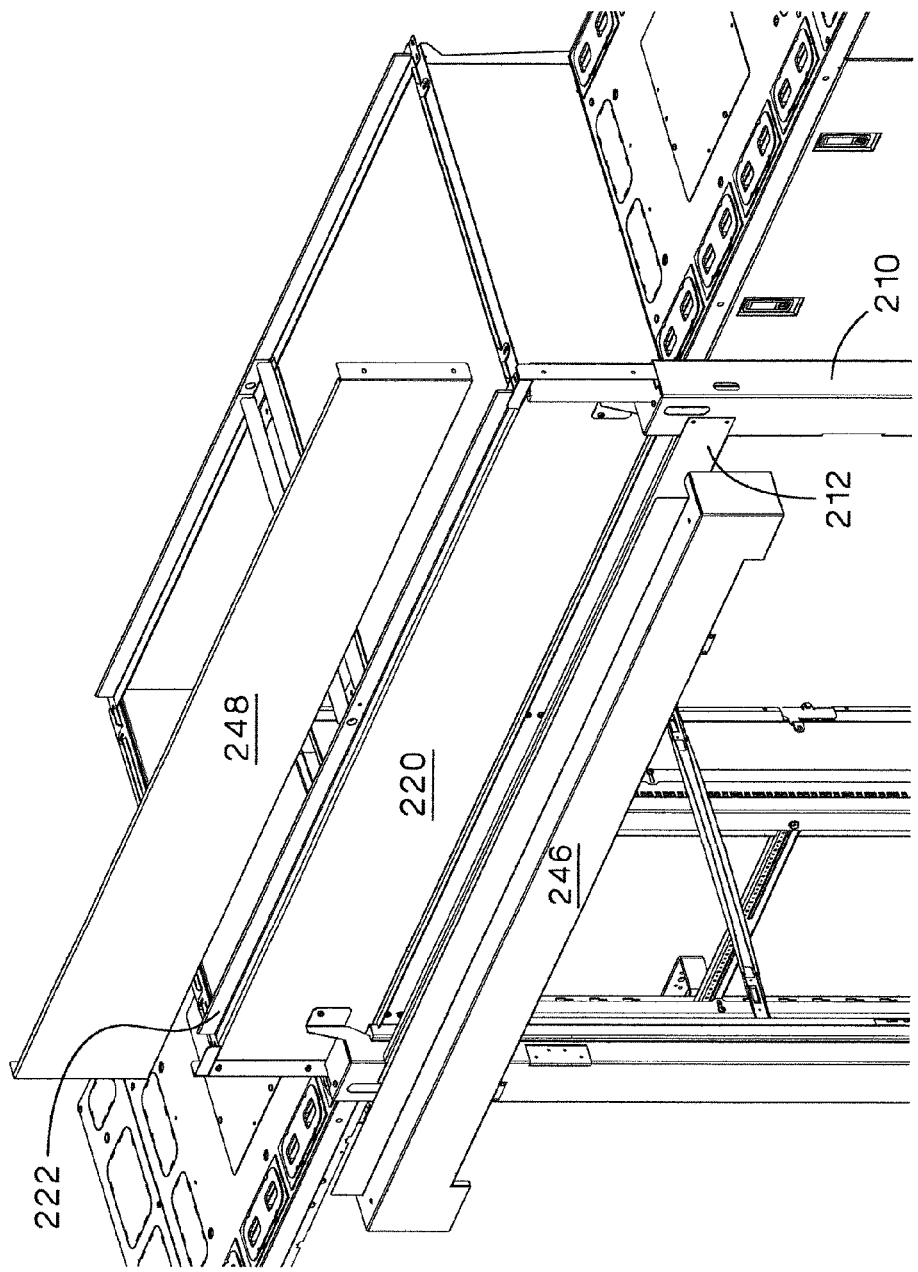
FIG. 46 is a partially exploded perspective view of the door assembly of FIG. 34, before covers are placed over the transom and the header.
Figure 47:
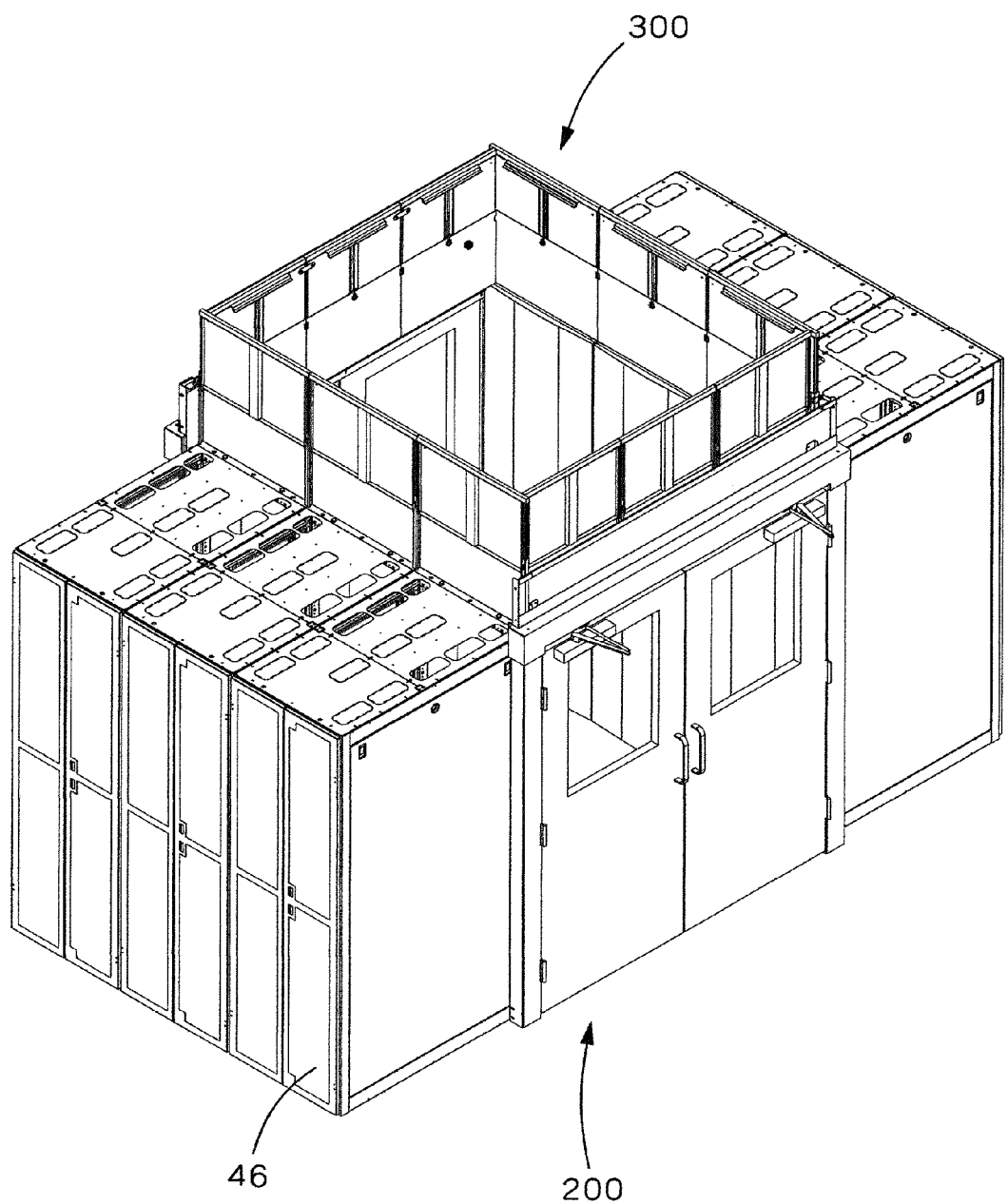
FIG. 47 is a perspective view of the aisle containment system of FIG. 1 with telescoping vertical panels.

As shown in FIG. 46, covers 246, 248 are attached over header 212 and transom 220 to provide a clean, aesthetic look to door assembly 200. Finally, doors 202, closers 206 and perimeter seals for doors 202 are attached to door frame 208 to complete door assembly 200. Door assembly 200 can be attached to the other end of the containment aisle in a similar manner.

FIGS. 47-59 show telescoping vertical panels 300 attached to the aisle containment system. The telescoping vertical panels 300 are used with an aisle containment system that uses an existing ceiling as a roof instead of cross tees and panels as shown in FIGS. 1-46. The telescoping vertical panels 300 extend to the room ceiling to reduce the mixing of hot air and cold air in the aisle containment system. The telescoping vertical panels 300 may be used with any combination of 600, 700 and 800 mm width cabinets. The aisle width can be 4 feet or 6 feet.

Figure 48:
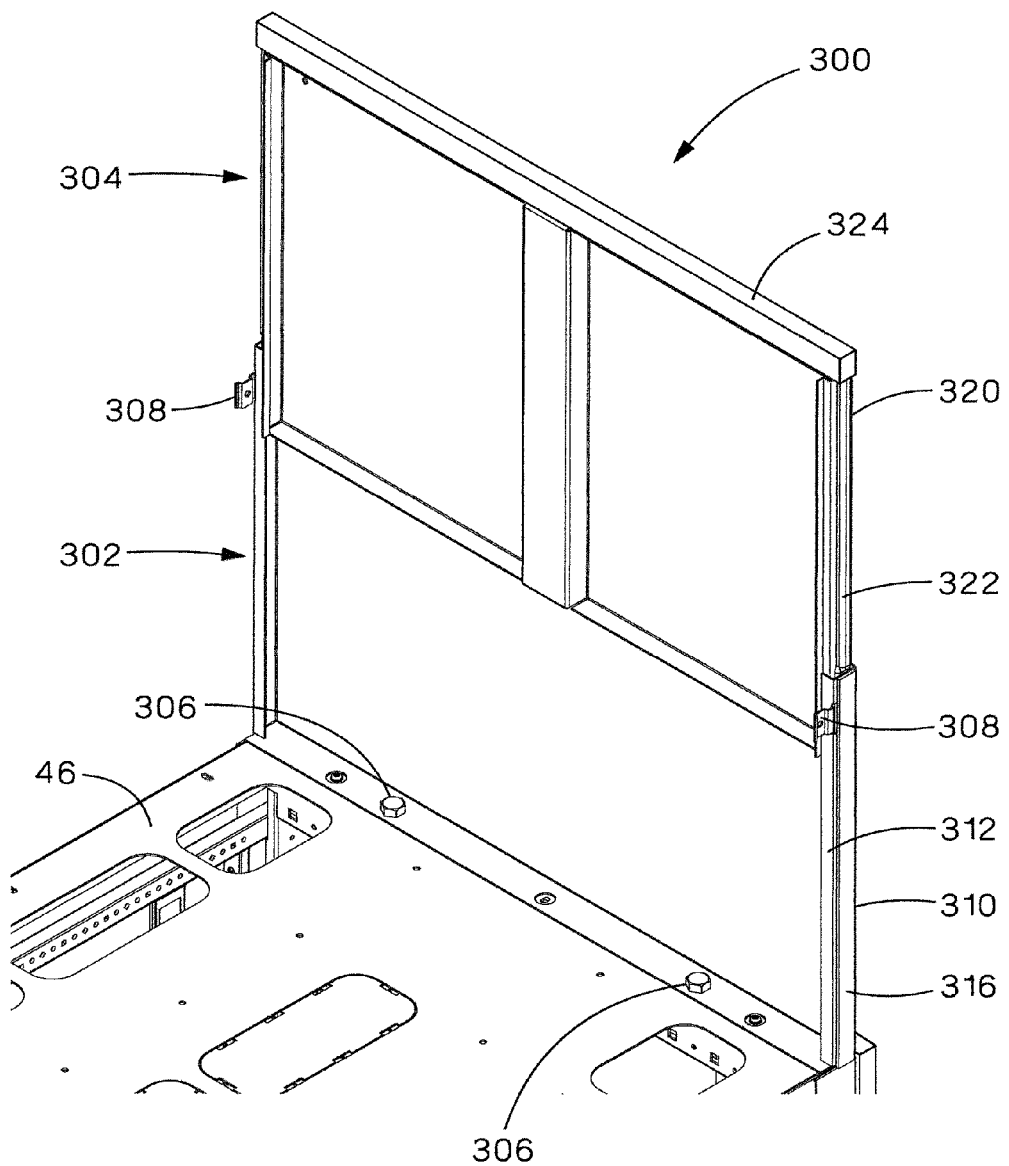
FIG. 48 is a perspective view of the back side of the telescoping vertical panel of FIG. 47 mounted to a cabinet.

FIG. 48 shows a telescoping vertical panel 300 secured to a cabinet 46. The telescoping vertical panel 300 includes a lower fixed panel 302 and an upper panel 304. The lower panel 302 is mounted to the top of the cabinet 46 with two bolts 306. The lower panel 302 also includes mounting tabs 308 for joining adjacent lower panels 302 together.

The sides 310 of the lower panel 302 include flanges 312 that wrap around the upper panel 304 to support and guide the upper panel 304.

The sides 310 of the lower panel 302 and the sides 320 of the upper panel 304 include a gasket 316, 322, respectively, to provide a seal between adjacent vertical panels 300. A gasket 324 is also attached to the top of the upper panel 304 to seal the upper panels 304 to the room ceiling. The top gasket 324 will compress when in contact with the room ceiling (not illustrated).

Figure 49:
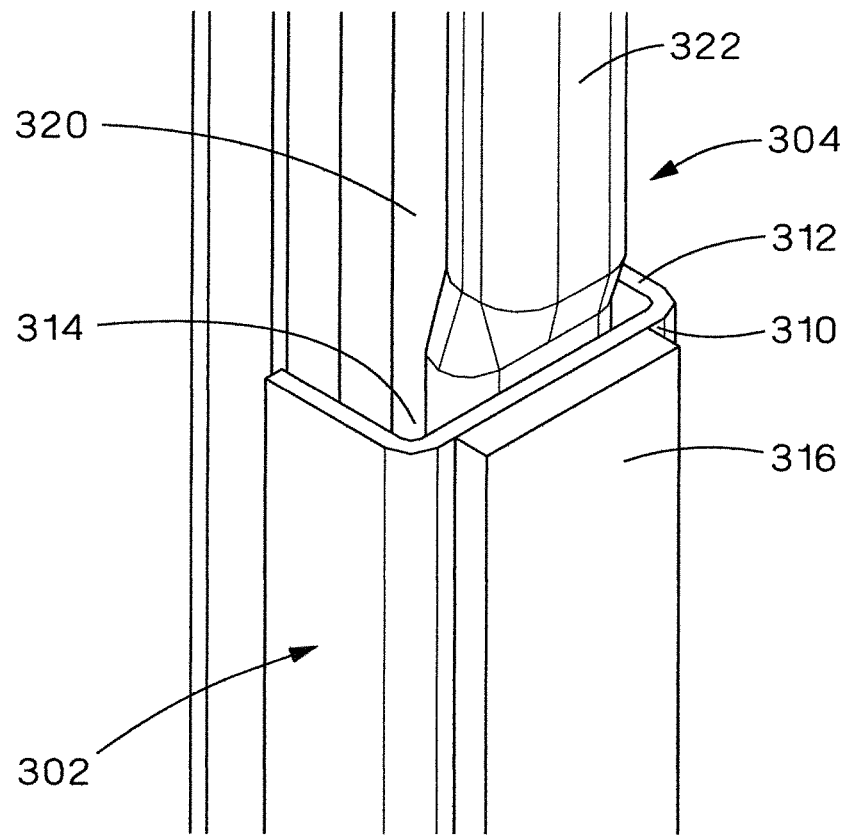
FIG. 49 is a perspective view of the upper panel side gasket and the lower panel of the telescoping vertical panel of FIG. 48.
Figure 49A:
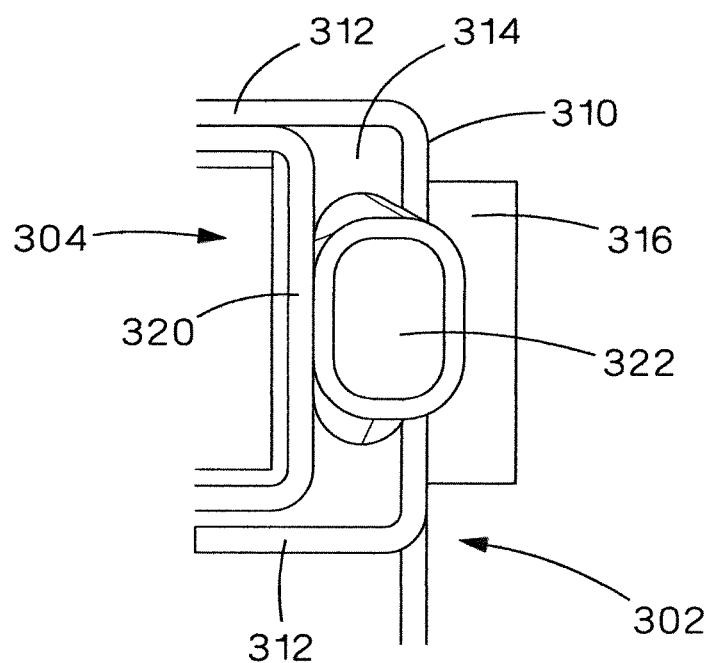
FIG. 49a is a cross sectional view of the tube gasket of FIG. 49 uncompressed.
Figure 49B:
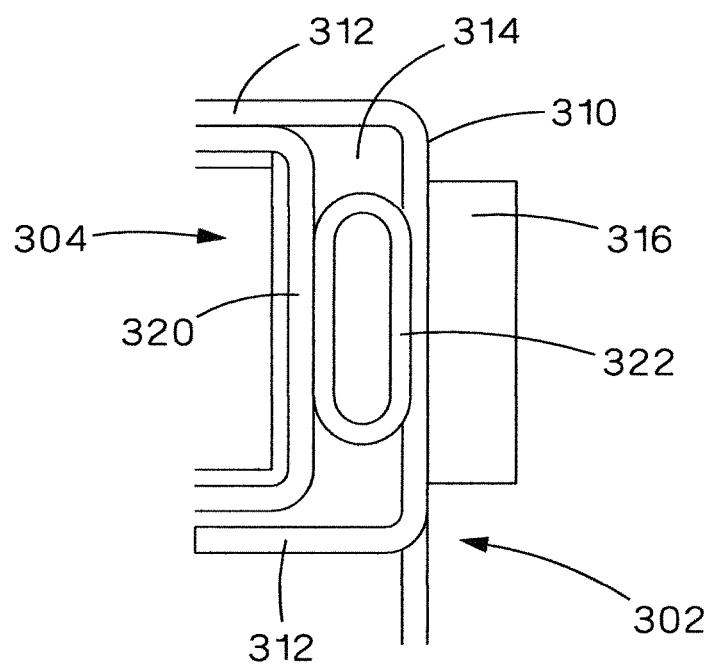
FIG. 49b is a cross sectional view of the tube gasket of FIG. 49 compressed.
Figure 50:
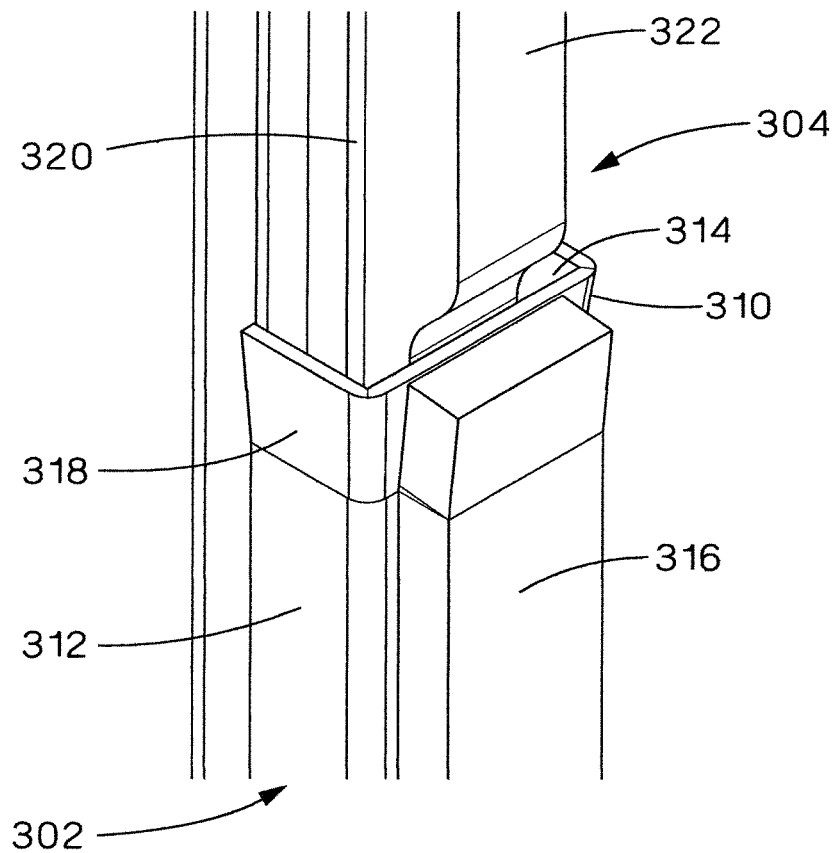
FIG. 50 is a perspective view of the lower panel of the telescoping vertical panel of FIG. 48 with flared edges.
Figure 51:
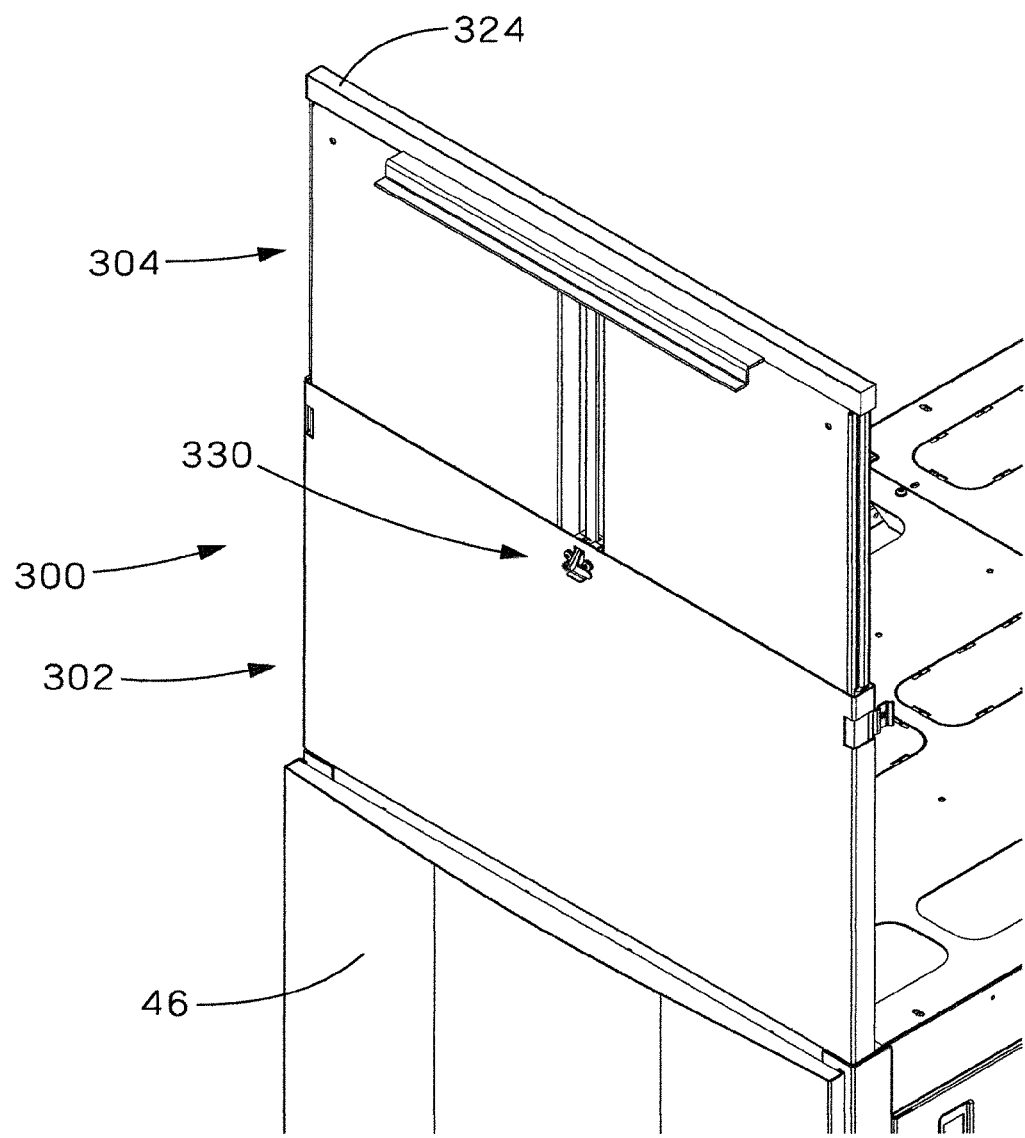
FIG. 51 is a perspective view of the front side of the telescoping vertical panel of FIG. 47 mounted to a cabinet.
Figure 52:
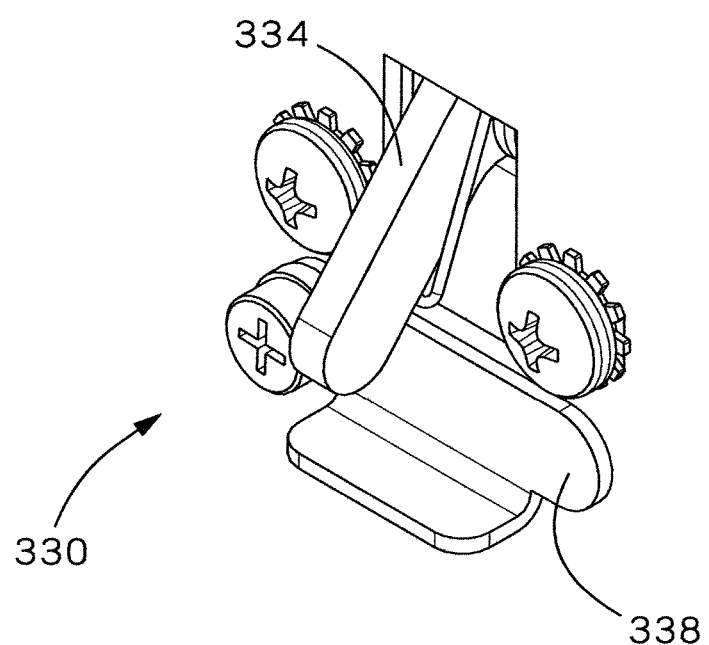
FIG. 52 is a perspective view of a pawl assembly attached to the lower panel of FIG. 51.

FIGS. 49-50 show the interface of the upper panel side gasket 322 and the lower panel 302. The side gasket 316 of the lower panel 302 is stationary. The upper panel side gasket 322 slides into a cavity 314 formed by the flanges 312 of the lower panel 302. As illustrated in FIG. 49, the side gasket 322 of the upper panel 304 may be rounded to help the side gasket slide into the cavity 314. FIG. 49a shows the side gasket 322 of the upper panel 304 uncompressed and FIG. 49b shows the side gasket 322 of the upper panel 304 compressed in the cavity 314. The side gasket 322 of the upper panel 304 is undersized in width so the compressed side gasket 322 will not interfere with the flanges 312 of the lower panel 302. For example, the width of the upper panel side gasket can be 0.5" and the cavity width without flared edges is 0.75" leaving 0.125" clearance on each side for the compressed gasket.

FIG. 50 shows the lower panel 302 having edges 318 that are flared to help guide a rectangular side gasket 322 of the upper panel 304 into the cavity 314.

FIGS. 51-54 show the pawl assembly 330 that secures the upper panel 304 of the telescoping vertical panel 300 in an extended position. The pawl assembly 330 is similar to the pawl assembly disclosed in commonly owned U.S. patent application Ser. No. 12/731,877. The pawl assembly 330 is attached to the lower panel 302 of the telescoping vertical panel 300. The pawl assembly 330 includes a channel 332, a pawl lever 334 with pawl teeth 336 and a lockout lever 338. The lockout lever 338 prevents the pawl lever 334 from being accidentally actuated to release the upper panel 304.

Figure 53:
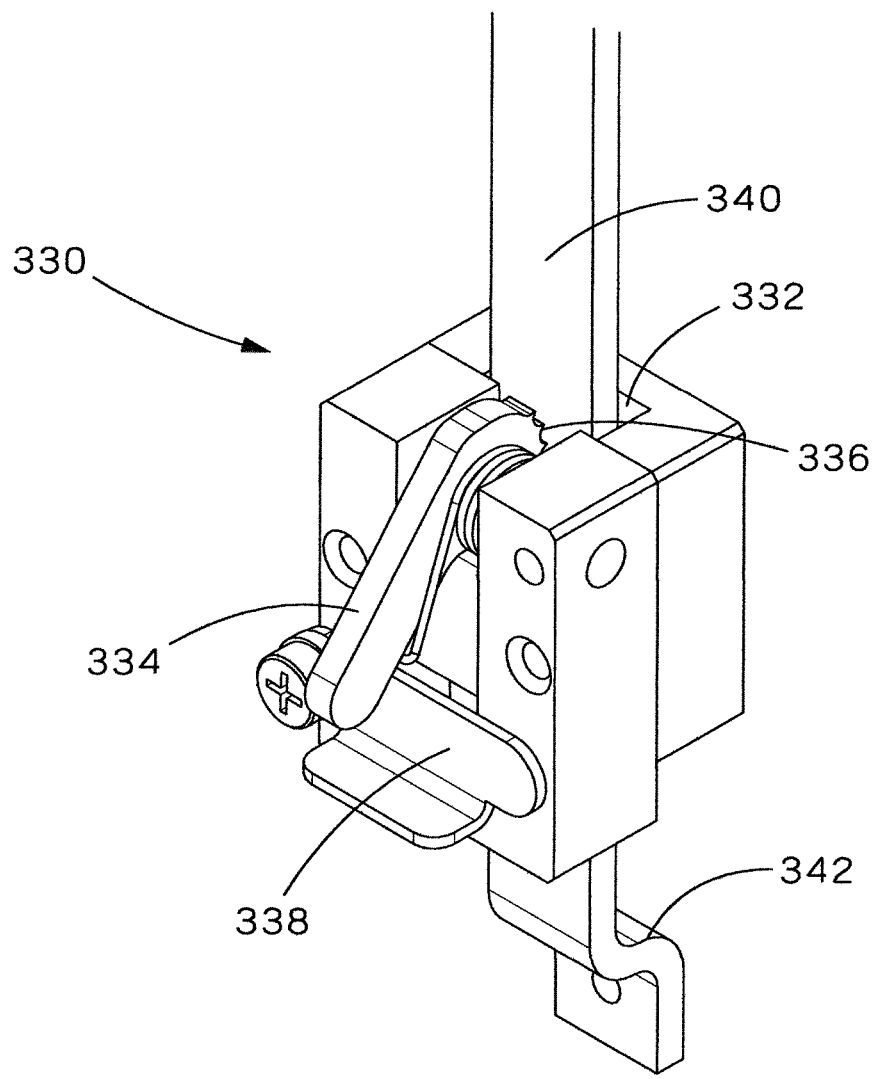
FIG. 53 is a perspective view of the pawl and rod assembly of the telescoping vertical panel of FIG. 51.
Figure 54:
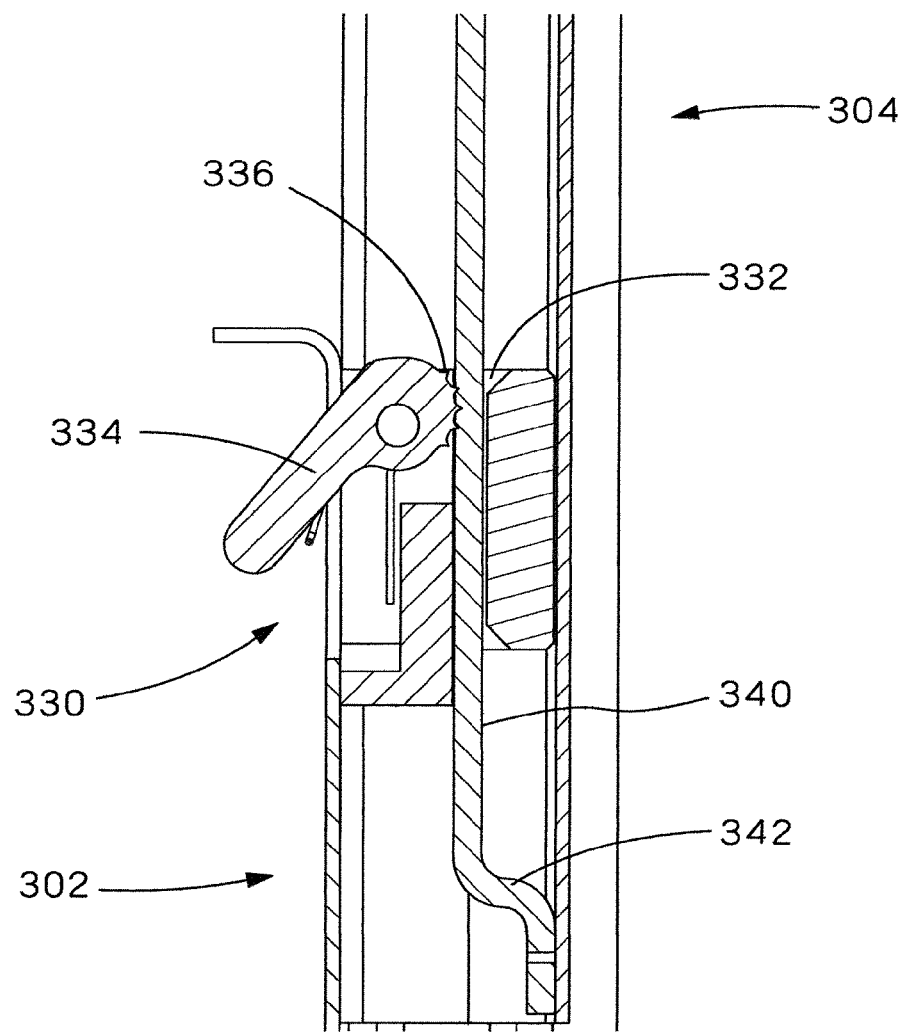
FIG. 54 is a cross sectional view of the pawl and rod assembly of FIG. 53.

A flat bar 340 is attached to the upper panel 304. As shown in FIGS. 53-54, the flat bar 340 is positioned in the channel 332 of the pawl assembly 330. The pawl teeth 336 on the pawl lever 334 grip the flat bar 340 to prevent the upper panel 304 from moving vertically. To lower the upper panel 304, the pawl lever 334 is pushed toward the vertical panel 300. As the pawl lever 334 rotates, the pawl teeth 336 are disengaged from the flat bar 340 and the upper panel 304 can be moved downward. When the pawl assembly 330 rests on the bottom 342 of the flat bar 340, there is a 4 inch overlap between the upper panel 304 and the lower panel 302.

Figure 55:
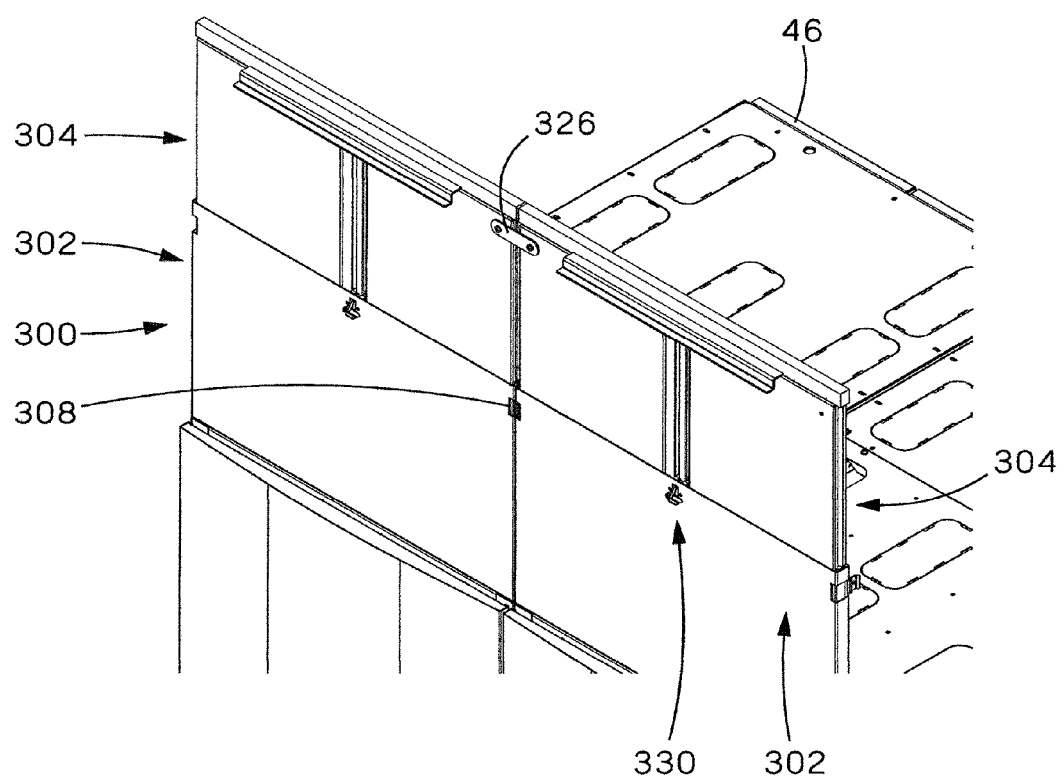
FIG. 55 is a front perspective view of the telescoping vertical panels of FIG. 47.

FIG. 55 is a front view of adjacent telescoping vertical panels 300 secured to cabinets 46 in the aisle containment system. The adjacent lower panels 302 are secured together by mounting tabs 308. Once the upper panels 304 are extended to the room ceiling, a ganging bracket 326 is bolted to adjacent upper panels 304 to keep the vertical panels 300 in line and to minimize gaps between the vertical panels 300.

Figure 56:
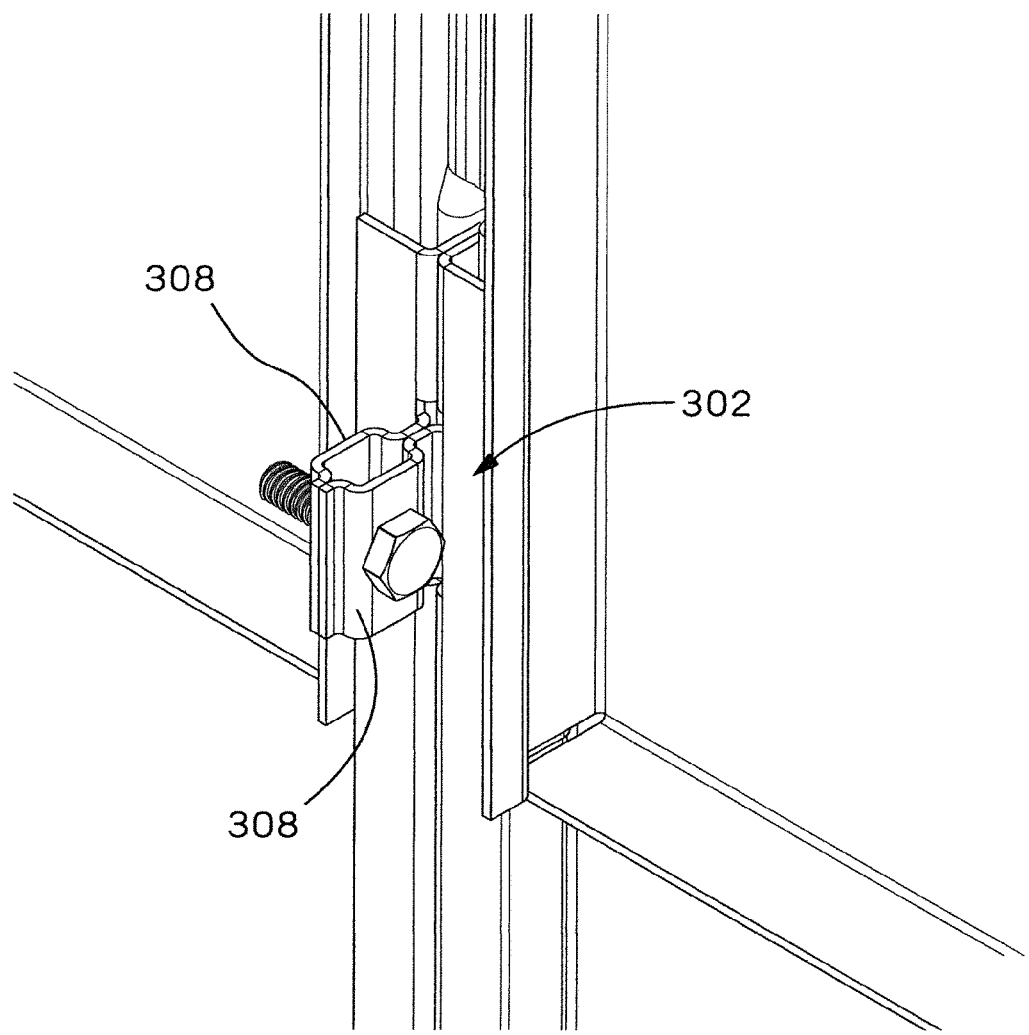
FIG. 56 is a perspective view of the mounting tabs of the telescoping vertical panel of FIG. 47.

FIG. 56 shows the panel mounting tab 308. The mounting tab 308 is used to secure adjacent lower panels 302 together.

Figure 57:
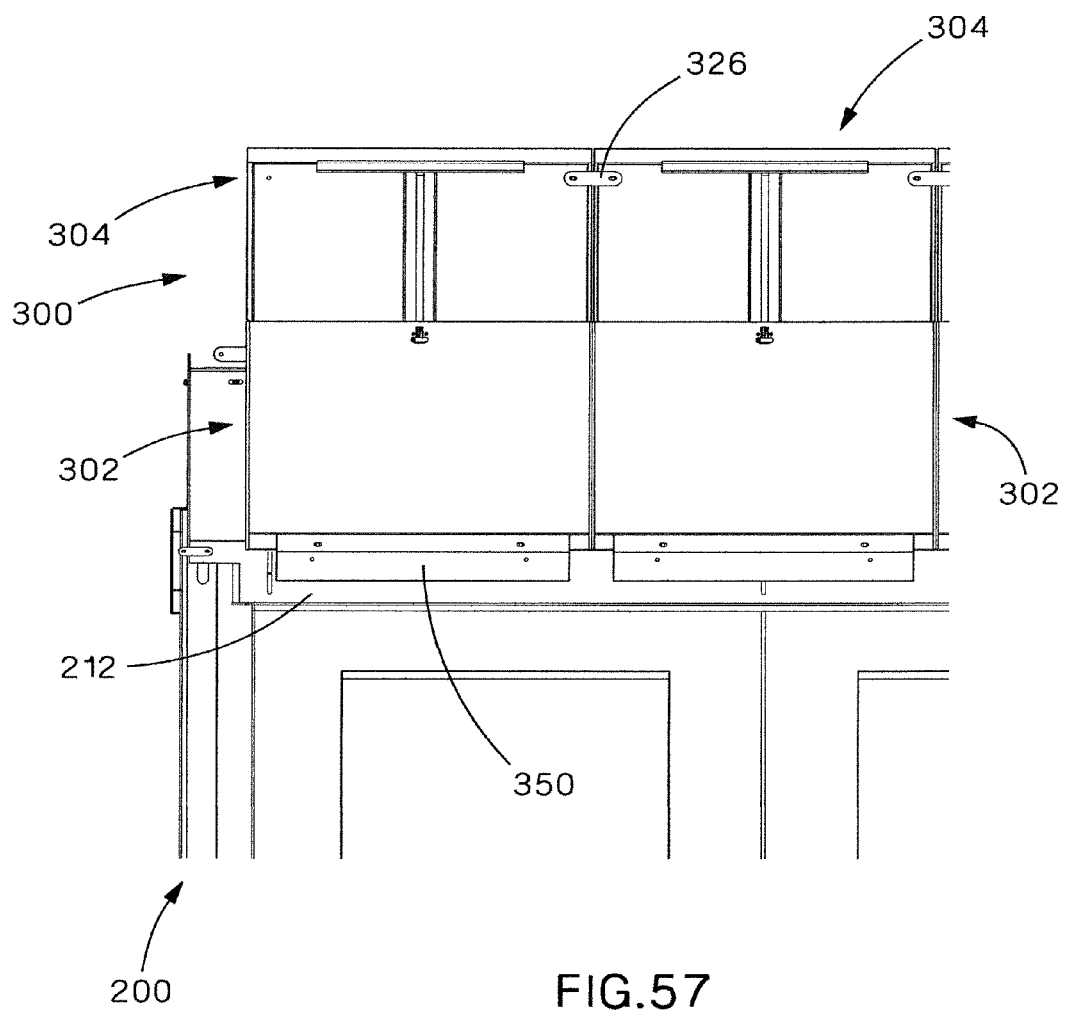
FIG. 57 is a front view of the telescoping vertical panels of FIG. 47 secured to the door assembly.
Figure 58:
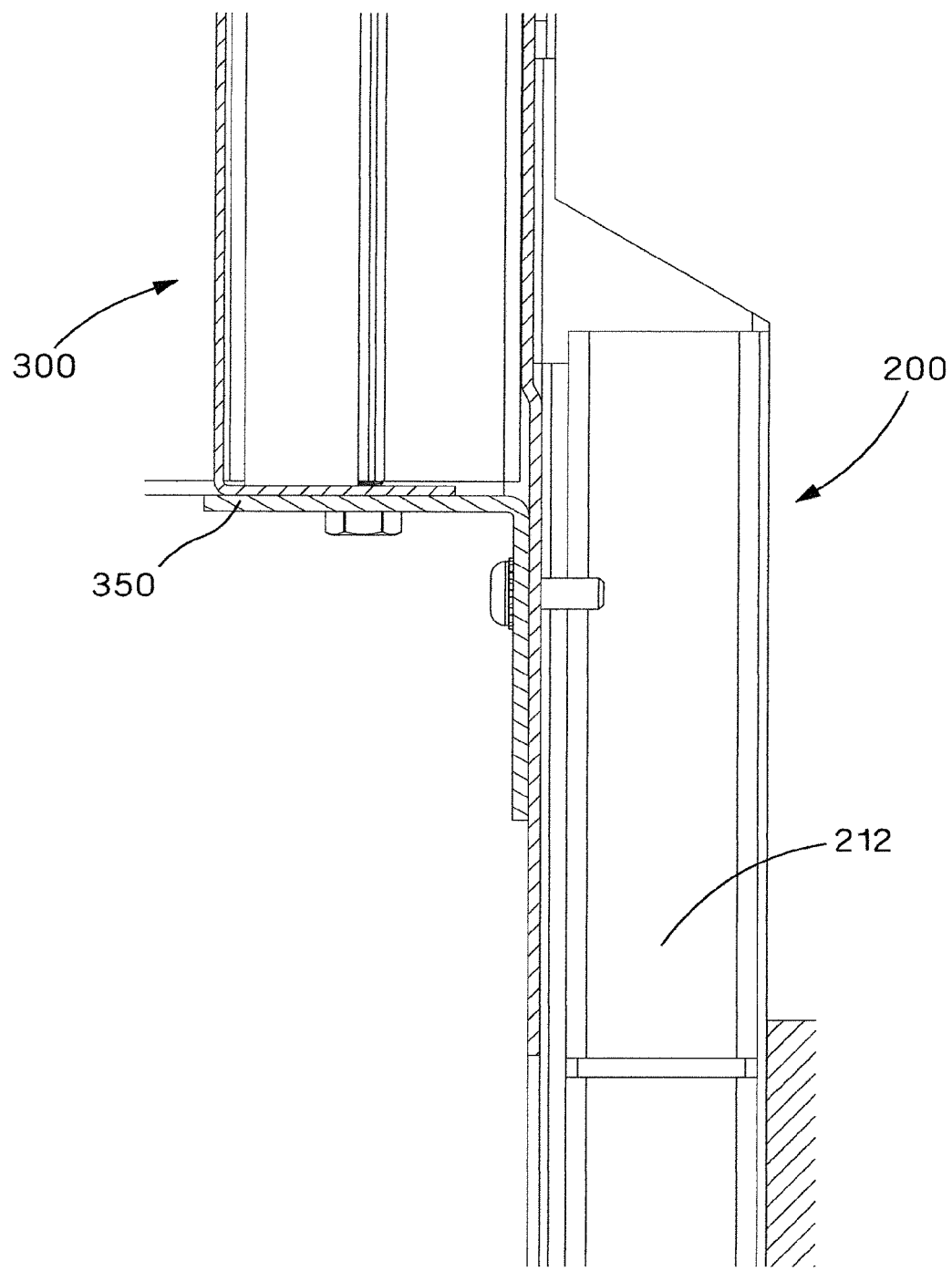
FIG. 58 is a cross sectional view of the telescoping vertical panel of FIG. 57 secured to the door assembly.

FIGS. 57-58 show the telescoping vertical panels 300 mounted above the door assembly 200. The telescoping vertical panel 300 is attached to an angle bracket 350 that is attached to the header 212 of the door assembly 200.

Figure 59:
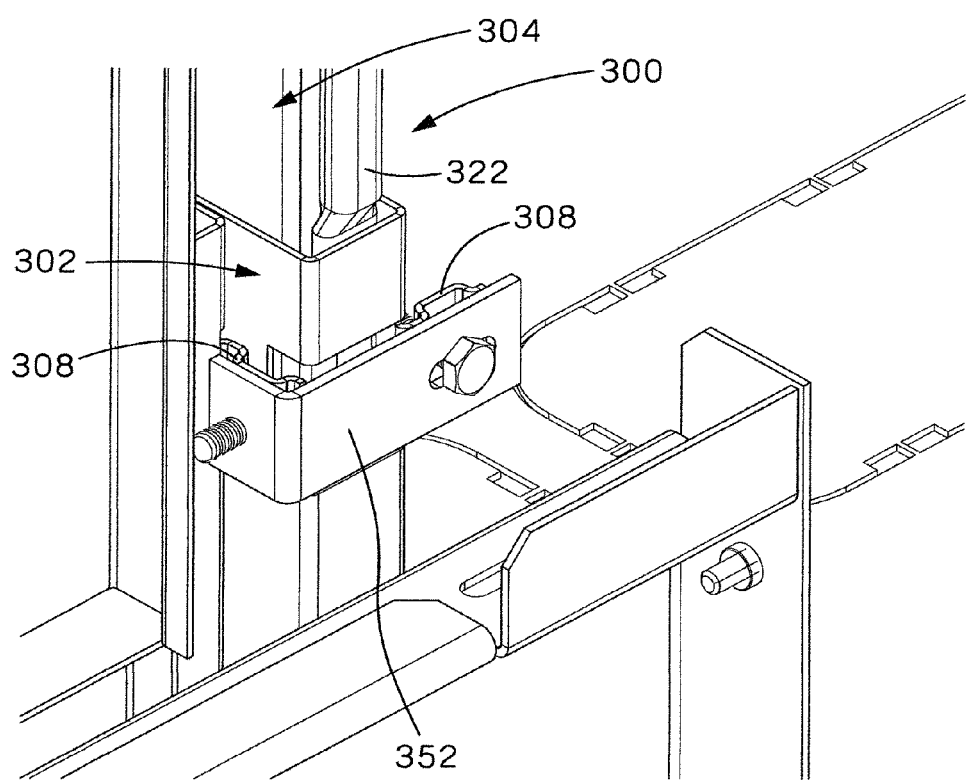
FIG. 59 is a side perspective view of the telescoping vertical panel of FIG. 57 secured above the door assembly.
Figure 60:
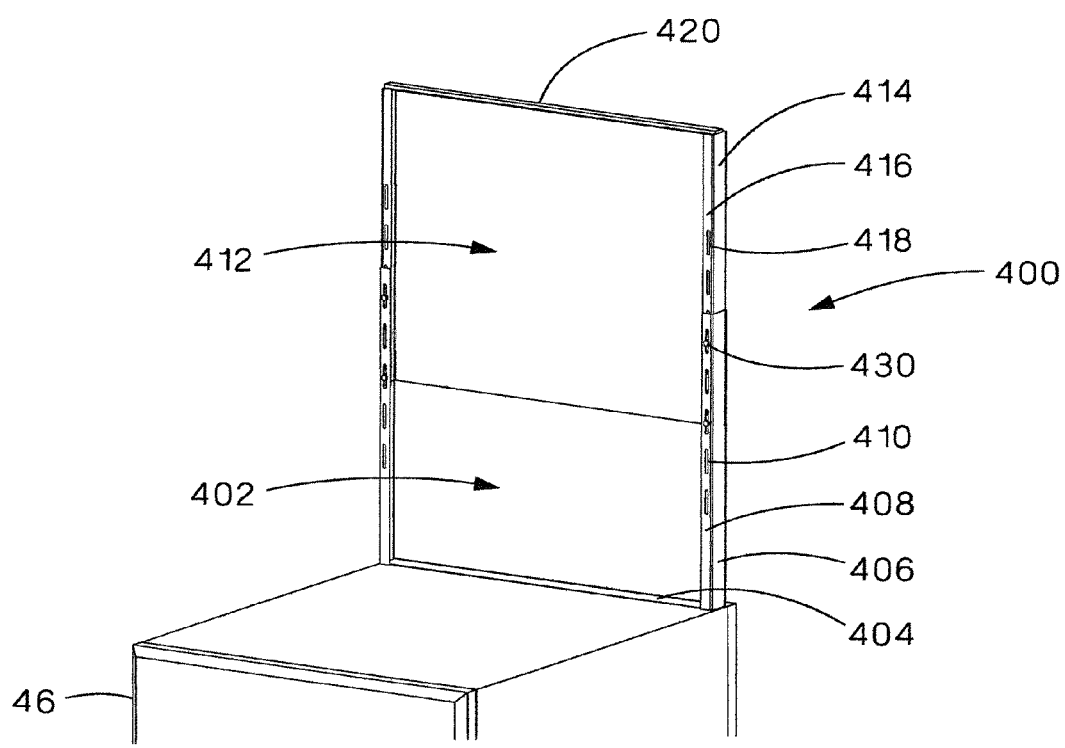
FIG. 60 is a perspective view of an alternative telescoping vertical panel mounted along the edge of the cabinet.
Figure 61:
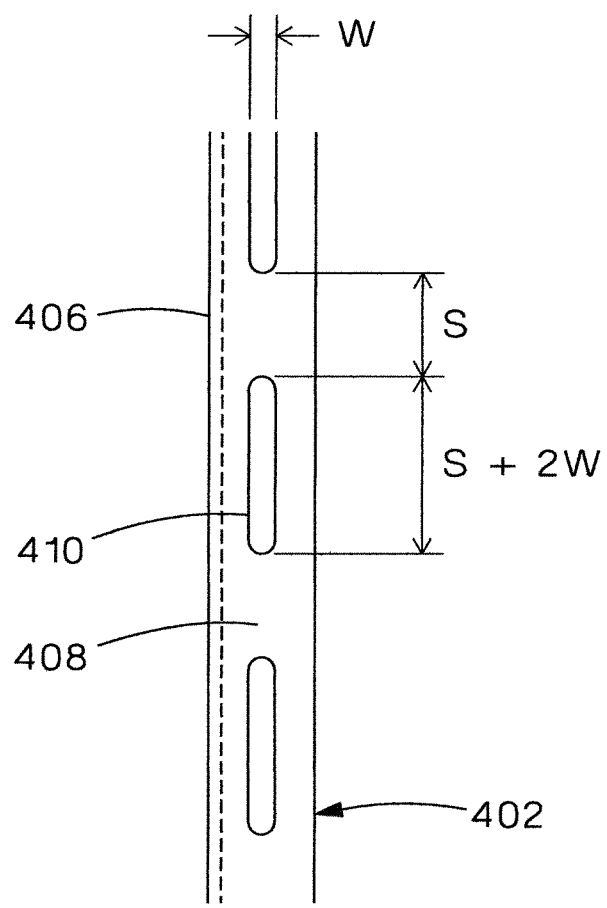
FIG. 61 is a front view of the slots in the flanges of the telescoping vertical panel of FIG. 60.

FIG. 59 shows the side gasket of the door panels forming a seal with the vertical panels 300 above the cabinets 46. A panel to panel bracket 352 allows the use of two panel mounting tabs 308 to secure the door panels to the lower panel 302.

FIGS. 60-64 show an alternative telescoping vertical panel 400 mounted to the cabinet 46. The vertical panel 400 includes a fixed lower panel 402 and an adjustable upper panel 412. The lower panel 402 is mounted along an edge of the cabinet 46 via a mounting flange 404. The lower panel 402 and the upper panel 412 each include sides 406, 414 with a flange 408, 416, respectively. The thickness of flanges 408, 416 can be increased to provide stability to vertical panel 400. The sides 406 of the lower panel 402 receive the sides 414 of the upper panel 412 (see FIG. 64). The upper panel 412 also includes a foam seal 420 positioned along the top of the upper panel 412. The foam seal 420 enables the upper panel 412 to form a seal with the room ceiling.

The flange 408 of the lower panel 402 and the flange 416 of the upper panel 412 each include a plurality of slots 410, 418, respectively. The slots 410, 418 have a width "W" designed to receive bolts 430, or other fasteners, having a diameter less than W. The slots 410, 418 are located a length "S" apart from each other such that the distance from the bottom of slot 410, 418 to the top of slot 410, 418 is "S+2W."

Figure 62:
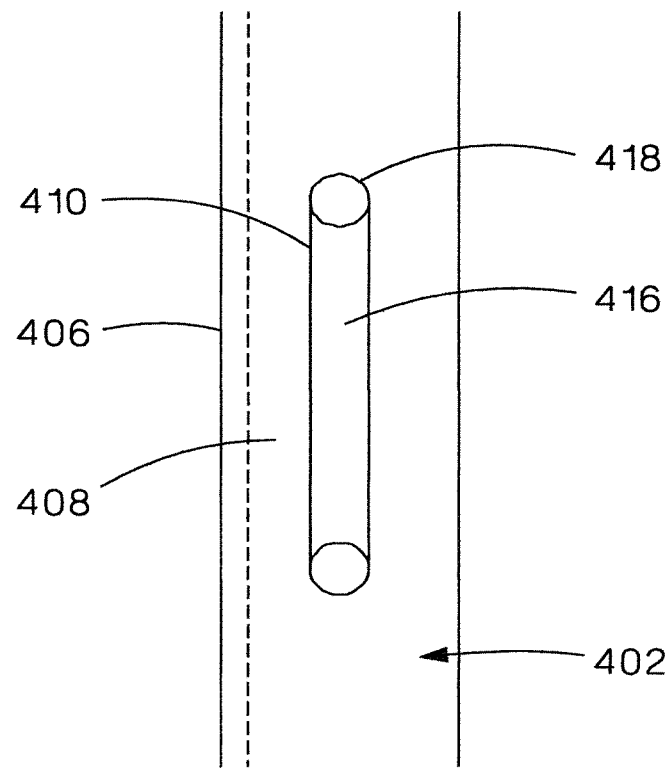
FIG. 62 is a front view of the slots in the flanges of the telescoping vertical panel of FIG. 61.
Figure 63:
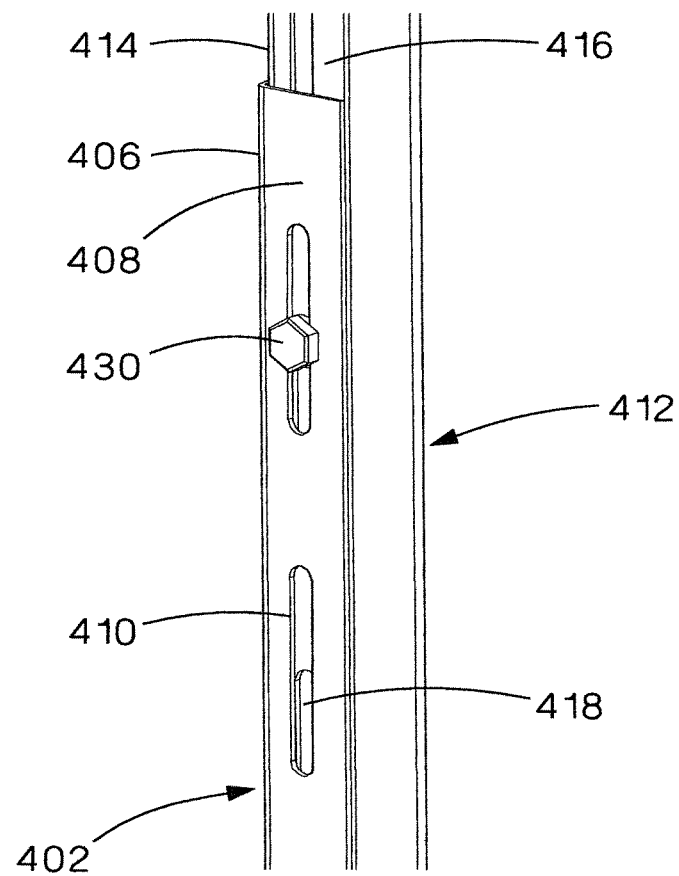
FIG. 63 is a perspective view of one side of the lower panel and the upper panel of the telescoping vertical panel of FIG. 60 secured together via a bolt and a nut.
Figure 64:
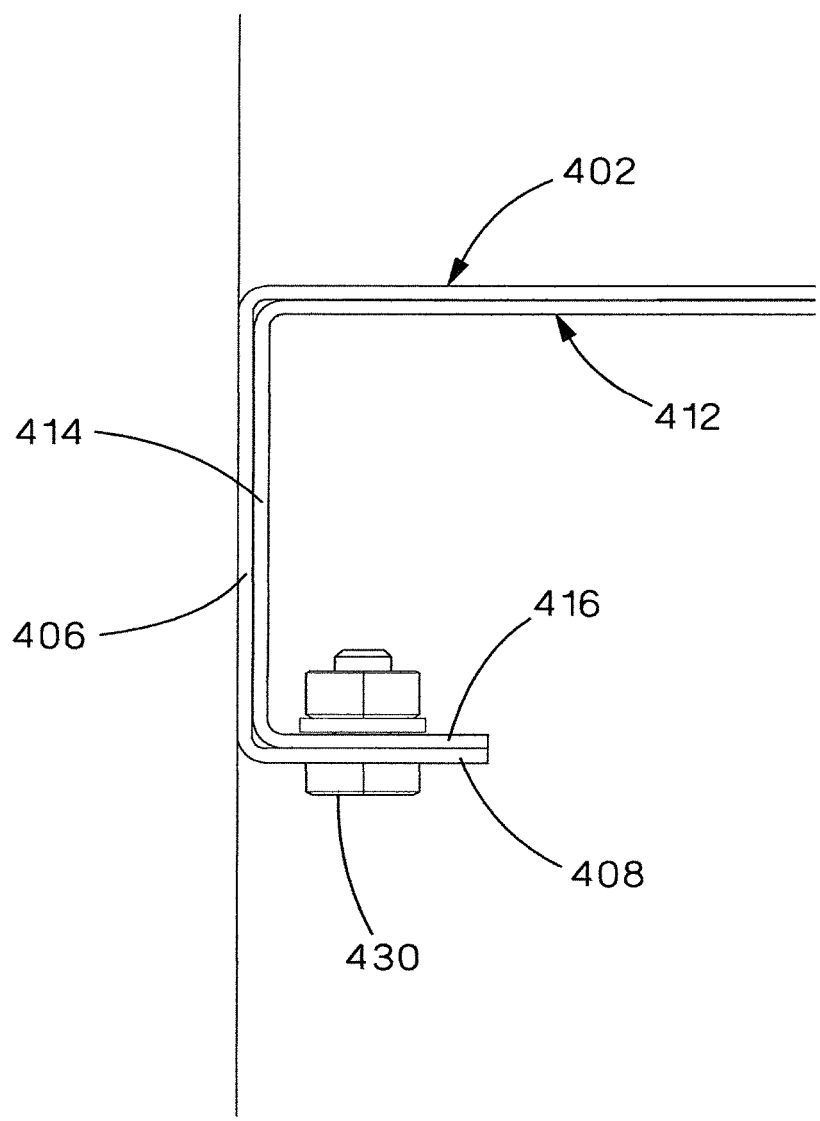
FIG. 64 is a top view of the sides of the telescoping vertical panel of FIG. 63.

As illustrated in FIGS. 62 and 63, when the upper panel 412 is raised, the slots align to create an opening for receiving the bolt 430 to secure the upper panel 412 to the lower panel 402.

Figure 65:
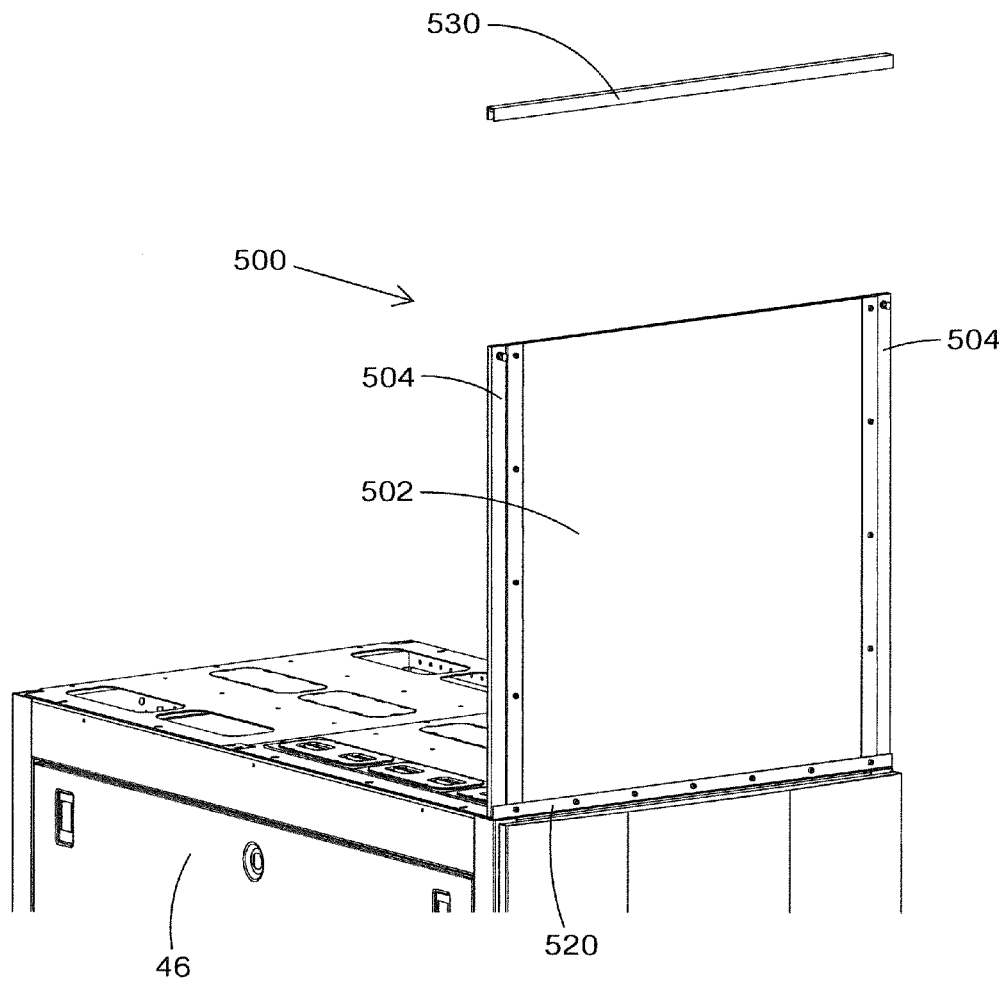
FIG. 65 is a perspective view of an adjustable wall mounted to a cabinet with the movable upper panel being retracted.

FIGS. 65-71 illustrate a transparent adjustable vertical wall 500 mounted to cabinets 46 in an aisle containment system. The transparent adjustable vertical wall 500 may be used with either a hot aisle or a cold aisle containment system. FIG. 65 illustrates the adjustable wall 500 mounted to a cabinet 46 with a movable upper panel 512 (see FIG. 69) being retracted.

Figure 66:
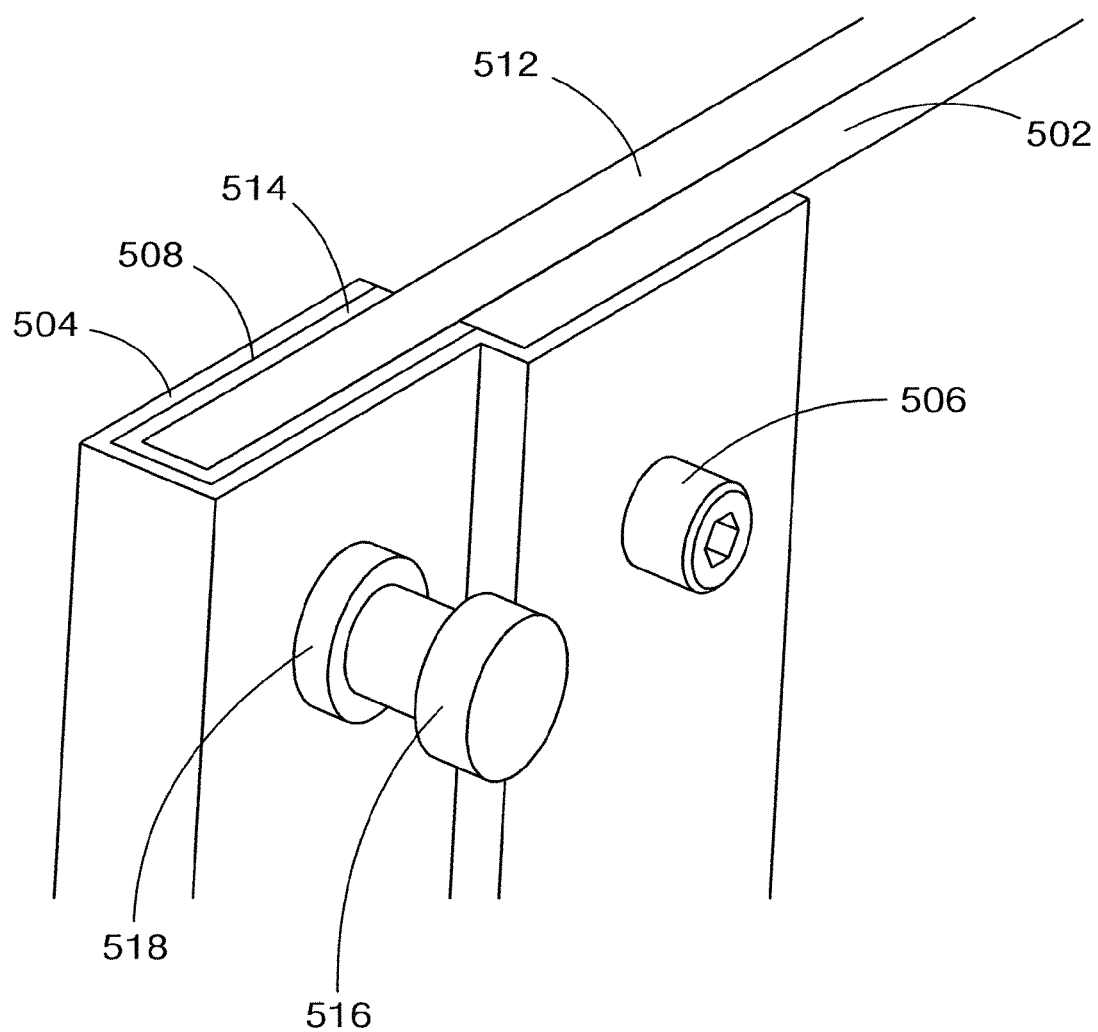
FIG. 66 is a partial perspective view of a top corner of the adjustable wall of FIG. 65.
Figure 67:
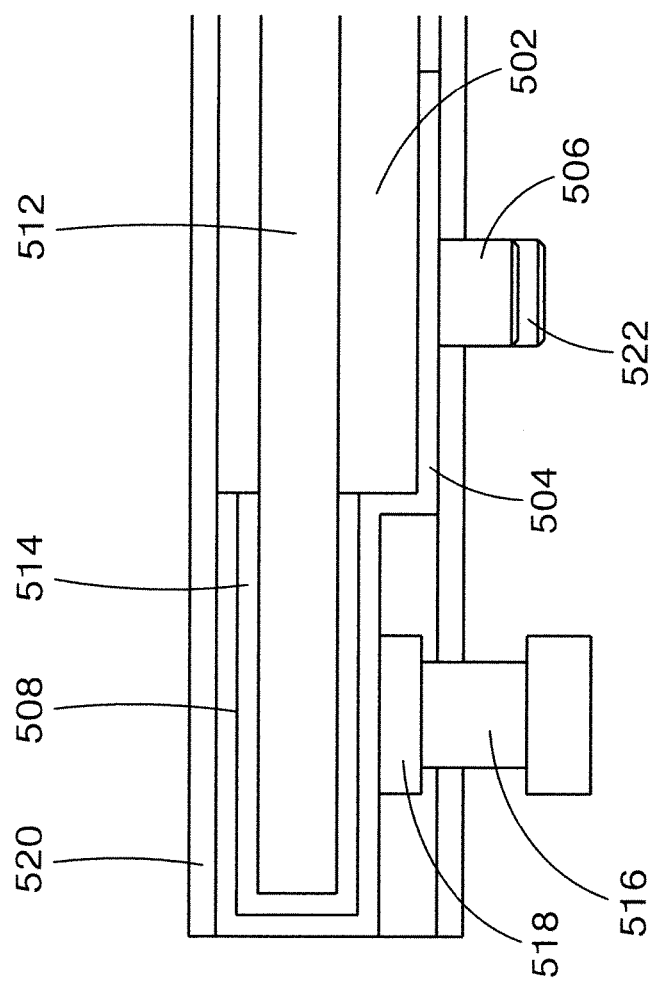
FIG. 67 is a partial top view of the adjustable wall of FIG. 65.
Figure 68:
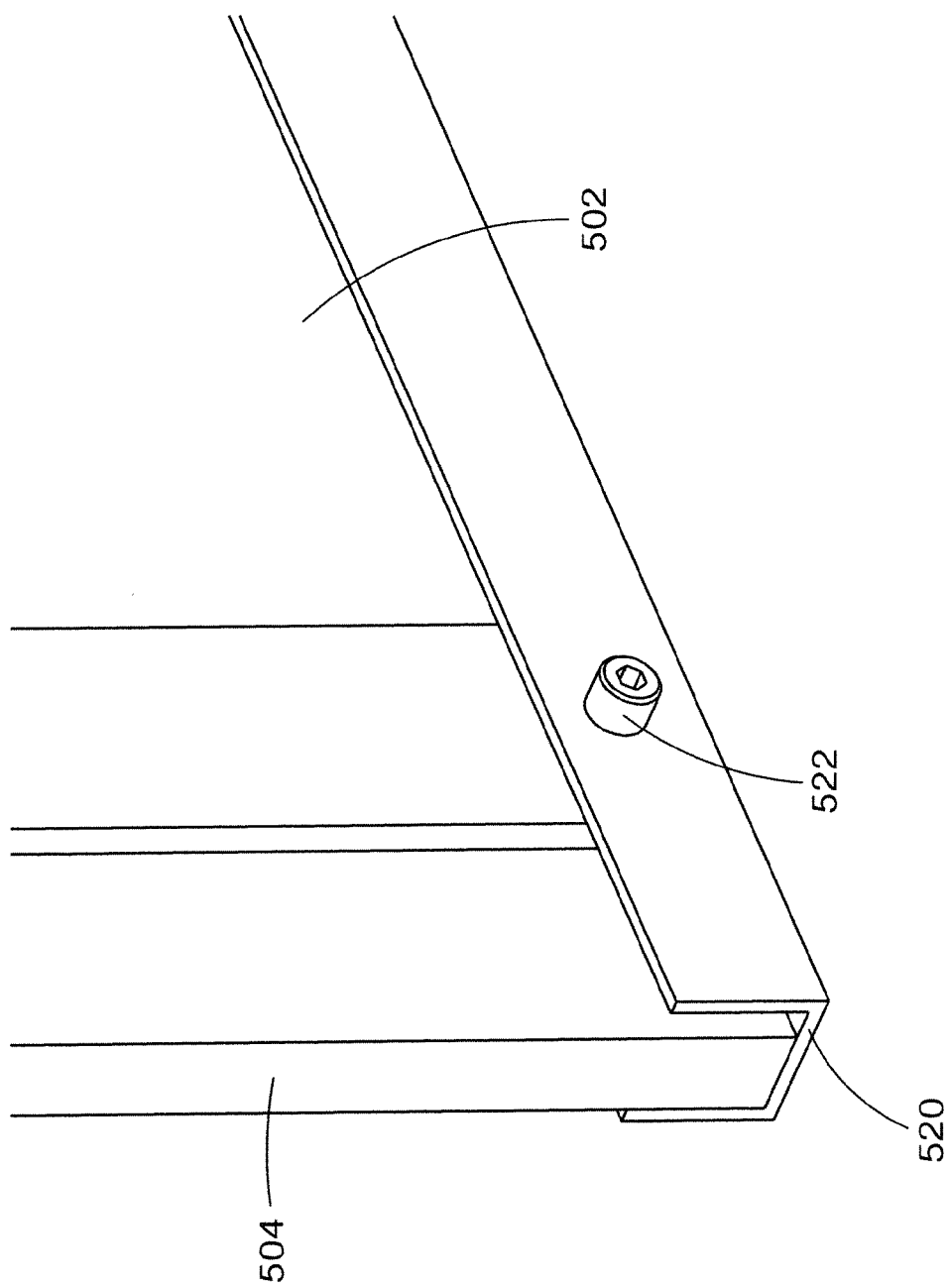
FIG. 68 is a partial bottom perspective view of the lower U-shaped channel, the support frame, and the fixed lower panel of the adjustable wall of FIG. 65.

FIGS. 66-68 illustrate detailed views of the adjustable wall 500 of FIG. 65. FIG. 66 illustrates a top corner of the adjustable wall 500 with the movable upper panel 512 being retracted. The fixed lower panel 502 is attached to a support frame 504 on each side of the fixed lower panel 502 via screws 506 threaded into the fixed lower panel 502, or with flat head screws from the opposite direction.

The movable upper panel 512 includes an edge frame 514 on each side of the movable upper panel 512. The edge frame 514 is positioned within pockets 508 formed by the support frames 504. Each edge frame 514 of the movable upper panel 512 moves within the pockets 508 to adjust the height of the movable upper panel 512. Locking bolts 516 and PEM nuts 518 secure the movable upper panel 512 to the support frame 504. As illustrated in FIGS. 66 and 67, a locking bolt 516 and a PEM nut 518 holds the movable upper panel 512 in position.

The adjustable wall 500 is secured to a lower U-shaped channel 520 that is mounted to the top edge of a cabinet 46 in an aisle containment system. As illustrated in FIGS. 67 and 68, the support frame 504 attached to the fixed lower panel 502 is positioned within the lower U-shaped channel 520. A mounting screw 522 is threaded into the fixed lower panel 502 to secure the support frame 504 and fixed lower panel 502 to the lower U-shaped channel 520.

Figure 69:
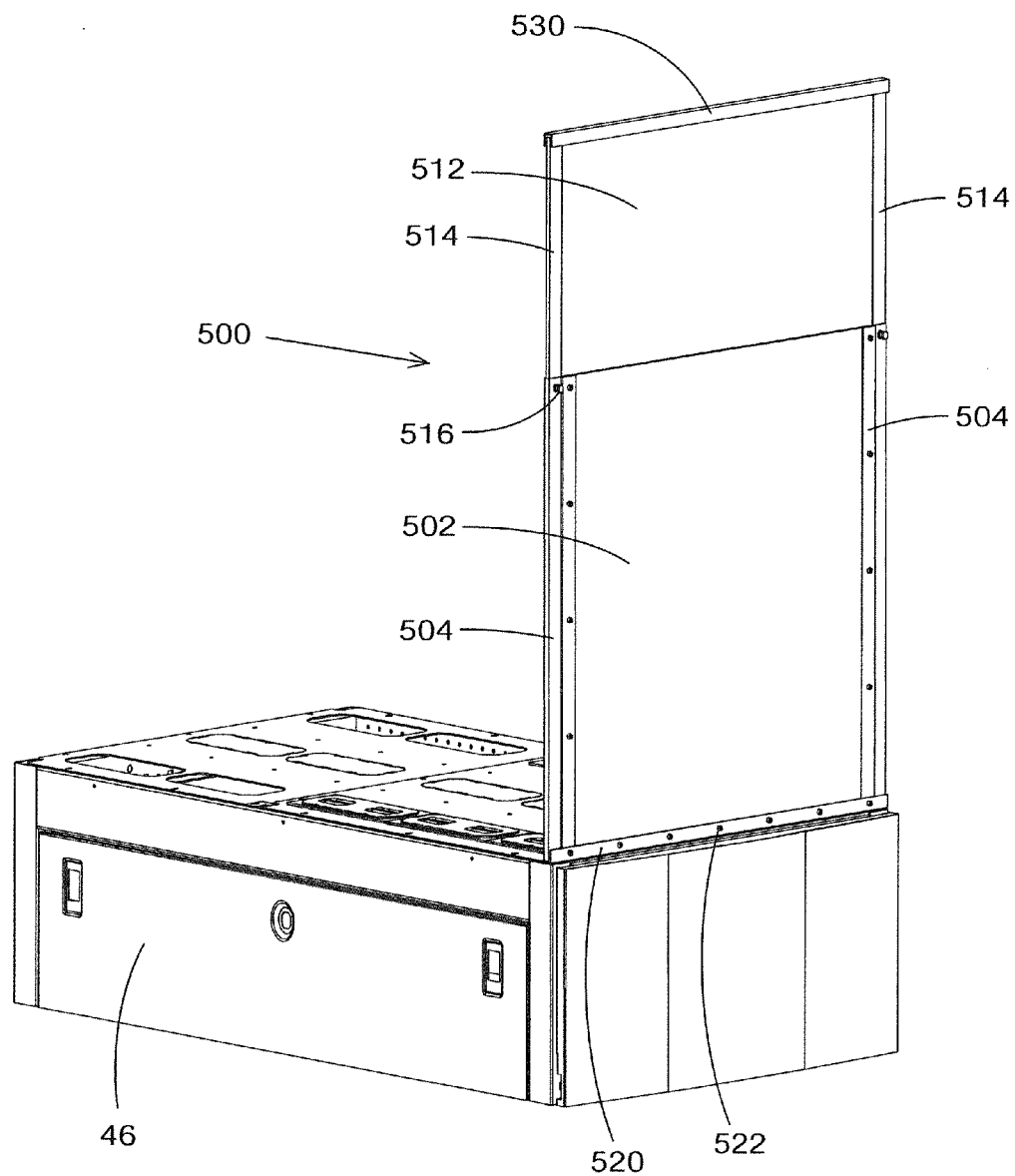
FIG. 69 is a perspective view of the adjustable wall of FIG. 65 mounted to a cabinet with the movable upper panel extended.
Figure 70:
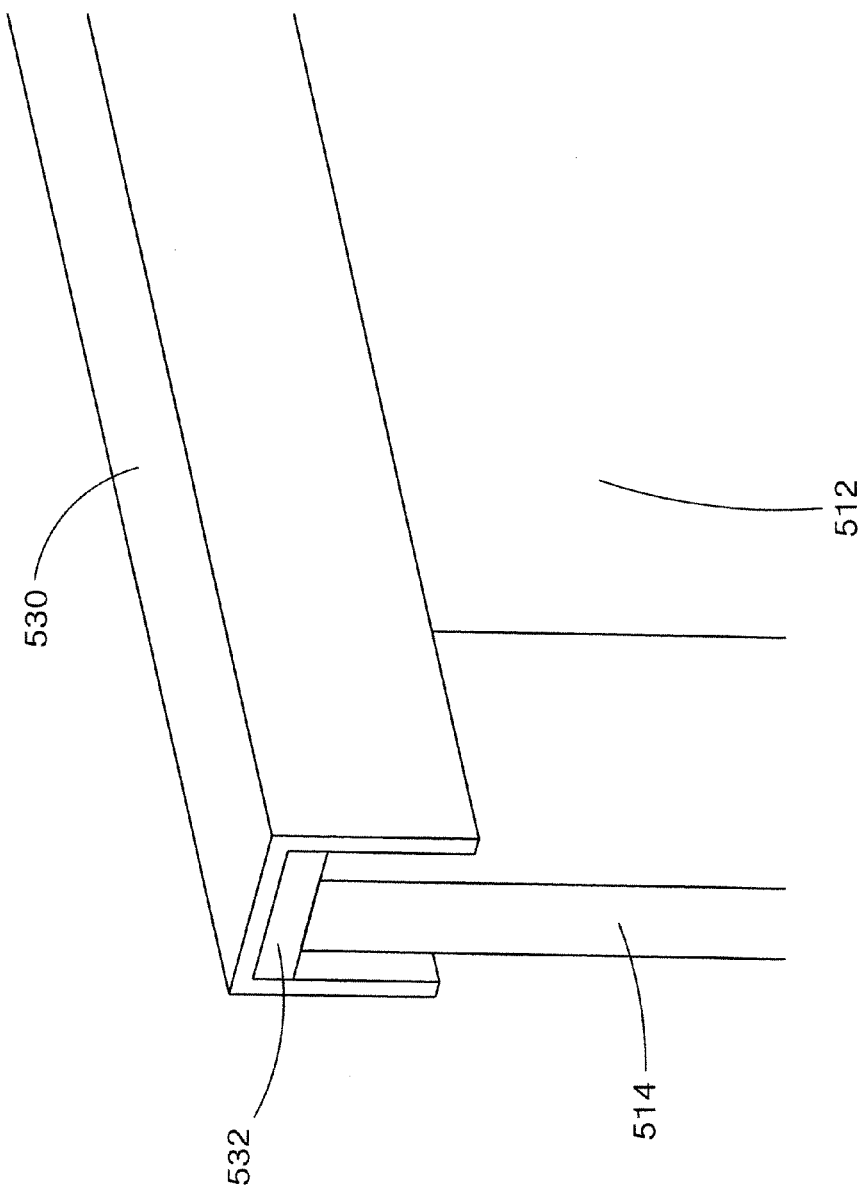
FIG. 70 is a partial top perspective view of the upper U shaped channel and the movable upper panel of FIG. 69.

FIG. 69 illustrates the movable upper panel 512 of the adjustable wall 500 extended to the inverted upper U-shaped channel 530 that is attached to the ceiling. As illustrated in FIG. 70, the upper U-shaped channel 530 may include a foam seal 532, if desired, that extends the length of the upper U-shaped channel 530. The upper U-shaped channel 530 spans the length of multiple cabinets 46 in the aisle containment system. The edge frame 514 and the movable upper panel 512 extend to the upper U-shaped channel 530 until they engage the foam seal 532.

Figure 71:
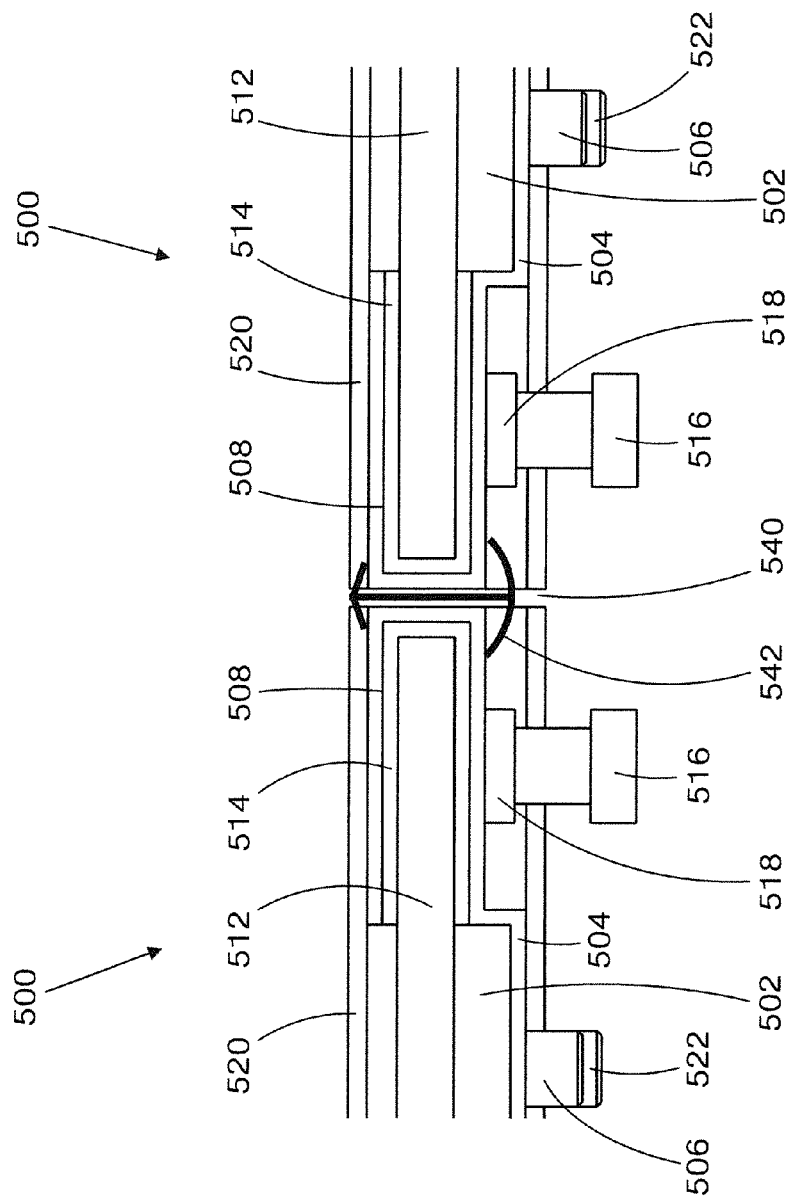
FIG. 71 is a partial top view of two extended adjustable walls mounted on adjacent cabinets.

FIG. 71 is a top view of an adjustable wall 500 mounted to adjacent cabinets. The movable upper panels 512 have been extended and the upper U-shaped channel 530 has been removed for clarity. Once the adjustable walls 500 have been mounted, a rubber arrow head seal 542 is installed in the gap 540 between the adjacent adjustable walls 500. The rubber arrow head seal 542 fills the gap 540 since the seal 542 is pressed into the gap 540 after the movable upper panels 512 have been extended to the ceiling.

The fixed lower panel 502 and the upper movable upper panel 512 are formed from a transparent material, such as polycarbonate or acrylic. The transparent adjustable wall of the present invention provides light from either side of the aisle containment system.

The invention claimed is:

1. An aisle containment system comprising:
a plurality of cabinets arranged in a first row and a second row opposite the first row defining an aisle therebetween;
a plurality of transparent adjustable vertical panels secured to a top of the cabinets;
wherein the transparent adjustable vertical panels include a fixed lower panel and a movable upper panel; and
an upper U-shaped channel mounted to a ceiling, the movable upper panel extends to the upper U-shaped channel, wherein the movable upper panel is positioned within the upper U-shaped channel,
whereby the transparent adjustable vertical panel provides light from either side of the aisle containment system.

2. The aisle containment system of claim 1, wherein the fixed lower panel having a support frame on each side of the fixed lower panel, each support frame including a pocket; and wherein the movable upper panel having an edge frame on each side of the movable upper panel, wherein the edge frames are positioned within the pockets of the support frames.

3. The aisle containment system of claim 2, wherein the movable upper panel is secured to the support frame by bolts.

4. The aisle containment system of claim 1, wherein a lower U-shaped channel is mounted to the top of the cabinet for receiving the fixed lower panel.

* * * * *